US012787488B2

(12) United States Patent
Ledenev

(10) Patent No.: US 12,787,488 B2
(45) Date of Patent: Nov. 3, 2026

(54) SERIES-PARALLEL ALTERABLE MULTIPHASE SOLAR ENERGY POWER SYSTEM

(71) Applicant: AMPT, LLC, Fort Collins, CO (US)

(72) Inventor: Anatoli Ledenev, Fort Collins, CO (US)

(73) Assignee: AMPT, LLC, Fort Collins, CO (US)

(*) Notice: Subject to any disclaimer, the term of this patent is extended or adjusted under 35 U.S.C. 154(b) by 0 days.

(21) Appl. No.: 19/412,693

(22) Filed: Dec. 8, 2025

(65) Prior Publication Data

US 2026/0114081 A1 Apr. 23, 2026

Related U.S. Application Data

(63) Continuation of application No. 18/742,680, filed on Jun. 13, 2024, now Pat. No. 12,538,608, which is a (Continued)

(51) Int. Cl.

*H10F 77/00* (2025.01)
*H02J 1/102* (2026.01)

(Continued)

(52) U.S. Cl.

CPC ............ *H10F 77/935* (2025.01); *H02J 1/102* (2013.01); *H02J 3/38* (2013.01); *H02J 3/381* (2013.01);

(Continued)

(58) Field of Classification Search

CPC ........ H10F 77/935; H02S 40/30; H02J 1/102; H02J 3/38; H02J 3/381; H02J 3/40;

(Continued)

(56) References Cited

U.S. PATENT DOCUMENTS 3,900,946 A 8/1975 Sirtl et al.
4,127,797 A 11/1978 Perper (Continued)

FOREIGN PATENT DOCUMENTS

CA 2702392 9/2015
CA 2737134 10/2017

(Continued)

OTHER PUBLICATIONS

Power Article, Aerospace Systems Lab, Washington University, St. Louis, MO; estimated at Sep. 2007; 3 pages.

(Continued)

*Primary Examiner* — Hal Kaplan

(74) *Attorney, Agent, or Firm* — Santangelo & Ressue Law Offices, P.C.

(57) ABSTRACT

A high efficiency solar power system combining photovoltaic sources of power (1) can be converted by a base phase DC-DC photovoltaic converter (6) and an altered phase DC-DC photovoltaic converter (8) that have outputs combined through low energy storage combiner circuitry (9). The converters can be synchronously controlled through a synchronous phase control (11) that synchronously operates switches to provide a conversion combined photovoltaic DC output (10). Converters can be provided for individual source conversion or phased operational modes, the latter presenting a combined low photovoltaic energy storage DC-DC photovoltaic converter (15) at string or individual panel levels.

16 Claims, 9 Drawing Sheets

Related U.S. Application Data continuation of application No. 17/321,329, filed on May 14, 2021, now Pat. No. 12,057,514, which is a continuation of application No. 16/172,524, filed on Oct. 26, 2018, now Pat. No. 11,121,556, which is a continuation of application No. 15/213,193, filed on Jul. 18, 2016, now Pat. No. 10,116,140, which is a continuation of application No. 14/550,574, filed on Nov. 21, 2014, now Pat. No. 9,397,497, which is a continuation of application No. PCT/US2013/032410, filed on Mar. 15, 2013.

(51) Int. Cl.
*H02J 3/38* (2026.01)
*H02J 3/46* (2026.01)
*H02J 101/24* (2026.01)
*H02M 1/00* (2007.01)
*H02S 40/30* (2014.01)

(52) U.S. Cl.
CPC ................ *H02J 3/46* (2013.01); *H02S 40/30* (2014.12); *H02J 2101/24* (2026.01); *H02M 1/0067* (2021.05); *H02M 1/0077* (2021.05); *Y02E 10/56* (2013.01)

(58) Field of Classification Search
CPC ...... H02J 3/44; H02J 3/46; H02J 3/466; H02J 3/50; H02J 2101/24; H02M 1/0067; H02M 1/0077; H02M 3/1586; Y02E 10/56
USPC ............................................................ 307/82
See application file for complete search history.

(56) References Cited

U.S. PATENT DOCUMENTS 4,168,124 A 9/1979 Pizzi
4,218,139 A 8/1980 Sheffield
4,222,665 A 9/1980 Tachizawa
4,249,958 A 2/1981 Baudin
4,274,044 A 6/1981 Barre
4,341,607 A 7/1982 Tison
4,375,662 A 3/1983 Baker
4,390,940 A 6/1983 Corbefin et al.
4,395,675 A 7/1983 Toumani
4,404,472 A 9/1983 Steigerwald
4,409,537 A 10/1983 Harris
4,445,030 A 4/1984 Carlson
4,445,049 A 4/1984 Steigerwald
4,513,167 A 4/1985 Brandstetter
4,528,503 A 7/1985 Cole
4,580,090 A 4/1986 Bailey et al.
4,581,716 A 4/1986 Kamiya
4,619,863 A 10/1986 Taylor
4,626,983 A 12/1986 Harada et al.
4,634,943 A 1/1987 Reick
4,649,334 A 3/1987 Nakajima
4,652,770 A 3/1987 Kumano
4,725,740 A 2/1988 Nakata
4,749,982 A 6/1988 Rikuna et al.
4,794,909 A 1/1989 Elden
4,873,480 A 10/1989 Lafferty
4,896,034 A 1/1990 Kiriseko
4,899,269 A 2/1990 Rouzies
4,922,396 A 5/1990 Niggemeyer
5,027,051 A 6/1991 Lafferty
5,028,861 A 7/1991 Pace et al.
5,144,222 A 9/1992 Herbert
5,179,508 A 1/1993 Lange et al.
5,270,636 A 12/1993 Lafferty
5,401,561 A 3/1995 Fisun et al.
5,402,060 A 3/1995 Erisman
5,493,155 A 2/1996 Okamoto et al.
5,493,204 A 2/1996 Caldwell
5,503,260 A 4/1996 Riley
5,646,502 A 7/1997 Johnson
5,648,731 A 7/1997 Decker et al.
5,659,465 A 8/1997 Flack
5,669,987 A 9/1997 Takehara et al.
5,689,242 A 11/1997 Sims et al.
5,734,258 A 3/1998 Esser
5,741,370 A 4/1998 Hanoka
5,747,967 A 5/1998 Muljadi et al.
5,782,994 A 7/1998 Mori et al.
5,801,519 A 9/1998 Midya et al.
5,896,281 A 4/1999 Bingley
5,898,585 A 4/1999 Sirichote et al.
5,923,100 A 7/1999 Lukens et al.
5,932,994 A 8/1999 Jo et al.
6,046,401 A 4/2000 McCabe
6,069,472 A 5/2000 Pernyeszi
6,081,104 A 6/2000 Kern
6,124,769 A 9/2000 Igarashi et al.
6,162,986 A 12/2000 Shiotsuka
6,166,527 A 12/2000 Dwelley et al.
6,180,868 B1 1/2001 Yoshino et al.
6,181,590 B1 1/2001 Yamane et al.
6,191,501 B1 2/2001 Bos
6,218,605 B1 4/2001 Daily et al.
6,218,820 B1 4/2001 D'Arrigo et al.
6,219,623 B1 4/2001 Wills
6,262,558 B1 7/2001 Weinburg
6,275,016 B1 8/2001 Ivanov
6,278,052 B1 8/2001 Takehara et al.
6,281,485 B1 8/2001 Siri
6,282,104 B1 8/2001 Kern
6,314,007 B2 11/2001 Johnson, Jr. et al.
6,331,670 B2 12/2001 Takehara et al.
6,348,781 B1 2/2002 Midya et al.
6,351,400 B1 2/2002 Lumsden
6,369,462 B1 4/2002 Siri
6,433,522 B1 8/2002 Siri
6,433,992 B2 8/2002 Nakagawa et al.
6,441,896 B1 8/2002 Field
6,448,489 B2 9/2002 Kimura et al.
6,493,246 B2 12/2002 Suzui et al.
6,515,215 B1 2/2003 Mimura
6,545,211 B1 4/2003 Mimura
6,545,868 B1 4/2003 Kledzik et al.
6,593,521 B2 7/2003 Kobayashi
6,600,668 B1 7/2003 Patel
6,624,350 B2 9/2003 Nixon et al.
6,636,431 B2 10/2003 Seki et al.
6,670,721 B2 12/2003 Lof et al.
6,686,533 B2 2/2004 Raum et al.
6,686,727 B2 2/2004 Ledenev et al.
6,696,823 B2 2/2004 Ledenev et al.
6,703,555 B2 3/2004 Takabayashi et al.
6,750,391 B2 6/2004 Bower et al.
6,788,033 B2 9/2004 Vinciarelli
6,791,024 B2 9/2004 Toyomura
6,798,177 B1 9/2004 Liu et al.
6,804,127 B2 10/2004 Zhou
6,889,122 B2 5/2005 Perez
6,914,418 B2 7/2005 Sung
6,914,420 B2 7/2005 Crocker
6,920,055 B1 7/2005 Zeng et al.
6,952,355 B2 10/2005 Rissio et al.
6,958,922 B2 10/2005 Kazem
6,984,965 B2 1/2006 Vinciarelli
6,984,970 B2 1/2006 Capel
7,019,988 B2 3/2006 Fung et al.
7,046,531 B2 5/2006 Zocchi et al.
7,068,017 B2 6/2006 Willner et al.
7,072,194 B2 7/2006 Nayar et al.
7,088,595 B2 8/2006 Nino
7,091,707 B2 8/2006 Cutler
7,092,265 B2 8/2006 Kernahan
7,158,395 B2 1/2007 Deng et al.
7,193,872 B2 3/2007 Siri
7,227,278 B2 6/2007 Realmuto et al.
7,248,946 B2 7/2007 Bashaw et al.

(56) References Cited

U.S. PATENT DOCUMENTS

| | | | |
|---|---|---|---|
| 7,274,975 | B2 | 9/2007 | Miller |
| 7,333,916 | B2 | 2/2008 | Warfield et al. |
| 7,339,287 | B2 | 3/2008 | Jepsen et al. |
| 7,365,661 | B2 | 4/2008 | Thomas |
| 7,411,371 | B2 | 8/2008 | Hobbs |
| 7,471,073 | B2 | 12/2008 | Rettenwort et al. |
| 7,479,774 | B2 | 1/2009 | Wai |
| 7,514,900 | B2 | 4/2009 | Sander et al. |
| 7,596,008 | B2 | 9/2009 | Iwata et al. |
| D602,432 | S | 10/2009 | Moussa |
| 7,602,080 | B1 | 10/2009 | Hadar et al. |
| 7,605,498 | B2 | 10/2009 | Ledenev et al. |
| 7,619,200 | B1 | 11/2009 | Seymour et al. |
| 7,619,323 | B2 | 11/2009 | Tan et al. |
| 7,663,342 | B2 | 2/2010 | Kimball et al. |
| 7,719,140 | B2 | 5/2010 | Ledenev et al. |
| 7,768,155 | B2 | 8/2010 | Fornage |
| 7,786,716 | B2 | 8/2010 | Simburger et al. |
| 7,807,919 | B2 | 10/2010 | Powell |
| 7,834,580 | B2 | 11/2010 | Haines |
| 7,843,085 | B2 | 11/2010 | Ledenev et al. |
| 7,919,953 | B2 | 4/2011 | Porter et al. |
| 7,948,221 | B2 | 5/2011 | Watanabe et al. |
| 7,962,249 | B1 | 6/2011 | Zhang et al. |
| 8,004,116 | B2 | 8/2011 | Ledenev et al. |
| 8,013,472 | B2 | 9/2011 | Adest et al. |
| 8,018,748 | B2 | 9/2011 | Leonard |
| 8,058,747 | B2 | 11/2011 | Avrutsky et al. |
| 8,063,606 | B2 | 11/2011 | Veselic |
| 8,093,756 | B2 | 1/2012 | Porter et al. |
| 8,106,765 | B1 | 1/2012 | Ackerson et al. |
| 8,242,634 | B2 | 8/2012 | Schatz et al. |
| 8,264,195 | B2 | 9/2012 | Takehara et al. |
| 8,273,979 | B2 | 9/2012 | Weir |
| 8,304,932 | B2 | 11/2012 | Ledenev et al. |
| 8,314,375 | B2 | 11/2012 | Arditi et al. |
| 8,461,811 | B2 | 6/2013 | Porter et al. |
| 8,473,250 | B2 | 6/2013 | Adest |
| 8,482,153 | B2 | 7/2013 | Ledenev et al. |
| 8,531,055 | B2 | 9/2013 | Adest et al. |
| 8,593,103 | B2 | 11/2013 | Takehara et al. |
| 8,618,692 | B2 | 12/2013 | Adest et al. |
| 8,773,092 | B2 | 7/2014 | Fishelov |
| 8,816,535 | B2 | 8/2014 | Adest et al. |
| 8,854,193 | B2 | 10/2014 | Makhota et al. |
| 8,860,241 | B2 | 10/2014 | Hadar et al. |
| 8,929,112 | B2 | 1/2015 | Schill |
| 9,042,145 | B2 | 5/2015 | Schill |
| 9,088,178 | B2 | 7/2015 | Adest |
| 9,099,759 | B2 | 8/2015 | Caldwell |
| 9,112,379 | B2 | 8/2015 | Sella et al. |
| 9,366,714 | B2 | 6/2016 | Ledenev et al. |
| 9,368,964 | B2 | 6/2016 | Adest et al. |
| 9,397,497 | B2 | 7/2016 | Ledenev |
| 9,438,037 | B2 | 9/2016 | Ledenev et al. |
| 9,442,504 | B2 | 9/2016 | Porter et al. |
| 9,466,737 | B2 | 10/2016 | Ledenev |
| 9,673,630 | B2 | 6/2017 | Ledenev et al. |
| 9,673,732 | B2 | 6/2017 | Deboy |
| 9,853,490 | B2 | 12/2017 | Adest et al. |
| 10,032,939 | B2 | 7/2018 | Ledenev et al. |
| 10,116,140 | B2 | 10/2018 | Ledenev et al. |
| 10,326,282 | B2 | 6/2019 | Porter et al. |
| 10,326,283 | B2 | 6/2019 | Porter et al. |
| 10,608,437 | B2 | 3/2020 | Ledenev et al. |
| 10,714,637 | B2 | 7/2020 | Ledenev et al. |
| 10,886,746 | B1 | 1/2021 | Ledenev et al. |
| 10,938,219 | B2 | 3/2021 | Porter et al. |
| 10,992,238 | B2 | 4/2021 | Yoscovich |
| 11,121,556 | B2 | 9/2021 | Ledenev |
| 11,228,182 | B2 | 1/2022 | Porter et al. |
| 11,289,917 | B1 | 3/2022 | Ledenev et al. |
| 11,309,708 | B2 | 4/2022 | Ley et al. |
| 11,411,126 | B2 | 8/2022 | Ledenev et al. |
| 11,967,653 | B2 | 4/2024 | Ledenev |
| 12,003,110 | B2 | 6/2024 | Ledenev |
| 12,027,867 | B2 | 7/2024 | Porter et al. |
| 12,027,869 | B2 | 7/2024 | Ledenev et al. |
| 12,034,087 | B2 | 7/2024 | Ledenev et al. |
| 12,057,514 | B2 | 8/2024 | Ledenev |
| 12,538,608 | B2 | 1/2026 | Ledenev |
| 2001/0007522 | A1 | 7/2001 | Nakagawa et al. |
| 2001/0032664 | A1 | 10/2001 | Takehara et al. |
| 2002/0038200 | A1 | 3/2002 | Shimizu et al. |
| 2002/0186020 | A1 | 12/2002 | Kondo |
| 2002/0195136 | A1 | 12/2002 | Takabayashi et al. |
| 2003/0035308 | A1 | 2/2003 | Lynch |
| 2003/0036806 | A1 | 2/2003 | Schienbein |
| 2003/0062078 | A1 | 4/2003 | Mimura |
| 2003/0075211 | A1 | 4/2003 | Makita et al. |
| 2003/0117822 | A1 | 6/2003 | Stamenic et al. |
| 2003/0218449 | A1 | 11/2003 | Ledenev et al. |
| 2004/0027112 | A1 | 2/2004 | Kondo et al. |
| 2004/0051387 | A1 | 3/2004 | Lasseter |
| 2004/0085048 | A1 | 5/2004 | Tateishi |
| 2004/0095020 | A1 | 5/2004 | Kernahan et al. |
| 2004/0100149 | A1 | 5/2004 | Lai |
| 2004/0135560 | A1 | 7/2004 | Kernahan |
| 2004/0159102 | A1 | 8/2004 | Toyomura et al. |
| 2004/0164557 | A1 | 8/2004 | West |
| 2004/0175598 | A1 | 9/2004 | Bliven |
| 2004/0207366 | A1 | 10/2004 | Sung |
| 2004/0211456 | A1 | 10/2004 | Brown |
| 2005/0002214 | A1 | 1/2005 | Deng et al. |
| 2005/0068012 | A1 | 3/2005 | Cutler |
| 2005/0077879 | A1 | 4/2005 | Near |
| 2005/0093526 | A1 | 5/2005 | Notman |
| 2005/0105224 | A1 | 5/2005 | Nishi |
| 2005/0109386 | A1 | 5/2005 | Marshall |
| 2005/0116475 | A1 | 6/2005 | Hibi et al. |
| 2005/0121067 | A1 | 6/2005 | Toyomura |
| 2005/0162018 | A1 | 7/2005 | Realmuto et al. |
| 2005/0169018 | A1 | 8/2005 | Hatai et al. |
| 2005/0218876 | A1 | 10/2005 | Nino |
| 2005/0254191 | A1 | 11/2005 | Bashaw et al. |
| 2006/0017327 | A1 | 1/2006 | Siri et al. |
| 2006/0103360 | A9 | 5/2006 | Cutler |
| 2006/0162772 | A1 | 7/2006 | Preser et al. |
| 2006/0171182 | A1 | 8/2006 | Siri et al. |
| 2006/0174939 | A1 | 8/2006 | Matan |
| 2007/0024257 | A1 | 2/2007 | Boldo |
| 2007/0035975 | A1 | 2/2007 | Dickerson et al. |
| 2007/0038534 | A1 | 2/2007 | Canter |
| 2007/0044837 | A1 | 3/2007 | Simburger et al. |
| 2007/0069520 | A1 | 3/2007 | Schetters |
| 2007/0111103 | A1 | 5/2007 | Konishiike et al. |
| 2007/0119718 | A1 | 5/2007 | Gibson et al. |
| 2007/0133241 | A1 | 6/2007 | Mumtaz et al. |
| 2007/0159866 | A1 | 7/2007 | Siri |
| 2007/0165347 | A1 | 7/2007 | Wendt et al. |
| 2007/0171680 | A1 | 7/2007 | Perreault et al. |
| 2007/0236187 | A1 | 10/2007 | Wai et al. |
| 2008/0036440 | A1 | 2/2008 | Garmer |
| 2008/0062724 | A1 | 3/2008 | Feng et al. |
| 2008/0097655 | A1 | 4/2008 | Hadar et al. |
| 2008/0101101 | A1 | 5/2008 | Iwata et al. |
| 2008/0111517 | A1 | 5/2008 | Pfeifer et al. |
| 2008/0123375 | A1 | 5/2008 | Beardsley |
| 2008/0136367 | A1 | 6/2008 | Adest et al. |
| 2008/0143188 | A1 | 6/2008 | Adest et al. |
| 2008/0144294 | A1 | 6/2008 | Adest et al. |
| 2008/0147335 | A1 | 6/2008 | Adest et al. |
| 2008/0150366 | A1 | 6/2008 | Adest et al. |
| 2008/0164766 | A1 | 7/2008 | Adest et al. |
| 2008/0186004 | A1 | 8/2008 | Williams |
| 2008/0236648 | A1 | 10/2008 | Klein et al. |
| 2008/0238195 | A1 | 10/2008 | Shaver |
| 2008/0247201 | A1 | 10/2008 | Perol |
| 2008/0257397 | A1 | 10/2008 | Glaser et al. |
| 2009/0020151 | A1 | 1/2009 | Fornage |
| 2009/0039852 | A1 | 2/2009 | Fisehlov et al. |
| 2009/0078300 | A1 | 3/2009 | Ang et al. |
| 2009/0097655 | A1 | 4/2009 | Kishimoto et al. |
| 2009/0114263 | A1 | 5/2009 | Powell et al. |

(56) References Cited

U.S. PATENT DOCUMENTS

| | | | |
|---|---|---|---|
| 2009/0120485 | A1 | 5/2009 | Kikinis |
| 2009/0133736 | A1 | 5/2009 | Powell et al. |
| 2009/0140715 | A1 | 6/2009 | Adest et al. |
| 2009/0141522 | A1 | 6/2009 | Adest et al. |
| 2009/0145480 | A1 | 6/2009 | Adest et al. |
| 2009/0146505 | A1 | 6/2009 | Powell et al. |
| 2009/0146667 | A1 | 6/2009 | Adest et al. |
| 2009/0146671 | A1 | 6/2009 | Gazit |
| 2009/0147554 | A1 | 6/2009 | Adest et al. |
| 2009/0150005 | A1 | 6/2009 | Hadar et al. |
| 2009/0160258 | A1 | 6/2009 | Allen et al. |
| 2009/0160259 | A1 | 6/2009 | Naiknaware et al. |
| 2009/0206666 | A1 | 8/2009 | Sella |
| 2009/0207543 | A1 | 8/2009 | Boniface et al. |
| 2009/0218887 | A1 | 9/2009 | Ledenev et al. |
| 2009/0234692 | A1 | 9/2009 | Powell et al. |
| 2009/0237042 | A1 | 9/2009 | Glovinksi |
| 2009/0237043 | A1 | 9/2009 | Glovinksi |
| 2009/0273241 | A1 | 11/2009 | Gazit et al. |
| 2009/0283128 | A1 | 11/2009 | Zhang et al. |
| 2009/0283129 | A1 | 11/2009 | Foss |
| 2009/0284078 | A1 | 11/2009 | Zhang et al. |
| 2009/0284232 | A1 | 11/2009 | Zhang et al. |
| 2009/0284240 | A1 | 11/2009 | Zhang et al. |
| 2009/0284998 | A1 | 11/2009 | Zhang et al. |
| 2010/0001587 | A1 | 1/2010 | Casey et al. |
| 2010/0026097 | A1 | 2/2010 | Avrutsky et al. |
| 2010/0027297 | A1 | 2/2010 | Avrutsky et al. |
| 2010/0038968 | A1 | 2/2010 | Ledenev et al. |
| 2010/0078057 | A1 | 4/2010 | Karg et al. |
| 2010/0085670 | A1 | 4/2010 | Palaniswami et al. |
| 2010/0089431 | A1 | 4/2010 | Weir |
| 2010/0117858 | A1 | 5/2010 | Rozenboim |
| 2010/0118985 | A1 | 5/2010 | Rozenboim |
| 2010/0127570 | A1 | 5/2010 | Hadar et al. |
| 2010/0127571 | A1 | 5/2010 | Hadar et al. |
| 2010/0132758 | A1 | 6/2010 | Gilmore |
| 2010/0139732 | A1 | 6/2010 | Hadar et al. |
| 2010/0139734 | A1 | 6/2010 | Hadar et al. |
| 2010/0139743 | A1 | 6/2010 | Hadar et al. |
| 2010/0195361 | A1 | 8/2010 | Stem |
| 2010/0229915 | A1 | 9/2010 | Ledenev et al. |
| 2010/0246230 | A1 | 9/2010 | Porter et al. |
| 2010/0253150 | A1 | 10/2010 | Porter et al. |
| 2010/0308662 | A1 | 12/2010 | Schatz et al. |
| 2010/0327659 | A1 | 12/2010 | Lisi |
| 2011/0005567 | A1 | 1/2011 | Vandersluis et al. |
| 2011/0067745 | A1 | 3/2011 | Ledenev et al. |
| 2011/0084553 | A1 | 4/2011 | Adest et al. |
| 2011/0095613 | A1 | 4/2011 | Huang et al. |
| 2011/0115300 | A1 | 5/2011 | Chiang et al. |
| 2011/0127841 | A1 | 6/2011 | Chiang et al. |
| 2011/0160930 | A1 | 6/2011 | Batten et al. |
| 2011/0175454 | A1 | 7/2011 | Williams et al. |
| 2011/0181251 | A1 | 7/2011 | Porter et al. |
| 2011/0193515 | A1 | 8/2011 | Wu et al. |
| 2011/0210611 | A1 | 9/2011 | Ledenev et al. |
| 2011/0316346 | A1 | 12/2011 | Porter et al. |
| 2012/0003251 | A1 | 1/2012 | Mautino et al. |
| 2012/0043818 | A1 | 2/2012 | Stratakos et al. |
| 2012/0104864 | A1 | 5/2012 | Porter et al. |
| 2012/0175963 | A1 | 7/2012 | Adest et al. |
| 2012/0212066 | A1 | 8/2012 | Adest et al. |
| 2012/0223584 | A1 | 9/2012 | Ledenev et al. |
| 2013/0187473 | A1 | 7/2013 | Deboy et al. |
| 2013/0271096 | A1 | 10/2013 | Inagaki |
| 2014/0045325 | A1 | 2/2014 | Eun |
| 2014/0152240 | A1 | 6/2014 | Adest et al. |
| 2014/0317523 | A1 | 10/2014 | Wantland et al. |
| 2014/0319918 | A1 | 10/2014 | Siri |
| 2015/0008748 | A1 | 1/2015 | Deboy et al. |
| 2015/0100257 | A1 | 4/2015 | Adest et al. |
| 2015/0130284 | A1 | 5/2015 | Ledenev et al. |
| 2016/0156384 | A1 | 6/2016 | Fabre et al. |
| 2016/0226257 | A1 | 8/2016 | Porter et al. |
| 2016/0241079 | A1 | 8/2016 | Adest et al. |
| 2016/0268809 | A1 | 9/2016 | Ledenev et al. |
| 2016/0329720 | A1 | 11/2016 | Ledenev et al. |
| 2016/0336899 | A1 | 11/2016 | Ledenev et al. |
| 2016/0365734 | A1 | 12/2016 | Ledenev |
| 2016/0380436 | A1 | 12/2016 | Porter et al. |
| 2017/0271879 | A1 | 9/2017 | Ledenev et al. |
| 2017/0317523 | A1 | 11/2017 | Adest et al. |
| 2017/0373503 | A1 | 12/2017 | Ledenev |
| 2018/0048161 | A1 | 2/2018 | Porter et al. |
| 2018/0374965 | A1 | 12/2018 | Ledenev et al. |
| 2019/0131794 | A1 | 5/2019 | Ledenev |
| 2019/0296555 | A1 | 9/2019 | Porter et al. |
| 2019/0296556 | A1 | 9/2019 | Porter et al. |
| 2020/0220466 | A1 | 7/2020 | Backman |
| 2020/0227920 | A1 | 7/2020 | Ledenev et al. |
| 2020/0321780 | A1 | 10/2020 | Adest et al. |
| 2020/0343388 | A1 | 10/2020 | Ledenev et al. |
| 2021/0006164 | A1 | 1/2021 | Somani et al. |
| 2021/0066918 | A1 | 3/2021 | Ledenev et al. |
| 2021/0273455 | A1 | 9/2021 | Ledenev |
| 2022/0077689 | A1 | 3/2022 | Ledenev |
| 2022/0094169 | A1 | 3/2022 | Porter et al. |
| 2022/0224122 | A1 | 7/2022 | Ledenev et al. |
| 2022/0352394 | A1 | 11/2022 | Ledenev et al. |
| 2022/0360075 | A1 | 11/2022 | Adest et al. |
| 2023/0093410 | A1 | 3/2023 | Ledenev et al. |
| 2023/0188026 | A1 | 6/2023 | Yu et al. |
| 2023/0411539 | A1 | 12/2023 | Ledenev |
| 2024/0162827 | A1 | 5/2024 | Siu |
| 2024/0332434 | A1 | 10/2024 | Ledenev et al. |
| 2024/0387752 | A1 | 11/2024 | Ledenev |

FOREIGN PATENT DOCUMENTS

| | | | |
|---|---|---|---|
| CA | 2942616 | A1 | 11/2019 |
| CN | 1470098 | A | 1/2004 |
| CN | 101257221 | | 9/2008 |
| CN | 101904015 | A | 12/2010 |
| CN | 102013853 | A | 4/2011 |
| DE | 4032569 | A | 4/1992 |
| DE | 10207560 | A1 | 9/2003 |
| DE | 102004025923 | A1 | 12/2005 |
| DE | 102008050402 | | 4/2010 |
| DE | 102013005070 | | 9/2014 |
| DE | 102010006124 | | 4/2015 |
| EP | 0178446 | B1 | 1/1989 |
| EP | 0383971 | A1 | 8/1990 |
| EP | 677749 | A2 | 10/1995 |
| EP | 824273 | A2 | 2/1998 |
| EP | 964415 | A1 | 12/1999 |
| EP | 964457 | A2 | 12/1999 |
| EP | 780750 | B1 | 3/2002 |
| EP | 1291997 | A2 | 3/2003 |
| EP | 1388927 | A2 | 2/2004 |
| EP | 2017948 | A2 | 1/2009 |
| EP | 2515424 | A2 | 10/2012 |
| EP | 3176933 | A1 | 6/2017 |
| EP | 3324505 | A1 | 5/2018 |
| EP | 3176933 | | 8/2020 |
| EP | 2212983 | | 4/2021 |
| EP | 2973982 | | 5/2021 |
| EP | 3324505 | B1 | 6/2023 |
| EP | 2208236 | B1 | 6/2024 |
| GB | 310362 | | 9/1929 |
| GB | 612859 | | 11/1948 |
| GB | 1231961 | | 5/1971 |
| GB | 424556.9 | | 11/2005 |
| GB | 2415841 | A | 1/2006 |
| GB | 2419968 | A | 5/2006 |
| GB | 2421847 | A | 7/2006 |
| GB | 2434490 | A | 7/2007 |
| IN | 280874 | | 2/2017 |
| IN | 530348 | | 3/2024 |
| JP | 62-256156 | | 7/1987 |
| JP | 07-302130 | | 11/1995 |
| JP | 8046231 | A | 2/1996 |
| JP | 2000-174307 | | 6/2000 |
| JP | 2006020390 | A | 6/2004 |

(56) References Cited

FOREIGN PATENT DOCUMENTS

| | | | |
|---|---|---|---|
| JP | 2007058845 | A | 8/2007 |
| JP | 2007-325371 | A | 12/2007 |
| JP | 2011-193548 | A | 9/2011 |
| JP | 2012-60714 | A | 3/2012 |
| KR | 1020070036528 | A | 3/2007 |
| TW | 201037958 | A | 10/2010 |
| WO | 90/03680 | | 4/1990 |
| WO | 9003680 | A1 | 4/1990 |
| WO | 02/17469 | A1 | 2/2002 |
| WO | 02/073785 | A1 | 9/2002 |
| WO | 03/036688 | A2 | 5/2003 |
| WO | 03098703 | A2 | 11/2003 |
| WO | 2004100344 | A2 | 11/2004 |
| WO | 2004100348 | A1 | 11/2004 |
| WO | 2004107543 | A2 | 12/2004 |
| WO | 2005027300 | A1 | 3/2005 |
| WO | 2005036725 | A1 | 4/2005 |
| WO | 2005076445 | A1 | 8/2005 |
| WO | 2006005125 | A1 | 1/2006 |
| WO | 2006013600 | A2 | 2/2006 |
| WO | 2006048688 | A1 | 5/2006 |
| WO | 2006048689 | A2 | 5/2006 |
| WO | 2006071436 | A2 | 7/2006 |
| WO | 2006078685 | A2 | 7/2006 |
| WO | 2006117551 | A2 | 11/2006 |
| WO | 2006137948 | A2 | 12/2006 |
| WO | 2007007360 | A2 | 1/2007 |
| WO | 2007048421 | A2 | 5/2007 |
| WO | 2007080429 | A2 | 7/2007 |
| WO | 2007142693 | A2 | 12/2007 |
| WO | 2008069926 | A3 | 6/2008 |
| WO | 2008125915 | A2 | 10/2008 |
| WO | 2008132553 | A2 | 11/2008 |
| WO | 2008142480 | A2 | 11/2008 |
| WO | 2008142480 | A4 | 11/2008 |
| WO | 2009003680 | A1 | 1/2009 |
| WO | 2009007782 | A2 | 1/2009 |
| WO | 2009007782 | A3 | 1/2009 |
| WO | 2009051853 | A1 | 4/2009 |
| WO | 2009051854 | A1 | 4/2009 |
| WO | 2009051870 | A1 | 4/2009 |
| WO | 2009055474 | A1 | 4/2009 |
| WO | 2009059028 | A2 | 5/2009 |
| WO | 2009064683 | A2 | 5/2009 |
| WO | 2009072075 | A2 | 6/2009 |
| WO | 2009072075 | A9 | 6/2009 |
| WO | 2009072076 | A2 | 6/2009 |
| WO | 2009072076 | A3 | 6/2009 |
| WO | 2009072077 | A1 | 6/2009 |
| WO | 2009073867 | A1 | 6/2009 |
| WO | 2009073868 | A1 | 6/2009 |
| WO | 2009075985 | A2 | 6/2009 |
| WO | 2009114341 | A2 | 9/2009 |
| WO | 2009118682 | A2 | 10/2009 |
| WO | 2009118682 | A3 | 10/2009 |
| WO | 2009118682 | A4 | 10/2009 |
| WO | 2009118683 | A2 | 10/2009 |
| WO | 2009118683 | A3 | 10/2009 |
| WO | 2009118683 | A4 | 10/2009 |
| WO | 2009136358 | A1 | 11/2009 |
| WO | 2009136358 | A4 | 11/2009 |
| WO | 2009140536 | A2 | 11/2009 |
| WO | 2009140539 | A2 | 11/2009 |
| WO | 2009140539 | A3 | 11/2009 |
| WO | 2009140543 | A2 | 11/2009 |
| WO | 2009140551 | A2 | 11/2009 |
| WO | 2010014116 | A1 | 2/2010 |
| WO | 2010062410 | A1 | 6/2010 |
| WO | 2010062662 | A2 | 6/2010 |
| WO | 2010065043 | A1 | 6/2010 |
| WO | 2010002960 | A1 | 7/2010 |
| WO | 2010120315 | A1 | 10/2010 |
| WO | 2011049985 | A1 | 4/2011 |
| WO | 2011110933 | A8 | 9/2011 |
| WO | 2012/024538 | A3 | 2/2012 |
| WO | 2012024540 | A3 | 2/2012 |
| WO | 2012100263 | A2 | 7/2012 |
| WO | 2014143021 | A1 | 9/2014 |

OTHER PUBLICATIONS

U.S. Appl. No. 11/333,005, filed Jan. 17, 2006, First Named Inventor Gordon E. Presher, Jr.

Quan, Li; Wolfs, P; "An Analysis of the ZVS Two-inductor Boost Converter Under Variable Frequency Operation," IEEE Transactions on Power Electronics, Central Queensland University, Rockhamton, Qld, AU; vol. 22, No. 1, Jan. 2007; pp. 120-131. Abstract only, 1 page.

Rajan, Anita; "Maximum Power Point Tracker Optimized for Solar Powered Cars;" Society of Automotive Engineers, Transactions, v 99, n Sect 6, 1990, Abstract only, 1 page.

Reimann, T, Szeponik, S; Berger, G; Petzoldt, J; "A Novel Control Principle of Bi-directional DC-DC Power Conversion," 28th Annual IEEE Power Electroncis Specialists Conference, St. Louis, MO Jun. 22-27, 1997; vol. 2, Abstract only, 1 page.

Rodriguez, C; "Analytic Solution to the Photovoltaic Maximum Power Point Problem;" IEEE Transactions of Power Electronics, vol. 54, No. 9, Sep. 2007, 7 pages.

Roman, E et al; "Intelligent PV Module for Grid-Connected PV Systems;" IEEE Transactions of Power Electronics, vol. 53, No. 4, Aug. 2006, 8 pages.

Russell, M.C. et al; "The Massachusetts Electric Solar Project: A Pilot Project to Commercialize Residential PC Systems," Photovoltaic Specialists Conference 2000; Conference Record of the 28th IEEE; Abstract Only, 1 page.

SatCon Power Systems, PowerGate Photovoltaic 50kW Power Converter System; Spec Sheet; Jun. 2004, 2 pages.

Schekulin, Dirk et al; "Module-integratable Inverters in the Power-Range of 100-400 Watts," 13th European Photovoltaic Solar Energy Conference, Oct. 23-27, 1995; Nice, France; p. 1893-1896.

Shimizu, et al.; "Generation Control Circuit for Photovoltaic Modules," IEEE Transactions on Power Electronics; vol. 16, No. 3, May 2001. 8 pages.

Siri, K; "Study of System Instability in Current-mode Converter Power Systems Operating in Solar Array Voltage Regulation Mode," Dept. of Electrical and Electronic Systems, Aerospace Corp., El Segundo, CA; Feb. 6-10, 2000 in New Orleans, LA, 15th Annual IEEE Applied Power Electronics Conference and Exposition, Abstract only, 1 page.

solar-electric.com; Northern Arizona Wind & Sun, All About MPPT Solar Charge Controllers; Nov. 5, 2007, 4 pages.

Takahashi, I. et al.; "Development of a Long-life Three-phase Flywheel UPS Using an Electrolytic Capacitorless Converter-inverter," 1999 Scripta Technica, Electr. Eng. Jpn, 127(3); 6 pages.

United States Provisional Application filed Dec. 6, 2006, U.S. Appl. No. 60/868,851, first named Inventor: Adest.

United States Provisional Application filed Dec. 6, 2006, U.S. Appl. No. 60/868,893; First Named Inventor: Adest.

United States Provisional Application filed Dec. 7, 2006, U.S. Appl. No. 60/868,962; First Named Inventor: Adest.

United States Provisional Application filed Mar. 26, 2007, U.S. Appl. No. 60/908,095; First Named Inventor: Adest.

United States Provisional Application filed May 9, 2007, U.S. Appl. No. 60/916,815; First Named Inventor: Adest.

United States Provisional Application filed Nov. 15, 2007, U.S. Appl. No. 60/986,979; First Named Inventor: Ledenev.

United States Provisional Application filed Oct. 15, 2007, U.S. Appl. No. 60/980,157; First Named Inventor: Ledenev.

United States Provisional Application filed Oct. 23, 2007, U.S. Appl. No. 60/982,053; First Named Inventor: Porter.

Walker, G.R. et al; "Cascaded DC-DC Converter Connection of Photovoltaic Modules," IEEE Transactions of Power Electronics, vol. 19, No. 4, Jul. 2004, 10 pages.

Walker, G.R. et al; "PV String Per-Module Power Point Enabling Converters," School of Information Technology and Electrical Engineering; The University of Queensland, presented at the Aus-

(56) References Cited

OTHER PUBLICATIONS tralasian Universities Power Engineering Conference, Sep. 28-Oct. 1, 2003 in Christchurch; AUPEC2003; 6 pages.
Wang, Ucilia; Greentechmedia; "National semi casts solarmagic;" www.greentechmedia.com; Jul. 2, 2008; 3 pages.
Xue, John, "PV Module Series String Balancing Converters," Supervised by Geoffrey Walker, Nov. 6, 2002; University of Queensland, School of Information Technology and Electrical Engineering; 108 pages.
Yuvarajan, S; Dachuan, Yu; Shanguang, Xu; "A Novel Power Converter for Photovoltaic Applications," Journal of Power Sources, Sep. 3, 2004; vol. 135, No. 1-2, pp. 327-331.
Feuermann, D. et al., Reversible low solar heat gain windows for energy savings. Solar Energy vol. 62, No. 3, pp. 169-175, 1998.
Román, E., et al. Experimental results of controlled PV module for building integrated PV systems; Science Direct; Solar Energy, vol. 82, Issue 5, May 2008, pp. 471-480.
Linares, L., et al. Improved Energy Capture in Series String Photovoltaics via Smart Distributed Power Electronics; Proceedings APEC 2009: 24th Annual IEEE Applied Power Electronics Conference. Washington, D.C., Feb. 2009; 7 pages.
Chen, J., et al. Buck-Boost PWM Converters Having Two Independently Controlled Switches, IEEE Power Electronics Specialists Conference, Jun. 2001, vol. 2, 6 pages.
Chen, J., et al. A New Low-Stress Buck-Boost Converter for Universal-Input PFC Applications, IEEE Applied Power Electronics Conference, Feb. 2001; 7 pages.
Walker, G. et al. PhotoVoltaic DC-DC Module Integrated Converter for Novel Cascaded and Bypass Grid Connection Topologies—Design and Optimisation, 37th IEEE Power Electronics Specialists Conference / Jun. 18-22, 2006, Jeju, Korea; 7 pages.
Esram, T., Chapman, P.L., "Comparison of Photovoltaic Array Maximum Power Point Tracking Techniques," Energy Conversion, IEEE Transactions, Vo. 22, No. 2, pp. 439-449, Jun. 2007.
Knaupp, W. et al., Operation of A 10 kW PV facade with 100 W AC photovoltaic modules, 25th PVSC; May 13-17, 1996; Washington, D.C.; 4 pages.
Schoen. T. J. N., BIPV overview & getting PV into the marketplace in the Netherlands, The 2nd World Solar Electric Buildings Conference: Sydney Mar. 8-10, 2000; 15 pages.
Stern M., et al. Development of a Low-Cost Integrated 20-kW-AC Solar Tracking Subarray for Grid-Connected PV Power System Applications—Final Report, National Renewable Energy Laboratory, Jun. 1998; 41 pages.
Verhoeve, C.W.G., et al., Recent Test Results of AC-Module inverters, Netherlands Energy Research Foundation ECN, 1997; 3 pages.
International Application No. PCT/US08/57105, International Preliminary Report on Patentability, mailed Mar. 12, 2010; 44 pages.
International Application No. PCT/US08/70506 corrected International Preliminary Report on Patentability, mailed Jun. 25, 2010; 12 pages.
International App. No. PCT/US09/41044, Search Report dated Jun. 5, 2009; 3 pages.
International App. No. PCT/US09/41044, Written Opinion dated Jun. 5, 2009; 13 pages.
International App. No. PCT/US08/79605, Search Report dated Feb. 3, 2009; 3 pages.
International App. No. PCT/US08/79605, Written Opinion dated Feb. 3, 2009; 6 pages.
International App. No. PCT/US08/80794, Search Report dated Feb. 23, 2009; 3 pages.
International App. No. PCT/US08/80794, Written Opinion dated Feb. 23, 2009; 7 pages.
National Semiconductor News Release—National semiconductor's SolarMagic Chipset Makes Solar Panels "Smarter" May 2009; 3 pages.
SM3320 Power Optimizer Specifications; SolarMagic Power Optimizer, Apr. 2009; 2 pages.
U.S. Appl. No. 16/925,236, filed Jul. 9, 2020. First Named Inventor: Ledenev. Filing Receipt dated Jul. 23, 2020. 4 pages.
U.S. Appl. No. 17/036,630, filed Sep. 29, 2020. First Named Inventor: Ledenev. Filing Receipt dated Oct. 20, 2020, 2020. 4 pages.
U.S. Appl. No. 16/440,843, filed Jun. 13, 2019. First Named Inventor: Porter. Notice of Allowance dated Oct. 8, 2020. 9 pages.
U.S. Appl. No. 16/834,639, filed Mar. 30, 2020. First Named Inventor: Ledenev. Ex Parte Quayle Action dated Oct. 14, 2020. 7 pages.
U.S. Appl. No. 16/172,524, filed Oct. 26, 2018. First Named Inventor: Ledenev. Office Action dated Sep. 2, 2020. 8 pages.
European Patent Application No. 13877614.1. Dated Sep. 25, 2020 Communication Under Rule 71(3) EPC. 6 pages.
U.S. Appl. No. 17/036,630, filed Sep. 29, 2020. First Named Inventor: Ledenev. Notice of Allowance dated Nov. 18, 2020. 9 pages.
U.S. Appl. No. 17/036,630, filed Sep. 29, 2020. First Named Inventor: Ledenev. Updated Filing Receipt dated Nov. 3, 2020. 4 pages.
U.S. Appl. No. 16/439,430, filed Jun. 12, 2019. Office Action dated Dec. 7, 2020. 41 pages.
U.S. Appl. No. 17/036,630, filed Sep. 29, 2020. First Named Inventor: Ledenev.
U.S. Appl. No. 17/063,669, filed Oct. 5, 2020. First Named Inventor: Ledenev.
U.S. Appl. No. 17/063,669, filed Oct. 5, 2020. First Named Inventor: Ledenev. Filing Receipt dated Nov. 25, 2020 4 pages.
U.S. Appl. No. 16/834,639, filed Mar. 30, 2020. First Named Inventor: Ledenev.
U.S. Appl. No. 16/172,524, filed Oct. 26, 2018. First Named Inventor: Ledenev. Notice of Allowance dated Jan. 11, 2021. 8 pages.
European Patent Application No. 08732274.9 dated Oct. 15, 2020. Communication under Rule 91(3) EPC. 52 pages.
U.S. Appl. No. 16/834,639, filed Mar. 30, 2020. First Named Inventor: Ledenev. Notice of Allowance mailed Feb. 2, 2021. 10 pages.
U.S. Appl. No. 17/063,669, filed Oct. 5, 2020. Filing Receipt mailed Jan. 13, 2021. 4 pages.
U.S. Appl. No. 17/036,630. Issue Notification dated Dec. 16, 2020. 1 pages.
U.S. Appl. No. 17/063,669, filed Oct. 5, 2020. First Named Inventor: Ledenev. Ex Parte Quayle Action dated Feb. 10, 2021. 6 pages.
U.S. Appl. No. 16/834,639, filed Mar. 30, 2020. Updated Notice of Allowance and Interview Summary dated Feb. 24, 2021. 3 pages.
U.S. Appl. No. 16/440,843, filed Jun. 13, 2019, First Named Inventor: Porter. Issue Notification dated Feb. 10, 2021. 1 page.
U.S. Appl. No. 16/834,639, filed Mar. 30, 2020. Notice of Allowance dated Mar. 12, 2021. 17 pages.
European Patent Application No. 08732274.9, Decision to Grant a European Patent Pursuant to Article 97(1) EPC dated Mar. 12, 2021. 2 pages.
U.S. Appl. No. 16/439,430, filed Jun. 12, 2019. Office Action dated Apr. 7, 2021. 52 pages.
SolarEdge System Design and the National Electrical Code, Revisoin 1.4 Apr. 2011. John Berdner. (c) 2011. 10 pages.
U.S. Appl. No. 16/172,524, filed Oct. 26, 2018. First Named Inventor: Ledenev. Corrected Notice of Allowability dated Mar. 18, 2021. 7 pages.
U.S. Appl. No. 17/011,931, filed Nov. 18, 2020. Filing Receipt dated Apr. 16, 2021. 4 pages.
European Patent Application No. 13877614.1. Decision to Grant a European Patent dated Apr. 9, 2021. 2 pages.
U.S. Appl. No. 16/172,524, filed Oct. 26, 2018. First Named Inventor: Ledenev. Corrected Notice of Allowability dated Apr. 21, 2021. 2 pages.
U.S. Appl. No. 16/172,524, filed Oct. 26, 2018. First Named Inventor: Ledenev. Issue Notification dated Apr. 28, 2021. 2 pages.
U.S. Appl. No. 16/172,524, filed Oct. 26, 2018. First Named Inventor: Ledenev. Notice of Allowance dated Jun. 28, 2021. 8 pages.
U.S. Appl. No. 16/834,639, filed Mar. 30, 2020. First Named Inventor: Ledenev. Corrected Notice of Allowability dated Jun. 28, 2021. 2 pages.

(56) References Cited

OTHER PUBLICATIONS

U.S. Appl. No. 16/834,639, filed Mar. 30, 2020. First Named Inventor: Ledenev. Issue Notification dated Jun. 30, 2021. 1 page.
U.S. Appl. No. 17/063,669, filed Oct. 5, 2020. First Named Inventor: Ledenev. Corrected Notice of Allowability dated Jun. 28, 2021. 2 pages.
European Patent No. 3176933. Communication regarding the expiry for the time limit within which notice of opposition may be filed dated Jun. 30, 2021. 1 page.
U.S. Appl. No. 17/379,516, filed Jul. 19, 2021. Filing Receipt dated Aug. 2, 2021. 4 pages.
U.S. Appl. No. 16/439,430, filed Jun. 12, 2019. Notice of Allowance dated Aug. 26, 2021. 43 pages.
U.S. Appl. No. 16/172,254, filed Oct. 26, 2018. Issue Notification dated Aug. 25, 2021. 1 page.
U.S. Appl. No. 17/321,329, filed May 14, 2021. First Named Inventor: Ledenev. Notice of Publication of Application dated Sep. 2, 2021. 1 page.
U.S. Appl. No. 16/295,236, filed Jul. 9, 2020. First Named Inventor: Anatoli Ledenev. Office Action dated Sep. 24, 2021. 10 pages.
European Patent Application No. 17209600.0, Communication pursuant to Article 94(3) EPC, dated Sep. 14, 2021. 4 pages.
U.S. Appl. No. 17/379,516, filed Jul. 19, 2021. Notice of New or Revised Projected Publication Date mailed Dec. 3, 2021. 1 page.
U.S. Appl. No. 17/537,116, filed Nov. 29, 2021. Filing Receipt mailed Dec. 10, 2021. 4 pages.
U.S. Appl. No. 17/537,116, filed Nov. 29, 2021. Updated Filing Receipt mailed Dec. 15, 2021. 4 pages.
U.S. Appl. No. 16/439,430, filed Jun. 12, 2019. Corrected Notice of Allowability dated Dec. 20, 2021. 2 pages.
U.S. Appl. No. 16/925,236, filed Jul. 9, 2020. Appliant-initiated Interview Summary dated Dec. 27, 2021. 2 pages.
U.S. Appl. No. 16/439,430, filed Jun. 12, 2019. Issue Notification dated Dec. 28, 2021. 1 page.
U.S. Appl. No. 17/379,516, filed Jul. 19, 2021. Office Action dated Jan. 4, 2022. 7 pages.
European Patent Application No. 08796302.1, Communication pursuant to Article 94(3) EPC, dated Dec. 21, 2021. 4 pages.
U.S. Appl. No. 17/379,516, filed Jul. 19, 2021. Corrected Notice of Allowability dated Mar. 2, 2022. 2 Pages.
International Application Publication No. 2008/125915A3, published Oct. 23, 2008. Applicant: SolarEdge Technologies. Abstract and Search Report. 4 pages.
International Application Publication No. 2008/132551A3, published Nov. 6, 2008. Applicant: SolarEdge Technologies. Abstract and Search Report. 7 pages.
International Application Publication No. 2008/142480A3, published Nov. 27, 2008. Applicant: SolarEdge Technologies. Abstract and Search Report. 5 pages.
U.S. Appl. No. 62/385,032, filed Sep. 8, 2016. First Named Inventor: Anatoli Ledenev.
U.S. Appl. No. 15/262,916, filed Sep. 12, 2016. First Named Inventor: Robert M. Porter.
U.S. Appl. No. 14/550,574, filed Nov. 21, 2014. First Named Inventor: Anatoli Ledenev.
International Application No. PCT/US13/032410, filed Mar. 15, 2013. First Named Inventor: Anatoli Ledenev.
U.S. Appl. No. 15/213,193, filed Jul. 18, 2016. First Named Inventor: Anatoli Ledenev.
Japanese Patent Application No. 2016-500068, international filing date: Mar. 15, 2013, Office Action dated Sep. 30, 2016, mailed Oct. 4, 2016. 8 pages.
U.S. Appl. No. 15/219,149, filed Jul. 25, 2016. First named Inventor: Anatoli Ledenev.
U.S. Appl. No. 15/219,149, filed Jul. 25, 2016. First Named Inventor: Ledenev. Office Action dated Mar. 3, 2017. 14 pages.
Canadian Patent Application No. 2737134, filed Mar. 14, 2008. First Named Inventor: Ledenev. Notice of Allowance dated Feb. 13, 2017. 1 page.
Reissue U.S. Appl. No. 15/469,087, filed Mar. 24, 2017. First Named Inventor: Ledenev.
European Patent Application No. 13877614; Extended European Search Report dated Nov. 7, 2016. 8 pages.
U.S. Appl. No. 15/219,149, filed Jul. 25, 2016. Applicant Initiated Interview Summary. Interview date Apr. 4, 2017. 1 page.
Japanese Patent Application No. 2016-500068, international filing date: Mar. 15, 2013, Office Action dated Mar. 13, 2017 mailed Mar. 15, 2016. English Translation of the Official Action. 8 pages.
U.S. Appl. No. 15/612,892, filed Jun. 2, 2017. First Named Inventor: Ledenev.
U.S. Appl. No. 15/679,745, filed Aug. 17, 2017. First Named Inventor: Ledenev.
Chinese Patent Application No. 201310162669.6, 5th Notification of Office Action dated Mar. 20, 2017. 6 pages.
Chinese Patent Application No. 201310162669.6, Decision of Rejection dated Sep. 7, 2017. 8 pages.
Chinese Patent Application No. 201310162669.6, First Office Action dated Nov. 25, 2014. 6 pages.
Chinese Patent Application No. 201310162669.6, Search Report dated Nov. 25, 2014. 2 pages.
Chinese Patent Application No. 201310162669.6, Second Notification of Office Action dated Jul. 17, 2015. 8 pages.
Chinese Patent Application No. 201310162669.6, Third Notification of Office Action dated Jan. 14, 2016. 7 pages.
Chinese Patent Application No. 201310162669.6, Fourth Notification of Office Action dated Aug. 17, 2016. 7 pages.
Canadian Patent Application No. 2702392, Office Action dated Jul. 31, 2014. 2 pages.
Canadian Patent Application No. 2702392, Office Action dated Sep. 26, 2013. 2 pages.
European Patent Application No. 08796302.1, Office Action dated Jun. 28, 2016. 4 pages.
German Patent No. DE4032569A1, published Apr. 16, 1992. Translated from GooglePatent. 7 pages.
Chinese Application No. 201380076592.9, Second Notification of Office Action dated Jul. 28, 2017. 9 pages.
Chinese Application No. 201380076592.9 filed Mar. 15, 2013. First Notification of Office Action and Search Report dated Nov. 28, 2016. 11 pages.
U.S. Appl. No. 15/219,149, filed Jul. 25, 2016. First Named Inventor: Ledenev. Notice of Allowance and Applicant Initiated Interview Summary dated Apr. 26, 2017. 14 pages.
U.S. Appl. No. 15/181,174, filed Jun. 13, 2016. First Named Inventor: Ledenev: Office Action dated Oct. 10, 2017. 12 pages.
European Application No. 17150670.2. Extended European Search Report dated Apr. 7, 2017. 13 pages.
U.S. Appl. No. 15/469,087, filed Mar. 24, 2017. First Named Inventor: Ledenev. Applicant-Initiated Interview Summary dated Oct. 20, 2017. 4 pages.
Japanese Patent Application No. 2016-500068. Final rejection dated Sep. 29, 2017. English Translation. 7 pages.
Japanese Patent Application No. 2016-160797. Rejection dated Sep. 29, 2017. 10 pages.
U.S. Appl. No. 15/793,704, filed Oct. 25, 2017. First Named Inventor: Porter.
Japanese Laid-Open Publication No. 2007-325371. Abstract only. 1 page.
U.S. Appl. No. 15/164,806, filed May 25, 2016. First Named Inventor: Anatoli Ledenev. Ex Parte Quayle Action dated Dec. 12, 2017. 8 pages.
U.S. Appl. No. 15/213,193, filed Jul. 18, 2016. First Named Inventor: Ledenev. Office Action dated Jan. 19, 2018. 15 pages.
Vazquez, et al., The Tapped-Inductor Boost Converter. © 2007 IEEE. 6 pages.
European Patent Application No. 17150670.2. Office Action dated Jan. 29, 2018. 9 pages.
Chinese Patent Application No. 201380076592.9. English Translation of the 3rd Notification of Office Action, dated Feb. 7, 2018. 13 pages.
U.S. Appl. No. 15/164,806, filed May 25, 2016. Notice of Allowance dated Mar. 9, 2018. 8 pages.

(56) References Cited

OTHER PUBLICATIONS

U.S. Appl. No. 15/164,806, filed May 25, 2016. Corrected filing receipt mailed Mar. 14, 2018. 3 pages.
Japanese Patent Application No. 2016-160797. Rejection dated Mar. 27, 2018. 13 pages.
European Application No. 17209600, Extended European Search Report dated Apr. 10, 2018. 6 pages.
U.S. Appl. No. 15/164,806, filed May 25, 2016. Corrected Notice of Allowance dated May 10, 2018. 4 pages.
Patent Interference No. 106,054(JTM), declared Jun. 1, 2016. Senior Party: Meir Adest; Junior Party: Anatoli Ledenev; Sep. 8, 2016 Hearing Transcript with Changes. 18 pages.
Patent Interference No. 106,054(JTM), declared Jun. 1, 2016. Senior Party: Meir Adest; Junior Party: Anatoli Ledenev; Exhibit 2014—Adest et al., U.S. Appl. No. 13/430,388, Amendment submitted Jan. 14, 2016.
Patent Interference No. 106,054(JTM), declared Jun. 1, 2016. Senior Party: Meir Adest; Junior Party: Anatoli Ledenev; Exhibit 2027—Deposition Transcript of Marc E. Herniter, dated Oct. 14, 2016. 246 pages.
Patent Interference No. 106,054(JTM), declared Jun. 1, 2016. Senior Party: Meir Adest; Junior Party: Anatoli Ledenev; Third Declaration of Eric A. Seymour, executed Nov. 14, 2016. 27 pages.
Maranda, et al. Optimiazation of the Master-Slave Inverter System for Grid-Connected Photovoltaic Plants, Energy Convers. Mgmt, vol. 39, No. 12, pp. 1239-1246, 1998.
Patent Interference No. 106,054(JTM), declared Jun. 1, 2016. Senior Party: Meir Adest; Junior Party: Anatoli Ledenev; Exhibit 2033—Deposition Transcript of Marc E. Herniter, dated Dec. 14, 2016. 109 pages.
Patent Interference No. 106,054(JTM), declared Jun. 1, 2016. Senior Party: Meir Adest; Junior Party: Anatoli Ledenev; Exhibit 1009—U.S. Appl. No. 12/329,525: EFS Acknowledgement Receipt, Drawings, Abstract, Claims, Specification, Declaration, Application Data Sheet, and Transmittal as filed Dec. 12, 2005; Petition and Application Data Sheet dated Apr. 12, 2013; and Filing Receipt and Petition Decision dated Apr. 19, 2013. 59 pages.
Patent Interference No. 106,054(JTM), declared Jun. 1, 2016. Senior Party: Meir Adest; Junior Party: Anatoli Ledenev; Exhibit 1014: Claim chart—Comparing Count 1 to U.S. Appl. No. 60/908,095. 2 pages.
Patent Interference No. 106,054(JTM), declared Jun. 1, 2016. Senior Party: Meir Adest; Junior Party: Anatoli Ledenev; Exhibit 1015: Declaration of Marc E. Herniter dated Nov. 14, 2016. 22 pages.
Patent Interference No. 106,054(JTM), declared Jun. 1, 2016. Senior Party: Meir Adest; Junior Party: Anatoli Ledenev; Exhibit 1016: Declaration of Marc E. Herniter dated Nov. 21, 2016. 25 pages.
Patent Interference No. 106,054(JTM), declared Jun. 1, 2016. Senior Party: Meir Adest; Junior Party: Anatoli Ledenev; Exhibit 1018: Datasheet, SW 280-290 Mono Black Sunmodule Plus, retrieved Nov. 21, 2016 from http://www.solar-world-usa.com/~/media/www/files/datasheets/series/sunmodule-plus-mono-black-5-busbar-datasheet.pdf?la=en. 2 pages.
Patent Interference No. 106,054(JTM), declared Jun. 1, 2016. Senior Party: Meir Adest; Junior Party: Anatoli Ledenev; Ledenev Notice of Filing of Continuation Applications dated Aug. 23, 2017. 3 pages.
Patent Interference No. 106,054(JTM), declared Jun. 1, 2016. Senior Party: Meir Adest; Junior Party: Anatoli Ledenev; Second Supplemental Order Authorizing Ledenev Motion 7 dated Sep. 13, 2016. 5 pages.
Patent Interference No. 106,054(JTM), declared Jun. 1, 2016. Senior Party: Meir Adest; Junior Party: Anatoli Ledenev; Supplemental Order Authorizing Motions dated Aug. 5, 2016. 6 pages.
Patent Interference No. 106,054(JTM), declared Jun. 1, 2016. Senior Party: Meir Adest; Junior Party: Anatoli Ledenev; Ledenev First Supplemental Notice of Related Proceedings dated Aug. 12, 2017. 3 pages.
Patent Interference No. 106,054(JTM), declared Jun. 1, 2016. Senior Party: Meir Adest; Junior Party: Anatoli Ledenev; Ledenev Notice of Filing of Reissue Application dated Apr. 4, 2017. 3 pages.
TwentyNinety.com/en/about-us/, printed Aug. 17, 2010; 2 pages.
International Patent Application No. PCT/US08/60345. International Prelimianry Report on Patentability dated Aug. 30, 2010; 24 pages.
U.S. Appl. No. 61/252,998, filed Oct. 19, 2009, entitled Solar Module Circuit with Staggered Diode Arrangement; First Named Inventor: Ledenev; 55 pages.
U.S. Appl. No. 12/682,882; Nonfinal Office Action dated Sep. 27, 2010; First Named Inventor: Porter; 18 pages.
U.S. Appl. No. 12/682,882; Examiner's Interview Summary dated Oct. 20, 2010; mailed Oct. 26, 2010; 4 pages.
U.S. Appl. No. 12/738,068; Examiner's Interview Summary dated Oct. 20, 2010; 2 pages.
U.S. Appl. No. 12/738,068; Nonfinal Office Action dated Nov. 24, 2010; 8 pages.
U.S. Appl. No. 12/682,559; Nonfinal Office Action dated Dec. 10, 2010; 12 pages.
European Patent Application No. 07 873 361.5 Office Communication dated Jul. 12, 2010 and applicant's response dated Nov. 22, 2010; 24 pages.
International Patent Application No. PCT/US2008/079605. International Preliminary Report on Patentability dated Jan. 21, 2011; 7 pages.
U.S. Appl. No. 12/738,068; Examiner's Interview Summary dated Feb. 3, 2011; 2 pages.
U.S. Appl. No. 12/682,882; Examiner's Interview Summary dated Feb. 9, 2011; 4 pages.
U.S. Appl. No. 12/682,559; Examiner's Interview Summary dated Feb. 10, 2011; 3 pages.
International Patent Application No. PCT/US2010/053253. International Search Report and International Written Opinion of the International Searching Authority dated Feb. 22, 2011; 13 pages.
U.S. Appl. No. 12/682,559; Final Office Action dated Mar. 3, 2011; 13 pages.
U.S. Appl. No. 12/738,068; Notice of Allowance dated Feb. 24, 2011; 25 pages.
U.S. Appl. No. 12/955,704; Nonfinal Office Action dated Mar. 8, 2011; 7 pages.
U.S. Appl. No. 12/682,882; Final Office Action dated May 13, 2011; 17 pages.
U.S. Appl. No. 12/995,704; Notice of allowance dated Jul. 19, 2011; 5 pages.
International Application No. PCT/US09/41044; International Preliminary Report on Patentability dated Jul. 6, 2011; 14 pages.
U.S. Appl. No. 12/682,882; Notice of allowance dated Sep. 9, 2011; 9 pages.
U.S. Appl. No. 12/682,559; Nonfinal office action dated Sep. 23, 2011; 10 pages.
U.S. Appl. No. 13/275,147; Nonfinal office action dated Dec. 29, 2011; 10 pages.
U.S. Appl. No. 13/059,955; Nonfinal office action dated Jan. 23, 2012; 9 pages.
International Application No. PCT/US10/53253; International Preliminary Report on Patentability dated Jan. 25, 2012; 37 pages.
U.S. Appl. No. 12/682,559; Notice of allowance dated Apr. 17, 2012; 9 pages.
International Application No. PCT/US08/80794; International Preliminary Report on Patentability dated May 8, 2012; 7 pages.
U.S. Appl. No. 13/078,492; Nonfinal office action dated May 16, 2012, 10 pages.
U.S. Appl. No. 13/192,329; Final office action dated Jun. 13, 2012; 13 pages.
CN Patent Application No. 200880121101.7; office action dated Sep. 26, 2011; 6 pages.
CN Patent Application No. 200880121101.7; office action dated Jun. 11, 2012; 3 pages.
U.S. Appl. No. 13/192,329; Notice of Allowance dated Jul. 30, 2012; 5 pages.
International Application No. PCT/2012/022266, International Search Report dated Jul. 24, 2012; 5 pages.

(56) References Cited

OTHER PUBLICATIONS

International Application No. PCT/2012/022266, Written Opinion of the International Searching Authority dated Jul. 24, 2012; 16 pages.
U.S. Appl. No. 13/275,147; Final office action dated Aug. 24, 2012; 16 pages.
Chinese Patent Application No. 200880121009.0, Office Action dated Aug. 31, 2012; 12 pages.
U.S. Appl. No. 13/059,955; Final office action dated Sep. 27, 2012; 11 pages.
SG Patent Application No. 201107477-0; written opinion dated Nov. 27, 2012; 12 pages.
JP Patent Application No. 2010-529991; office action dated Dec. 14, 2012, 7 pages.
JP Patent Application No. 2010-529986; office action dated Mar. 5, 2013, 3 pages.
U.S. Appl. No. 13/078,492; Notice of Allowance dated Apr. 24, 2013, 10 pages.
U.S. Appl. No. 13/275,147; Notice of Allowance dated Jun. 3, 2013, 17 pages.
CN Patent Application No. 200880121101.7; Notice of Allowance dated Feb. 17, 2013, 3 pages.
Chinese Patent Application No. 200880121009.0, Office Action dated May 31, 2013, 7 pages.
JP Patent Application No. 2010-529991; office action dated Sep. 5, 2013, 6 pages.
U.S. Appl. No. 13/308,517, filed Nov. 3, 2011, First Named Inventor: Meir Adest.
U.S. Appl. No. 14/550,574, filed Nov. 21, 2014. First Named Inventor: Ledenev. Notice of Allowance dated Jun. 6, 2016; 12 pages.
Miwa, et al. High Efficiency Power Factor Correction Using Interleaving Techniques. (c) 1992 Laboratory for Electromagnetic and Electronic Systems, Massachusetts Institute of Technology. 12 pages.
Patent Interference No. 106,054(JTM), declared Jun. 1, 2016. Senior: Meir Adest; Junior Party: Anatoli Ledenev.; 13 pages.
Linear Technology Specification Sheet, LTC3440, Micropower Synchronous Buck-Boost DC/DC Converter © Linear Technology Corporation 2001. 20 pages.
Linear Technology Specification Sheet, LTC3443, High Current Micropower 600kHz Synchronous Buck-Boost DC/DC Converter © Linear Technology Corporation 2004. 16 pages.
Linear Technology Specification Sheet, LTC3780, High Efficiency Synchronous, 4-Switch Buck-Boost Controller © Linear Technology Corporation 2005. 30 pages.
Andersen, G., et al. Current Programmed Control of a Single Phase Two-Switched Buck-Boost Power Factor Correction Circuit. Aalbord University of Energy Technology, Denmark. © 2001 IEEE. 7 pages.
Andersen, G., et al. Utilizing the free running Current Programmed Control as a Power Factor Correction Technique for the two switch Buck-Boost converter. Aalborg University, Institute of Energy Technology. © 2004 IEEE. 7 pages.
Caricchi, F., et al. 20 kW Water-Cooled Prototype of a Buck-Boost Bidreictional DC-DC Converter Topology for Electrical Vehicle Motor Drives. University of Rome, "La Sapienza". © 1995 IEEE. 6 pages.
Caricchi, F., et al. Prototype of Innovative Wheel Direct Drive with Water-Cooled Axial-Flux PM Motor for Electric Vehicle Applications. University of Rome, "La Sapienza". © 1996 IEEE. 7 pages.
Caricchi, F., et al. Study of Bi-Directional Buck-Boost Converter Topologies for Application in Electrical Vehicle Motor Drives. University of Rome, "La Sapienza". © 1998 IEEE. 7 pages.
Chomsuwan, K., et al. Photovoltaic Grid-Connected Inverter Using Two-Switch Buck-Boost Converter. Ncational Science and Technology Development Agency, Thailand. © 2002 IEEE. 4 pages.
Zhou, P. & Phillips, T., Linear Technology Advertisement, Design Notes. Industry's First 4-Switch Buck-Boost Controller Achieves Highest Efficiency Using a Single Inducutor. © 2005 Linear Technology Corporation. 2 pages.
Enslin, J. H. R., Maximum Power Point Tracking: A Cost Saving Necessity In Solar Energy Systems. Department of Electrical Engineering. University of Pretoria, South Africa. © 1990 IEEE. 5 pages.
Gaboriault, M., et al., A High Efficiency, Non-Inverting, Buck-Boost DC-DC Converter. Allegro Microsystems. © 2004 IEEE. 5 pages.
Hua, et al. Comparative Study of Peak Power Tracking Techniques for Solar Storage System. Department of Electrical Engineering, National Yunlin University of Science and Technology. © 1998 IEEE. 7 pages.
Kjaer, et al. A Review of Single-Phase Grid-Connected Inverters for Photovoltaic Modules. IEEE Transactions on Industry Applications, vol. 41, No. 5, Sep./Oct. 2005. 15 pages.
Micrel, MIC2182 High Efficiency Synchronous Buck Controller. Apr. 22, 2004. 28 pages.
Midya, P., et al. Buck or Boost Tracking Power Converter. IEEE Power Electronics Letteres, vol. 2, No. 4, Dec. 2004. 4 pages.
Decker, D.K. Methods for Utilizing Maximum Power From a Solar Array. JPL Quarterly Technical Review. vol. 2, No. 1, Apr. 1972. 12 pages.
Roy, et al. Battery Charger using Bicycle. EE318 Electronic Design Lab Project, EE Dept, IIT Bombay, Apr. 2006. 14 pages.
Sullivan, C. et al. A High-Efficiency Maximum Power Point Tracker for Photovoltaic Arrays in a Solar-Powered Race Vehicle. University of California, Berkeley. © 1993 IEEE. 7 pages.
Viswanathan, K., et al. Dual-Mode Control of Cascade Buck-Boost PFC Converter. 2004 35th Annual IEEE Power Electronics Specialists Conference. 7 pages.
Walker, Geoffrey R. (2000) Evaluating MPPT converter topologies using a MATLAB PV model. In Krivda, Anrej (Ed.) AUPEC 2000: Innovation for Secure Power, Queensland University of Technology, Brisbane, Australia, pp. 138-143.
Zhang, P., et al. Hardware Design Experiences in ZebraNet. Department of Electrical Engineering, Princeton University. © 2004. 12 pages.
Mohan, Ned. Excerpt from Power electronics : converters, applications, and design. © 1989, 1995. 2 pages.
Bower, et al. "Certification of Photovoltaic Inverters: The Initial Step Toward PV System Certification" © 2002 IEEE. 4 pages.
NFPA Article 690 Solar Photovoltaic Systems, 70 National Electrical Code 70-545-90-566 (2005); 16 pages.
Patent Interference No. 106,054(JTM), declared Jun. 1, 2016. Senior: Meir Adest; Junior Party: Anatoli Ledenev; Second Declaration of Eric A. Seymour dated Sep. 23, 2016; 108 pages.
Patent Interference No. 106,054(JTM), declared Jun. 1, 2016. Senior: Meir Adest; Junior Party: Anatoli Ledenev; Declaration of Eric A. Seymour dated Sep. 9, 2016; 32 pages.
Patent Interference No. 106,054(JTM), declared Jun. 1, 2016. Senior: Meir Adest; Junior Party: Anatoli Ledenev; Declaration of Marc E. Herniter in Support of Motion 1, dated Sep. 9, 2016. 38 pages.
Patent Interference No. 106,054(JTM), declared Jun. 1, 2016. Senior: Meir Adest; Junior Party: Anatoli Ledenev; Declaration of Marc E. Herniter in Support of Motion 2, dated Sep. 9, 2016. 24 pages.
Patent Interference No. 106,054(JTM), declared Jun. 1, 2016. Senior: Meir Adest; Junior Party: Anatoli Ledenev; Declaration Redeclaration entered Jun. 30, 2016. 6 pages.
Patent Interference No. 106,054(JTM), declared Jun. 1, 2016. Senior: Meir Adest; Junior Party: Anatoli Ledenev; Adest List of Proposed Motions dated Jul. 20, 2016. 5 pages.
Patent Interference No. 106,054(JTM), declared Jun. 1, 2016. Senior: Meir Adest; Junior Party: Anatoli Ledenev; Ledenev List of Proposed Motions dated Jul. 20, 2016. 16 pages.
Patent Interference No. 106,054(JTM), declared Jun. 1, 2016. Senior: Meir Adest; Junior Party: Anatoli Ledenev; Ledenev Motion 4 dated Sep. 9, 2016. 29 pages.
Patent Interference No. 106,054(JTM), declared Jun. 1, 2016. Senior: Meir Adest; Junior Party: Anatoli Ledenev; Ledenev Motion 7 dated Sep. 23, 2016. 32 pages.
Patent Interference No. 106,054(JTM), declared Jun. 1, 2016. Senior: Meir Adest; Junior Party: Anatoli Ledenev; Ledenev Motion 8 dated Sep. 26, 2016. 4 pages.

(56) References Cited

OTHER PUBLICATIONS

Patent Interference No. 106,054(JTM), declared Jun. 1, 2016. Senior: Meir Adest; Junior Party: Anatoli Ledenev; Adest Motion 1 dated Sep. 9, 2016. 37 pages.
Patent Interference No. 106,054(JTM), declared Jun. 1, 2016. Senior: Meir Adest; Junior Party: Anatoli Ledenev; Adest Motion 2 dated Sep. 9, 2016. 33 pages.
Patent Interference No. 106,054(JTM), declared Jun. 1, 2016. Senior: Meir Adest; Junior Party: Anatoli Ledenev; Adest Opposition 8 dated Oct. 3, 2016. 10 pages.
U.S. Appl. No. 13/430,388, filed Mar. 26, 2012. First Named Inventor: Adest.
U.S. Appl. No. 11/950,271, filed Dec. 4, 2007. First Named Inventor: Adest.
Linear Technology, LTC3780, High Efficiency, Synchronous, 4-Switch Buck-Boost Controller. (c) Linear Technology 2005. 28 pages.
Patent Interference No. 106,054(JTM), declared Jun. 1, 2016. Senior Party: Meir Adest; Junior Party: Anatoli Ledenev; Ledenev Opposition 1, filed Nov. 14, 2016. 36 pages.
Patent Interference No. 106,054(JTM), declared Jun. 1, 2016. Senior Party: Meir Adest; Junior Party: Anatoli Ledenev; Adest Opposition 4, filed Nov. 14, 2016. 36 pages.
Patent Interference No. 106,054(JTM), declared Jun. 1, 2016. Senior Party: Meir Adest; Junior Party: Anatoli Ledenev; Adest Opposition 7, filed Nov. 14, 2016. 39 pages.
Patent Interference No. 106,054(JTM), declared Jun. 1, 2016. Senior Party: Meir Adest; Junior Party: Anatoli Ledenev; Order Denying Request to Waive Board 122 and SO 122.6, entered Dec. 20, 2016. 6 pages.
Patent Interference No. 106,054(JTM), declared Jun. 1, 2016. Senior Party: Meir Adest; Junior Party: Anatoli Ledenev; Order Granting Ledenev Miscellaneous Motion 8, entered Dec. 20, 2016. 4 pages.
Patent Interference No. 106,054(JTM), declared Jun. 1, 2016. Senior Party: Meir Adest; Junior Party: Anatoli Ledenev; Adest Reply 1, filed Dec. 23, 2016. 25 pages.
Patent Interference No. 106,054(JTM), declared Jun. 1, 2016. Senior Party: Meir Adest; Junior Party: Anatoli Ledenev; Ledenev Reply 4, filed Dec. 23, 2016. 29 pages.
Patent Interference No. 106,054(JTM), declared Jun. 1, 2016. Senior Party: Meir Adest; Junior Party: Anatoli Ledenev; Ledenev Reply 7, filed Dec. 23, 2016. 28 pages.
United States International Trade Commission, Investigation No. 337-TA-1327. Exhibit 917-B—Adest: 35 USC 102 & 103 Invalidity Chart for U.S. Pat. No. 11,289,917. 51 pages. Nov. 2, 2022.
United States International Trade Commission, Investigation No. 337-TA-1327. Exhibit 917-C—Klein: 35 USC 102 & 103 Invalidity Chart for U.S. Pat. No. 11,289,917. 34 pages. Nov. 2, 2022.
United States International Trade Commission, Investigation No. 337-TA-1327. Exhibit 917-D—Caldwell 35 USC 103 Invalidity Chart for U.S. Pat. No. 11,289,917. 32 pages. Nov. 2, 2022.
United States International Trade Commission, Investigation No. 337-TA-1327. Exhibit 917-E—Naiknaware 35 USC 102 & 103 Invalidity Chart for U.S. Pat. No. 11,289,917. 42 pages. Nov. 2, 2022.
United States International Trade Commission, Investigation No. 337-TA-1327. Exhibit 917-F—Ang 35 USC 103 Invalidity Chart for U.S. Pat. No. 11,289,917. 46 pages. Nov. 2, 2022.
United States International Trade Commission, Investigation No. 337-TA-1327. Exhibit 917-G 35 USC 103 Invalidity Chart for U.S. Pat. No. 11,289,917. 155 pages. Nov. 2, 2022.
U.S. Appl. No. 18/347,035, filed Jul. 5, 2023. Not yet publicly available.
U.S. Appl. No. 17/873,438, filed Jul. 26, 2022.
Patent Interference No. 106,140 (DK), declared Jun. 26, 2023. Solaredge Notice of Related Proceedings dated Jul. 10, 2023. 4 pages.
Crews, Ronald., AN-1820 LM5032 Interleaved Boost Converter, Application Report SNVA335A—May 2008 Revised May 2013. Texas Instruments. 13 pages.
U.S. Appl. No. 18/242,226, filed Sep. 5, 2023.
U.S. Appl. No. 17/706,194, filed Mar. 28, 2022. First Named Inventor: Ledenev. Examiner Initiated Interview Summary dated Jun. 16, 2023. 2 pages.
U.S. Appl. No. 17/706,194, filed Mar. 28, 2022. First Named Inventor: Ledenev. Notice of Allowance dated May 2, 2023. 8 pages.
U.S. Appl. No. 18/242,226, filed Sep. 5, 2023. Filing Receipt dated Sep. 14, 2023. 3 pages.
Patent Interference No. 106,140 (DK), declared Jun. 26, 2023. Ampt, LLC First Supplemental Notice of Related Proceedings dated Jul. 10, 2023. 3 pages.
Patent Interference No. 106,141 (DK), declared Oct. 23, 2023. Declaration of Interference dated Oct. 23, 2023. 10 pages.
Patent Interference No. 106,142 (DK), declared Oct. 23, 2023. Declaration of Interference dated Oct. 23, 2023. 10 pages.
Patent Interference No. 106,143 (DK), declared Oct. 23, 2023. Declaration of Interference dated Oct. 23, 2023. 11 pages.
Patent Interference No. 106,140 (DK), declared Jun. 26, 2023. Order—Show Cause dated Oct. 11, 2023. 3 pages.
U.S. Appl. No. 17/866,793, filed Jul. 18, 2022. Ex Parte Quayle Action dated Oct. 11, 2023. 6 pages.
Patent Interference No. 106,144 (DK), declared Oct. 23, 2023. Declaration of Interference dated Oct. 23, 2023. 10 pages.
Patent Interference No. 106,140 (DK), Judgment dated Nov. 17, 2023. 3 pages.
U.S. Appl. No. 17/902,650, filed Sep. 2, 2022. First named inventor: Ledenev. Notice of Allowance dated Oct. 20, 2023. 8 pages.
U.S. Appl. No. 17/706,194, filed Mar. 28, 2022. First named inventor: Ledenev. Corrected Notice of Allowability dated Oct. 17, 2023. 2 pages.
U.S. Appl. No. 17/321,329, filed May 14, 2021. First named inventor: Ledenev. Corrected Notice of Allowability dated Oct. 17, 2023. 2 pages.
Patent Interference No. 106,141 (DK), declared Oct. 23, 2023. Order—Show Cause dated Dec. 4, 2023. 3 pages.
Patent Interference No. 106,142 (DK), declared Oct. 23, 2023. Order—Show Case dated Dec. 4, 2023. 3 pages.
U.S. Appl. No. 18/531,499, filed Dec. 6, 2023. First named inventor: Porter.
U.S. Appl. No. 17/537,116, filed Nov. 29, 2021. Notice of Allowance dated Dec. 7, 2023. 5 pages.
Adverse Decisions in Interference, U.S. Pat. No. 9,397,497, Interference 106,139 (sic), dated Dec. 26, 2023. 1 page.
Patent Interference No. 106,143 (DK), declared Oct. 23, 2023. Termination dated Dec. 1, 2023. 3 pages.
U.S. Appl. No. 16/028,188, filed Jul. 5, 2018. First Named Inventor: Ledenev.
U.S. Appl. No. 15/164, 806, filed May 25, 2016. First Named Inventor: Ledenev. Corrected Notice of Allowability dated Jun. 25, 2018. 2 pages.
U.S. Appl. No. 15/213,193, filed Jul. 18, 2016. First Named Inventor: Ledenev. Notice of Allowance dated Jul. 6, 2018. 12 pages.
U.S. Appl. No. 15/262,916, filed Sep. 12, 2016. First Named Inventor: Porter. Office Action dated Jul. 27, 2018. 8 pages.
Chinese Patent Application No. 201380076592.9. English Translation of the 4th Notification of Office Action, dated Jul. 18, 2018. 2 pages.
U.S. Appl. No. 16/028,188, filed Jul. 5, 2018. First Named Inventor: Ledenev. Filing Receipt dated Aug. 8, 2012. 3 pages.
U.S. Appl. No. 15/793,704, filed Oct. 25, 2017. First Named Inventor: Porter. Office Action dated Sep. 17, 2018. 10 pages.
U.S. Appl. No. 15/094,803, filed Apr. 8, 2016. First Named Inventor: Porter. Restriction Requirement dated Sep. 10, 2018. 6 pages.
U.S. Appl. No. 16/028,188, filed Jul. 5, 2018. First Named Inventor: Ledenev. Updated Filing Receipt mailed Sep. 21, 2018. 3 pages.
European Patent Application No. 17150670.2. Office Action dated Sep. 10, 2018. 7 pages.
U.S. Appl. No. 15/213,193, filed Jul. 18, 2016. Corrected Notice of Allowability dated Oct. 5, 2018. 2 pages.
Canadian Patent Application No. 2942616, First Named Inventor: Ledenev. Requisition by the Examiner dated Sep. 21, 2018. 5 pages.

(56) References Cited

OTHER PUBLICATIONS

European Patent Application No. 08732274.9. Communcation/Office Action dated Nov. 13, 2018. 4 pages.
Japanese Patent Application No. 2016-160797. Penultimate office action dated Oct. 31, 2018. 3 pages.
Indian Patent Application No. 3419/KOLNP/2015, filed Oct. 14, 2015. Examination Report dated Dec. 28, 2018. 9 pages.
Chinese Patent Application No. 201380076592.9. Notice of Decision of Granting Patent Right for Invention dated Jan. 10, 2019.
U.S. Appl. No. 15/612,892, filed Jun. 2, 2017. First Named Inventor: Ledenev. Office Action dated Dec. 4, 2018. 17 pages.
U.S. Appl. No. 15/262,916, filed Sep. 12, 2016. Notice of Allowance dated Feb. 1, 2019. 8 pages.
U.S. Appl. No. 15/793,704, filed Oct. 25, 2017. First Named Inventor: Porter. Notice of Allowance dated Feb. 27, 2019.
U.S. Appl. No. 15/094,803, filed Apr. 8, 2016, first named inventor: Porter. Office Action dated May 2, 2019. 9 pages.
U.S. Appl. No. 15/679,745, filed Aug. 17, 2017. First Named Inventor: Ledenev. Office Action dated May 8, 2019. 23 pages.
Canadian Patent Application No. 2942616, First Named Inventor: Ledenev. Notice of Allowance dated Apr. 8, 2019. 1 page.
U.S. Appl. No. 15/262,916, filed Sep. 12, 2016. Corrected Notice of Allowability dated May 21, 2019. 2 pages.
European Patent Application No. 08796302.1, Office Action dated May 13, 2019. 3 pages.
European Patent Application No. 08732274.9. Communcation/Office Action dated May 22, 2019. 3 pages.
European Patent Application No. 17150670.2. Summons to Attend Oral Proceedings and Preliminary Opinion dated Apr. 8, 2019. 13 pages.
U.S. Appl. No. 16/439,430, filed Jun. 12, 2019. First Named Inventor: Porter.
U.S. Appl. No. 16/440,843, filed Jun. 13, 2019. First Named Inventor: Porter.
All pleadings, orders, exhibits, and any and all other documents in Interference No. 106,112, declared May 31, 2019. All documents available at the USPTO's Interference Portal.
European Patent Application No. 13877614, Communication/Office Action dated Nov. 7, 2019. 4 pages.
U.S. Appl. No. 16/439,430, filed Jun. 12, 2019. First Named Inventor: Porter. Filing Receipt dated Jun. 19, 2019. 4 pages.
U.S. Appl. No. 16/439,430, filed Jun. 12, 2019. First Named Inventor: Porter. Office Action dated Oct. 30, 2019. 39 Pages.
U.S. Appl. No. 16/440,843, filed Jun. 13, 2019. First Named Inventor: Porter. Filing Receipt dated Jun. 21, 2019. 4 pages.
Indian Patent Application No. 1568/NOLNP/2010. Official Communication from the Office dated Oct. 16, 2019. 4 pages.
European Patent Application No. 17150670.2, Communcation/Office Action dated Nov. 8, 2019. 4 pages.
European Patent Application No. 17150670.2, Communication re: Intention to Grant dated Dec. 5, 2019. 38 pages.
European Patent Application No. 08796302.1, Communication pursuant to Article 94(3) EPC, dated Dec. 4, 2019. 4 pages.
European Patent Application No. 13877614, Communication/Office Action dated Oct. 31, 2019. 3 pages.
Interference No. 106,054, declared Jun. 1, 2016. Judgment—Bd. R. 127(a) entered Dec. 31, 2019. 4 pages.
Interference No. 106,054, declared Jun. 1, 2016. Decision on Motions entered Dec. 31, 2019. 37 pages.
U.S. Appl. No. 15/679,745, filed Aug. 17, 2017, first named Inventor: Ledenev. Notice of Allowance dated Feb. 12, 2020.
European Patent Application No. 17209600.0, Communication pursuant to Article 94(3) EPC, dated Feb. 7, 2020. 5 pages.
U.S. Appl. No. 15/679,745, filed Aug. 17, 2017, first named Inventor: Ledenev. Issue Notification dated Feb. 12, 2020. 1 page.
U.S. Appl. No. 16/028,188, filed Jul. 5, 2018, first named inventor: Ledenev. Ex Parte Quayle Action dated Mar. 13, 2020. 6 pages.
Interference No. 106,112, declared May 31, 2019. Decision on Motions entered Mar. 25, 2020. 37 pages.
Interference No. 106,112, declared May 31, 2019. Judgment entered Mar. 25, 2020. 4 pages.
U.S. Appl. No. 16/439,430, filed Jun. 12, 2019. First Named Inventor: Porter. Office Action dated May 14, 2020.
U.S. Appl. No. 16/028,188, filed Jul. 5, 2018. First Named Inventor: Ledenev. Corrected Notice of Allowability dated Jun. 10, 2020. 2 pages.
U.S. Appl. No. 16/028,188, filed Jul. 5, 2018. First Named Inventor: Ledenev. Issue Notification dated Jun. 24, 2020. 1 page.
European Patent Application No. 17150670.2, Intent to Grant dated Jul. 30, 2020. 2 pages.
U.S. Appl. No. 18/742,700, filed Jun. 13, 2024, First Name Inventor: Anatoli Ledenev. Notice of Allowance dated Apr. 17, 2026, 11 pages.
U.S. Appl. No. 17/379,516, filed Jul. 19, 2021. Notice of Allowance mailed Feb. 4, 2022. 8 pages.
U.S. Appl. No. 17/379,516, filed Jul. 19, 2021. Issue Notification dated Mar. 29, 2022. 1 page.
U.S. Appl. No. 17/379,516, filed Jul. 19, 2021. Notice of Publication dated Mar. 10, 2022. 1 page.
European Patent No. 2973982, Communication regarding the expiry of the time limit within which notice of opposition may be filed, dated Mar. 14, 2022. 1 page.
U.S. Appl. No. 16/925,236, filed Jul. 9, 2020. Notice of Allowance dated Mar. 17, 2022. 8 pages.
U.S. Appl. No. 16/925,236, filed Jul. 9, 2020. Examiner Interview Summary Record dated Mar. 17, 2022. 1 page.
U.S. Appl. No. 17/537,116, filed Nov. 29, 2021. Notice of Publication of Application dated Mar. 24, 2022. 1 page.
U.S. Appl. No. 16/925,236, filed Jul. 9, 2020. Corrected Notice of Allowability dates Jul. 7, 2022.
U.S. Appl. No. 17/706,194, filed Mar. 28, 2022. First Named Inventor: Ledenev. Non Final Office Action dated May 2, 2022. 5 pages.
European Patent Application No. 17 209 600.0, Communication under Rule 71(3) EPC, dated Jun. 15, 2022. 52 pages.
U.S. Appl. No. 17/321,329, filed May 14, 2021. First Named Inventor: Ledenev. Non Final Office Action dated Aug. 10, 2022. 6 pages.
U.S. Appl. No. 17/866,793, filed Jul. 18, 2022. Filing Receipt dated Jul. 29, 2022. 4 pages.
U.S. Appl. No. 17/706,194, filed Mar. 28, 2022. First Named Inventor: Ledenev. Notice of Publication dated Jul. 14, 2022. 1 page.
U.S. Appl. No. 17/902,650, filed Sep. 2, 2022. Filing Receipt dated Oct. 3, 2022. 4 pages.
U.S. Appl. No. 17/902,650, filed Sep. 2, 2022. Updated Filing Receipt dated Oct. 18, 2022. 4 pages.
U.S. Appl. No. 17/902,650, filed Sep. 2, 2022. Updated Filing Receipt dated Dec. 9, 2022. 4 pages.
U.S. Appl. No. 17/902,650, filed Sep. 2, 2022. Updated Filing Receipt dated Dec. 28, 2022. 4 pages.
U.S. Appl. No. 17/902,650, filed Sep. 2, 2022. Non Final Office Action dated Jan. 27, 2023. 7 pages.
U.S. Appl. No. 17/706,194, filed Mar. 28, 2022. First Named Inventor: Ledenev. Non Final Office Action dated Nov. 15, 2022. 9 pages.
U.S. Appl. No. 17/321,239, filed May 14, 2021. First Named Inventor: Ledenev. Notice of Allowance dated Jan. 26, 2023. 8 pages.
European Patent Application No. 17209600.0, Commucation under Rule 71(3) EPC, dated Jan. 5, 2023. 52 pages.
U.S. Appl. No. 17/902,650, filed Sep. 2, 2022. Notice of Publication of Application dated Mar. 23, 2023. 1 page.
Adverse Decisions in Interference involving Patent No. 8004116, received Jan. 31, 2023. 1 page.
Adverse Decisions in Interference involving Patent No. 7843085, received Jan. 31, 2023. 1 page.
Patent Interference No. 106,140 (DK), declared Jun. 26, 2023. Declaration of Interference dated Jun. 26, 2023. 9 pages.
U.S. Appl. No. 15/653,049, filed Jul. 18, 2017.
U.S. Appl. No. 14/078,011, filed Nov. 12, 2013.
U.S. Appl. No. 15/139,745, filed Apr. 27, 2016.

(56) References Cited

OTHER PUBLICATIONS

U.S. Appl. No. 12/911,153, filed Oct. 25, 2010.
Patent Interference No. 106,140 (DK), declared Jun. 26, 2023. Ampt Annotated Claims dated Jul. 24, 2023. 14 pages.
Patent Interference No. 106,140 (DK), declared Jun. 26, 2023. Solaredge Annotated Claims dated Jul. 25, 2023. 15 pages.
U.S. Appl. No. 17/321,329, filed May 14, 2021. First named inventor: Ledenev. Notice of Allowance dated May 15, 2023. 8 pages.
European Patent Application No. 17209600.0, Decision to Grant a European Patent pursuant to Article 97(1) EPC dated May 11, 2023. 3 pages.
European Patent Application No. 17209600.0, Transmission of the Certificate for a European patent pursuant to Rule 74 EPC dated Jun. 20, 2023. 2 pages.
U.S. Appl. No. 17/902,650, filed Sep. 2, 2022. First named inventor: Ledenev. Office Action dated Jun. 2, 2023. 8 pages.
United States International Trade Commission, Investigation No. 337-TA-1327. Respondent Solaredge Technologies, Inc. and Solaredge Technologies, Ltd.'s Initial Invalidity Contentions. Nov. 2, 2022. 86 pages.
United States International Trade Commission, Investigation No. 337-TA-1327. Respondent Solaredge Technologies, Inc. and Solaredge Technologies, Ltd.'s Final Invalidity Contentions. Jan. 9, 2023. 103 pages.
United States International Trade Commission, Investigation No. 337-TA-1327. Complainant Ampt, LLC's Final Rebuttal Contentions. Jan. 23, 2023. 145 pages.
United States International Trade Commission, Investigation No. 337-TA-1327. Exhibit 630/917-A—Dynamic Drinkware Analysis for U.S. Pat. No. 9088178. 237 pages. Nov. 2, 2022.
United States International Trade Commission, Investigation No. 337-TA-1327. Exhibit 630/917-B—Dynamic Drinkware Analysis for US Publication No. 2009/0160259 to Naiknaware. 83 pages. Nov. 2, 2022.
United States International Trade Commission, Investigation No. 337-TA-1327. Exhibit 630/917-C—Dynamic Drinkware Analysis for US Publication No. 2009/0078300 to Ang et al. 36 pages. Nov. 2, 2022.
United States International Trade Commission, Investigation No. 337-TA-1327. Exhibit 630/917-D—Dynamic Drinkware Analysis for U.S. Pat. No. 8,773,092 to Fishelov. 4 pages. Nov. 2, 2022.
United States International Trade Commission, Investigation No. 337-TA-1327. Exhibit 630-A—Count from Interference No. 106,112. 25 pages. Nov. 2, 2022.
United States International Trade Commission, Investigation No. 337-TA-1327. Exhibit 630-B—Adest: 35 USC 102 & 103 Invalidity Chart for U.S. Pat. No. 9,673,630. 78 pages. Nov. 2, 2022.
United States International Trade Commission, Investigation No. 337-TA-1327. Exhibit 630-C—Klein 35 USC 102 & 103 Invalidity Chart for U.S. Pat. No. 9,673,630. 41 pages. Nov. 2, 2022.
United States International Trade Commission, Investigation No. 337-TA-1327. Exhibit 630-D—Caldwell 35 USC 102 & 103 Invalidity Chart for U.S. Pat. No. 9,673,630. 39 pages. Nov. 2, 2022.
United States International Trade Commission, Investigation No. 337-TA-1327. Exhibit 630-E—Naiknaware 35 USC 102 & 103 Invalidity Chart for U.S. Pat. No. 9,673,630. 54 pages. Nov. 2, 2022.
United States International Trade Commission, Investigation No. 337-TA-1327. Exhibit 630-F—Ang 35 USC 102 & 103 Invalidity Chart for U.S. Pat. No. 9,673,630. 67 pages. Nov. 2, 2022.
United States International Trade Commission, Investigation No. 337-TA-1327. Exhibit 630-G 35 USC 103 Invalidity Chart for U.S. Pat. No. 9,673,630. 229 pages. Nov. 2, 2022.
United States International Trade Commission, Investigation No. 337-TA-1327. Exhibit 917-A: Invalidity of U.S. Pat. No. 11,289,917 based on Count from Interference No. 106,112. 19 pages. Nov. 2, 2022.
U.S. Appl. No. 17/537,116, Corrected Notice of Allowability dated Jan. 24, 2024, 2 pages.
European Patent Application No. 08796302.1, Summons to Attend Oral Proceedings dated Jun. 1, 2023, 6 pages.
European Patent Application No. 08796302.1, Cancellation of Oral Proceedings dated Nov. 24, 2023, 1 page.
US Patent Interference No. 106,143 involving U.S. Pat. No. 7,919,953, Termination dated Dec. 1, 2023, 3 pages.
U.S. Appl. No. 18/531,499, Filing Receipt dated Dec. 13, 2023, 3 pages.
India Patent App. No. 3419/KOLNP/2015, Hearing Adjournment Notice dated Dec. 19, 2023, 2 pages.
India Patent App. No. 3419/KOLNP/2015, Hearing Adjournment Notice dated Jan. 15, 2024, 3 pages.
India Patent App. No. 3419/KOLNP/2015, Hearing Adjournment Notice dated Feb. 5, 2024, 3 pages.
US Patent Interference No. 106,142 involving U.S. Pat. No. 9,466,737, Judgment dated Jan. 25, 2024, 3 pages.
US Patent Interference No. 106,141 involving U.S. Pat. No. 10,326,282, Judgment dated Jan. 25, 2024, 3 pages.
U.S. Appl. No. 17/321,329, Issue Notification dated Feb. 7, 2024, 2 pages.
U.S. Appl. No. 17/706,194, Issue Notification dated Feb. 7, 2024, 2 pages.
European Patent Application No. 08796302.1, Intention to Grant, dated Jan. 12, 2024, 65 pages.
U.S. Appl. No. 17/321,329, Decision on Petition dated Feb. 15, 2024, 1 page.
U.S. Appl. No. 18/242,226, Notice of Allowance dated Feb. 23, 2024, 8 pages.
U.S. Appl. No. 17/706,194, Decision on Petition dated Feb. 21, 2024, 1 page.
U.S. Appl. No. 17/902,650, Notice of Allowance dated Feb. 22, 2024, 8 pages.
U.S. Appl. No. 17/866,793, Notice of Allowance dated Feb. 22, 2024, 8 pages.
U.S. Appl. No. 17/537,116, Notice of Allowance dated Feb. 28, 2024, 5 pages.
U.S. Appl. No. 17/866,793, Notice of Allowance dated Mar. 6, 2024, 8 pages.
U.S. Appl. No. 17/321,329, Notice of Allowance dated Mar. 21, 2024, 7 pages.
U.S. Appl. No. 17/706,194, Notice of Allowance dated Apr. 1, 2024, 8 pages.
U.S. Appl. No. 18/242,226, Issue Notification dated Apr. 23, 2024, 2 pages.
U.S. Appl. No. 17/902,650, Corrected Notice of Allowance dated May 6, 2024, 2 pages.
U.S. Appl. No. 17/902,650, Issue Notification dated May 15, 2024, 2 pages.
U.S. Appl. No. 17/706,194, Corrected Notice of Allowance dated May 22, 2024, 2 pages.
U.S. Appl. No. 13/503,011, Adverse Decisions in Interference dated May 28, 2024, 1 page.
U.S. Appl. No. 15/262,916, Adverse Decisions in Interference dated May 28, 2024, 1 page.
U.S. Appl. No. 17/537,116, Corrected Notice of Allowance dated May 30, 2024, 2 pages.
European Patent Application No. 08796302.1, Decision to grant a European patent, dated May 24, 2024, 3 pages.
U.S. Appl. No. 17/866,793, Corrected Notice of Allowance dated Jun. 10, 2024, 2 pages.
U.S. Appl. No. 17/706,194, Issue Notification dated Jun. 12, 2024, 2 pages.
U.S. Appl. No. 17/537,116, Issue Notification dated Jun. 12, 2024, 2 pages.
U.S. Appl. No. 17/321,329, Corrected Notice of Allowance dated Jun. 20, 2024, 2 pages.
U.S. Appl. No. 17/866,793, Issue Notification dated Jun. 20, 2024, 2 pages.
U.S. Appl. No. 18/742,700, filed Jun. 13, 2024, First Name Inventor: Anatoli Ledenev.
U.S. Appl. No. 18/742,680, filed Jun. 13, 2024, First Name Inventor: Anatoli Ledenev.

(56) References Cited

OTHER PUBLICATIONS

U.S. Appl. No. 17/321,329, Issue Notification dated Jul. 17, 2024, 2 pages.
Transmission of the certificate for a European patent with unitary effect dated Jun. 27, 2024, 1 page.
U.S. Appl. No. 18/742,680, filed Jun. 13, 2024, First Name Inventor: Anatoli Ledenev. Notice of Allowance dated Sep. 10, 2025, 8 pages.
U.S. Appl. No. 18/742,700, filed Jun. 13, 2024, First Name Inventor: Anatoli Ledenev. Office Action dated Sep. 29, 2025, 7 pages.
Jung, et al. DC-Link Ripple Reduction of Series-connected Module Integrated Converter for Photovoltaic Systems. International Conference of Power Electronics—ECCE Asia May 30-Jun. 2, 2011. 4 pages.
U.S. Appl. No. 13/503,011, filed Apr. 19, 2012. First Named Inventor: Anatoli Ledenev. Notice of Allowance dated Jun. 29, 2016; 15 pages.
U.S. Appl. No. 13/934,102, filed Jul. 2, 2013. First Named Inventor: Anatoli Ledenev. Notice of Allowance dated Jun. 30, 2016.; 11 pages.
U.S. Appl. No. 13/254,666, filed Sep. 2, 2011. First Named Inventor: Robert M. Porter. Notice of Allowance dated Jul. 14, 2016; 11 pages.
U.S. Appl. No. 15/181,174, filed Jun. 13, 2016. First Named Inventor: Anatoli Ledenev.
U.S. Appl. No. 15/094,803, filed Apr. 8, 2016. First Named Inventor: Robert M. Porter.
U.S. Appl. No. 15/164,806, filed May 25, 2016. First Named Inventor: Anatoli Ledenev.
Japanese Application No. 2004-046358, published Sep. 2, 2005. Filed Feb. 23, 2004. First Named Inventor: Yoshitake Akira. Abstract only. 1 page.
Japanese Application No. 06-318447, filed Dec. 21, 1994. First Named Inventor: Tanaka Kunio. Abstract only. 1 page.
European Application No. 0677749A3, filed Apr. 13, 1995. First Named Inventor: Takehara. Abstract only, 2 pages.
U.S. Appl. No. 13/254,666, filed Sep. 2, 2011. First Named Inventor: Robert M. Porter.
International Patent Application Publication No. 2009/007782A4, published Jan. 15, 2009. Applicant: SolarEdge Ltd. Abstract and Claims only. 5 pages.
International Patent Application Publication No. 2009/072075A3, published Jun. 11, 2009. Applicant: SolarEdge Ltd. Abstract and Search Report. 4 pages.
European Patent Application No. EP0964457A3, published May 24, 2006. Applicant: Canon Kabushiki Kaisha. Abstract and Search Report. 4 pages.
European Patent Application No. EP0978884A3, published Mar. 22, 2000. Applicant: Canon Kabushiki Kaisha. Abstract and Search Report. 4 pages.
European Patent Application No. EP1120895A3, published May 6, 2004. Applicant: Murata Manufacturing Co., Ltd. Abstract and Search Report. 3 pages.
Japanese Patent No. 05003678A, published Jan. 8, 1993. Applicant: Toshiba F EE Syst KK, et al. Abstract only. 1 page.
Japanese Patent No. 6035555A, published Feb. 10, 1994. Applicant: Japan Storage Battery Co. Ltd. Abstract only. 1 page.
Japanese Patent No. 06141261A, published May 20, 1994. Applicant: Olympus Optical Co. Ltd. Abstract only. 1 page.
Japanese Patent No. 7026849A, published Jan. 27, 1995. Applicant: Sekisui House Ltd. Abstract only. 1 page.
Japanese Patent No. 07222436A, published Aug. 18, 1995. Applicant: Meidensha Corp. Abstract only. 1 page.
Japanese Patent No. 08033347A, published Feb. 2, 1996. Applicant: Hitachi Ltd et al. Abstract only. 1 page.
Japanese Patent No. 08066050A, published Mar. 8, 1996. Applicant: Hitachi Ltd. Abstract only. 1 page.
Japanese Patent No. 08181343A, published Jul. 12, 1996. Applicant: Sharp Corp. Abstract only. 1 page.
Japanese Patent No. 8204220A, published Aug. 9, 1996. Applicant: Mistubishi Electric Corp. Abstract only. 1 page.
Japanese Patent No. 09097918A, published Apr. 8, 1997. Applicant: Canon Inc. Abstract only. 1 page.
Japanese Patent No. 056042365A, published Apr. 20, 1981. Applicant: Seiko Epson Corp. Abstract only. 1 page.
Japanese Patent No. 60027964A, published Feb. 13, 1985. Applicant: NEC Corp. Abstract only. 1 page.
Japanese Patent No. 60148172A, published Aug. 5, 1985. Applicant: Seikosha Co. Ltd. Abstract only. 1 page.
Japanese Patent No. 62154121A, published Jul. 9, 1987. Applicant: Kyocera Corp. Abstract only. 1 page.
Japanese Patent No. 2000020150A, published Jan. 21, 2000. Applicant: Toshiba Fa Syst Eng Corp et al. Abstract only. 1 page.
Japanese Patent No. 2002231578A, published Aug. 16, 2002. Applicant: Meidensha Corp. Abstract only. 1 page.
Japanese Patent No. 07058843A, published Mar. 3, 1995. Applicant: Matsushita Electric Ind. Co. Ltd. Abstract only. 1 page.
Japanese Patent Application No. 2007104872A, published Apr. 19, 2007. Applicant: Ebara Densan Ltd. Abstract only. 1 page.
Japanese Patent Application No. 2007225625A, filed Sep. 6, 2007. Applicant: Ahei Toyoji et al. Abstract only. 1 page.
Japanese Patent Application No. 2001086765A, filed Mar. 30, 2001. Applicant: Powerware Corp. Abstract only. A page.
Korean Patent Application No. 102005-7008700, filed May 13, 2005. Applicant: Exar Corporation. Abstract only. 2 pages.
Korean Patent Application No. 102004-0099601, filed Dec. 1, 2004. Applicant: Lee, Seong Ryong. Abstract only. 2 pages.
Korean Patent Application No. 102007-0036528, filed Apr. 13, 2007. Applicant: Industry-Academic Coop Foundation of Kyungnam Univ. Abstract only. 2 pages.
International Application Publication No. WO2006/013600A3, published Feb. 9, 2006. Applicant: Universita Degli Studi DiRoma "La Sapienza". Abstract and Search Report. 5 pages.
International Application Publication No. 2006/048689A3, published May 11, 2006. Applicant: Enecsys Ltd. Abstract and Search Report. 7 pages.
International Application Publication No. 2009/140551A3, published Nov. 19, 2009. Applicant: National Semiconductor Corp. Abstract and Search Report. 3 pages.
International Application Publication No. 2009/140543A3, published Nov. 19, 2009. Applicant: National Semiconductor Corp. Abstract and Search Report. 4 pages.
International Application Publication No. 2009/140536A3, published Nov. 19, 2009. Applicant: National Semiconductor Corp. Abstract and Search Report. 4 pages.
Japanese Patent No. 09148613A, filed Jun. 6, 1997. Applicant: Sanyo Electric Co Ltd. Abstract only. 1 page.
International Application Publication No. 2010/062662A3, published Jun. 3, 2010. Applicant: Tigo Energy, Inc. Abstract and Search Report. 4 pages.
International Application Publication No. 2009/114341A3, published Sep. 17, 2009. Applicant: Tigo Energy, Inc. Abstract and Search Report. 3 pages.
International Application Publication No. 2009/075985A3, published Jun. 18, 2009. Applicant: Tigo Energy, Inc. Abstract and Search Report. 4 pages.
International Application Publication No. 2009/064683A3, published May 22, 2009. Applicant: Tigo Energy, Inc. Abstract and Search Report. 3 pages.
International Application Publication No. 2009/059028A3, published May 7, 2009. Applicant: Tigo Energy, Inc. Abstract and Search Report. 3 pages.
U.S. Appl. No. 19/446,810, filed Jan. 12, 2026. First Named Inventor: Ledenev.
International Application No. PCT/US25/44335, filed Aug. 29, 2025. First Named Inventor: Anatoli Ledenev.
International Application No. PCT/US25/44335, filed Aug. 29, 2025. First Named Inventor: Anatoli Ledenev. International Search Report dated Oct. 22, 2025, 3 pages.
International Application No. PCT/US25/44335, filed Aug. 29, 2025. First Named Inventor: Anatoli Ledenev. Written Opinion of Interantional Search Authority dated Oct. 22, 2026, 23 pages.

(56) References Cited

OTHER PUBLICATIONS

Indian Patent Application No. 11202238030773. First Examination Report dated Jan. 30, 2026. 10 pages.
Solar Sentry Corp., Protecting Solar Investment "Solar Sentry's Competitive Advantage", 4 pages estimated as Oct. 2008.
Anon Source; International Symposium on Signals, Circuits and Systems, Jul. 12-13, 2007; Iasi, Romania; Publisher: Institute of Electrical and Electroncis Engineers Computer Society; Abstract. 1 page.
Bascope, G.V.T.; Barbi, I; "Generation of a Family of Non-isolated DC-DC PWM Converters Using New Three-state Switching Cells;" 2000 IEEE 31st Annual Power Electronics Specialists Conference in Galway, Ireland; vol. 2, Abstract. 1 page.
Bower, et al. "Innovative PV Micro-Inverter Topology Eliminates Electrolytic Capacitors for Longer Lifetime," 1-4244-0016-3-06 IEEE p. 2038 (2006); 4 pages.
Cambridge Consultants, Interface Issue 43, Autumn 2007; 21 pages.
Case, M.J.; "Minimum Component Photovoltaic Array Maximum Power Point Tracker," Vector (Electrical Engineering), Jun. 1999; Abstract. 1 page.
Tse, K.K. et al. "A Novel Maximum Power Point Tracking Technique for PV Panels;" Dept. of Electronic Engineering, City University of Hong Kong; Source: PESC Record—IEEE Annual Power Electronics Specialists Conference, v 4, 2001, p. 1970-1975, Jun. 17-21, 2001; Abstract. 1 page.
Cuadras, A; Ben Amor, N; Kanoun, O; "Smart Interfaces for Low Power Energy Harvesting Systems," 2008 IEEE Instrumentation and Measurement Technology Conference May 12-15, 2008 in Victoria, BC Canada; Abstract. 1 page.
Dallas Semiconductor; Battery I.D. chip from Dallas Semiconductor monitors and reports battery pack temperature, Bnet World Network, Jul. 10, 1995; 1 page.
De Doncker, R. W.; "Power Converter for PV-Systems," Institute for Power Electrical Drives, RWTH Aachen Univ. Feb. 6, 2006; 18 pages.
De Haan, S.W.H., et al; Test results of a 130W Ac module, a modular solar AC power station, Photovoltaic Energy Conversion, 1994; Conference Record of the 24th IEEE Photovoltaic Specialists Conference Dec. 5-9, 1994; 1994 IEEE First World Conference. Abstract, 1 page.
Dehbonei, Hooman; Corp author(s): Curtin University of Technology, School of Electrical and Computer Engineering; 2003; Description: xxi, 284 leaves; ill.; 31 cm. Dissertation: Thesis. Abstract; 1 page.
Jung, D; Soft Switching Boost Converter for Photovoltaic Power Generation System, 2008 13th International Power Electronics and Motion Control Conference (EPE-PEMC 2008); 5 pages.
Duan, Rouo-Yong; Chang, Chao-Tsung; "A Novel High-efficiency Inverter for StAMPT-alone and Grid-connected Systems," 2008 3rd IEEE Conference on Industrial Electronics and Applications in Singapore, Jun. 3-5, 2008; Article No. 4582577. Abstract. 3 pages.
Duncan, Joseph, A Global Maximum Power Point Tracking DC-DC Converter, Massachussetts Institute of Technology, Dept. of Electrical Engineering and Computer Science Dissertation; Jan. 20, 2005; 80 pages.
Edelmoser, K. H. et al.; High Efficiency DC-to-AC Power Inverter with Special DC Interface; Professional Paper, ISSN 0005-1144, Automatika 46 (2005) 3-4, 143-148 6 pages.
Enrique, J.M.; Duran, E; Sidrach-de-Cadona, M; Andujar, JM; "Theoretical Assessment of the Maximum Power Point Tracking Efficiency of Photovoltaic Facilities with Different Converter Topologies;" Source: Solar Energy 81, No. 1 (2007); 31 (8 pages).
Enslin, J.H.R.; "Integrated Photovoltaic Maximum Power Point Tracking Converter;" Industrial Electronics, IEEE Transactions on vol. 44, Issue 6, Dec. 1997, pp. 769-773.
Ertl, H; Kolar, J.W.; Zach, F.C.; "A Novel Multicell DC-AC Converter for Applications in Renewable Energy Systems;" IEEE Transactions on Industrial Electronics, Oct. 2002; vol. 49, Issue 5, Abstract. 1 page.
Esmaili, Gholamreza; Application of Advanced Power Electronics in Renewable Energy Sources and Hygrid Generating Systems, Ohio State University, Graduate Program in Electrical and Computer Engineering, 2006, Dissertation. 169 pages.
Gomez, M; "Consulting in the solar power age," IEEE-CNSV: Consultants' Network of Silicon Valley, Nov. 13, 2007; 30 pages.
Guo, G.Z.; "Design of a 400W, 1 Omega, Buck-boost Inverter for PV Applications," 32nd Annual Canadian Solar Energy Conference, Jun. 10, 2007; 18 pages.
Hashimoto et al.; "A Novel High Performance Utility Interactive Photovoltaic Inverter System," Department of Electrical Engineering, Tokyo Metropolitan University, 1-1 Miinami-Osawa, Hachioji, Tokyo, 192-0397, Japan; pp. 2255-2260, © 2000.
Ho, Billy M.T.; "An Integrated Inverter with Maximum Power Tracking for Grid-Connected PV Systems;" Department of Electronic Engineering, City University of Hong Kong; Conference Proceedings, 19th Annual IEEE Applied Power Electronics Conference and Exposition, Feb. 22-26, 2004; p. 1559-1565.
http://www.solarsentry.com; Protecting Your Solar Investment, 2005, Solar Sentry Corp. 1 page.
Hua, C et al; "Control of DC-DC Converters for Solar energy System with Maximum Power Tracking," Department of Electrical Engineering; National Yumin University of Science & Technology, Taiwan; vol. 2, Nov. 9-14, 1997; pp. 827-832.
International Application filed Apr. 15, 2008, Serial No. PCT/US08/60345; First Named Inventor: Porter. 87 pages.
International Application filed Jul. 18, 2008, Serial No. PCT/US08/70506; First Named Inventor: Schatz. 137 pages.
International Application filed Mar. 14, 2008, Serial No. PCT/US08/57105; 90 pages.
International Application filed Oct. 10, 2008, Serial No. PCT/US08/79605; 46 pages.
International Application No. PCT/US08/57105, International Search Report dated Jun. 25, 2008; 5 pages.
International Application No. PCT/US08/57105, Written Opinion dated Jun. 25, 2008; 42 pages.
International Application No. PCT/US08/60345, International Search Report dated Aug. 18, 2008; 1 page.
International Application No. PCT/US08/60345, Written Opinion dated Aug. 18, 2008; 10 pages.
International Application No. PCT/US08/70506, International Search Report dated Sep. 26, 2008; 4 pages.
International Application No. PCT/US08/70506, Written Opinion dated Sep. 26, 2008; 7 pages.
Joo, Hyuk Lee; "Soft Switching Multi-Phase Boost Converter for Photovoltaic System," Power Electronics and Motion Control Conference, 2008. EPE-PEMC 2008. 13th Sep. 1, 2008. Abstract only. 1 page.
Kaiwei, Yao, Mao, Ye; Ming, Xu; Lee, F.C.; "Tapped-inductor Buck Converter for High-step-down DC-DC Conversion," IEEE Transactions on Power Electronics, vol. 20, Issue 4, Jul. 2005; Abstract. 1 page.
Kang, F et al; Photovoltaic Power Interface Circuit Incorporated with a Buck-boost Converter and a Full-bridge Inverter; doi:10.1016-j.apenergy.2004.10.009 2 pages.
Kern, G; "SunSine (TM)300: Manufacture of an AC Photovoltaic Module," Final Report, Phases I & II, Jul. 25, 1995-Jun. 30, 1998; National Renewable Energy Laboratory, Mar. 1999; NREL-SR-520-26085; 33 pages.
Kretschmar, K et al; "An AC Converter with a Small DC Link Capacitor for a 15kW Permanent Magnet Synchronous Integral Motor, Power Electronics and Variable Speed Drive," 1998;7th International Conference; Conf. Publ. No. 456; Sep. 21-23, 1998; 4 pages.
Kroposki, H. Thomas and Witt, B & C; "Progress in Photovoltaic Components and Systems," National Renewable Energy Laboratory, May 1, 2000; NREL-CP-520-27460; 7 pages.
Kuo, J.-L.; "Duty-based Control of Maximum Power Point Regulation for Power Converter in Solar Fan System with Battery Storage," Proceedings of the Third IASTED Asian Conference, Apr. 2, 2007, Phuket, Thialand. pp 163-168.

(56) References Cited

OTHER PUBLICATIONS

Lim, Y.H. et al; "Simple Maximum Power Point Tracker for Photovoltaic Arrays," Electronics Letters May 25, 2000; vol. 36, No. 11. 2 pages.
Linear Technology Specification Sheet, LTM4607, estimated as Nov. 14, 2007; 24 pages.
Matsuo, H et al; Novel Solar Cell Power Supply System using the Multiple-input DC-DC Converter; Telecommunications Energy Conference, 1998; INTELEC, 20th International, pp. 797-802.
Mutoh, Nobuyoshi, "A Controlling Method for Charging Photovoltaic Generation Power Obtained by a MPPT Control Method to Series Connected Ultra-electric Double Layer Capacitors;" Intelligent Systems Department, Faculty of Engineering, Graduate School of Tokyo; 39th IAS Annual Meeting (IEEE Industry Applications Society); v 4, 2004, Abstract. 1 page.
Mutoh, Nobuyoshi; A Photovoltaic Generation System Acquiring Efficiently the Electrical Energy Generated with Solar Rays,; Graduate School of Tokyo, Metropolitan Institute of Technology; Source: Series on Energy and Power Systems, Proceedings of the Fourth IASTED International Conference on Power and Energy Systems, Jun. 28-30, 2004; Abstract. 1 page.
Nishida, Yasuyuki, "A Novel Type of Utility-interactive Inverter for Photovoltaic System," Conference Proceedings, IPEMC 2004; 4th International Power and Electronics Conference, Aug. 14-16, 2004; Xian Jiaotong University Press, Xian, China; Abstract. 1 page.
Oldenkamp, H. et al; AC Modules: Past, Present and Future, Workshop Installing the Solar Solution; Jan. 22-23, 1998; Hatfield, UK; 6 pages.
U.S. Appl. No. 19/446,810, filed Jan. 12, 2026. First Named Inventor: Ledenev. Non-final Office Action dated May 20, 2026, 15 pages.

SERIES-PARALLEL ALTERABLE MULTIPHASE SOLAR ENERGY POWER SYSTEM

This application is a continuation application of, and claims priority to, U.S. patent application Ser. No. 18/742,680, filed Jun. 13, 2024; which is a continuation of, U.S. patent application Ser. No. 17/321,329, filed May 14, 2021 and issued as U.S. Pat. No. 12,057,514 on Aug. 6, 2024; which is a continuation application of, and claims priority to, U.S. patent application Ser. No. 16/172,524, filed Oct. 26, 2018, and issued as U.S. Pat. No. 11,121,556 on Sep. 14, 2021; which is continuation application of, and claims priority to, U.S. patent application Ser. No. 15/213,193, filed Jul. 18, 2016, and issued as U.S. Pat. No. 10,116,140 on Oct. 30, 2018; which is a continuation application of U.S. patent application Ser. No. 14/550,574, filed Nov. 21, 2014, and issued as U.S. Pat. No. 9,397,497 on Jul. 19, 2016; which itself is a Continuation of International Application No. PCT/US2013/032410, filed Mar. 15, 2013, to which priority is also claimed. All aforementioned applications are hereby incorporated by reference herein in their entirety. Applicant also incorporates by reference in its entirety U.S. patent application Ser. No. 18/242,226, filed Sep. 5, 2023, and issued as U.S. Pat. No. 11,967,653 on Apr. 23, 2024; which is also a continuation application of, and claims priority to, U.S. patent application Ser. No. 17/321,329.

TECHNICAL FIELD

The present invention focuses on the field of providing solar power including but not limited to residential and commercial power systems and arrays. In particular it relates to processes, devices, and circuitry that can provide such power in a more efficient manner. It also can find application in general power systems that have some of the more fundamental attributes of solar power sources with the same effects.

BACKGROUND

The value of solar power for society has been known for many years. It offers clean energy but requires harnessing the energy and feeding it into electrical grid or other load. Efficiency in generation is of particular interest. One aspect that has proven particularly challenging is the ability to harvest the energy efficiently across the entire power spectrum desired. Because the influx of solar energy can vary and because the photovoltaic effect itself can vary, electrical challenges exist that to some degree remain. In addition to the technical issues, regulatory limits such as desirable for safety and the like can also pose challenges. In addition, the combination of photovoltaic sources such as in the strings of panels or the like combines to make efficient harvesting of the energy an issue. As an example, an interesting fact that is frequently under the current technology the most efficient generation of power (likely at the highest voltage after conversion) is a situation where no substantial power is delivered. This seeming paradox is an issue that remains challenging for those in the field. Similarly the desire to generate more and more power such as through larger strings of panels has become an issue due to regulatory limits and the like.

The present invention provides circuits and methods through which many of these challenges can be reduced or even eliminated. It provides designs with unusual efficiency in power generation and provides considerable value to those desiring to utilize solar or other power sources efficiently.

DISCLOSURE OF INVENTION

Accordingly, the present invention includes a variety of aspects, circuits, and processes in varied embodiments which may be selected in different combinations to suit differing needs and achieve various goals. It discloses devices and methods to achieve unusually high efficiency solar and other power delivery in a way that is more beneficial to a variety of loads. The embodiments present some initial ways to achieve high efficiency power delivery or generation and show the general understandings which may be adapted and altered to achieve the following and other goals. Of course, further developments and enhancements may be possible within keeping of the teachings of the present invention.

As stated, one of the basic goals of embodiments of the invention is to provide highly efficient solar and other power generation. It can provide efficient power converters and other circuitry which can achieve this goal in multiple ways.

Another goal of embodiments of the invention is to be able to provide enhanced strings of power sources such as may be found in a power array or other solar installation or the like. Yet another goal of embodiments of the invention is to provide better operational efficiency over all power generation regimes. In keeping with this goal, another aspect is to provide higher operational voltage that can be closer to, but not exceeding, the regulatory or other limit across all power generation situations.

Still another goal of embodiments of the invention is to provide lower inductance, low capacitance, and lower energy storage both at the input and output levels. A similar goal is to provide lesser ripple in outputs for electrical circuitry operating on solar and other power sources.

Naturally other goals of the invention are presented throughout the specifications and claims.

MODE(S) FOR CARRYING OUT THE INVENTION

As mentioned earlier, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional variations. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

Figure 1:
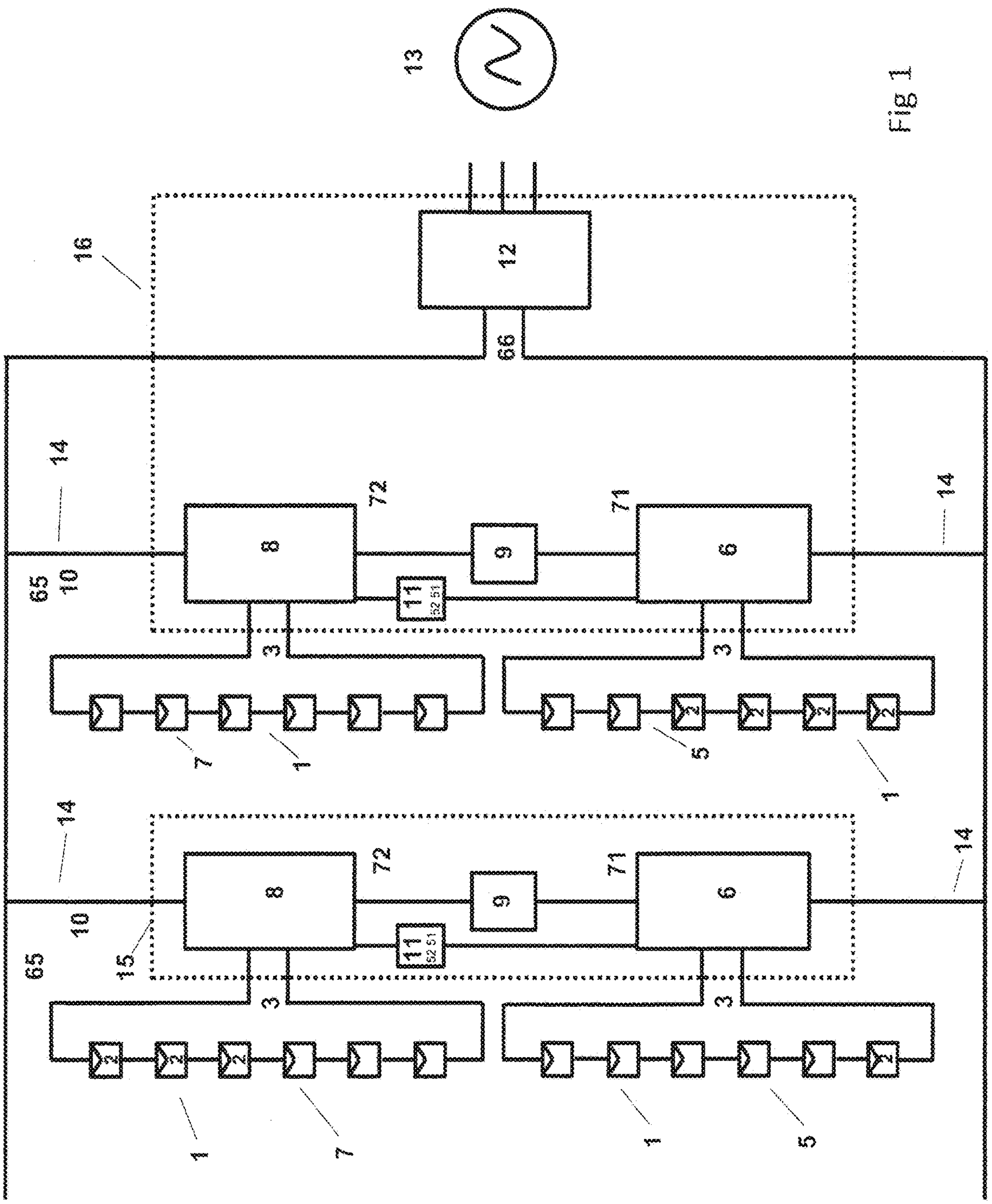
FIG. 1 is a schematic of circuitry as configured for a phased interleave embodiment of the present invention.
Figure 6:
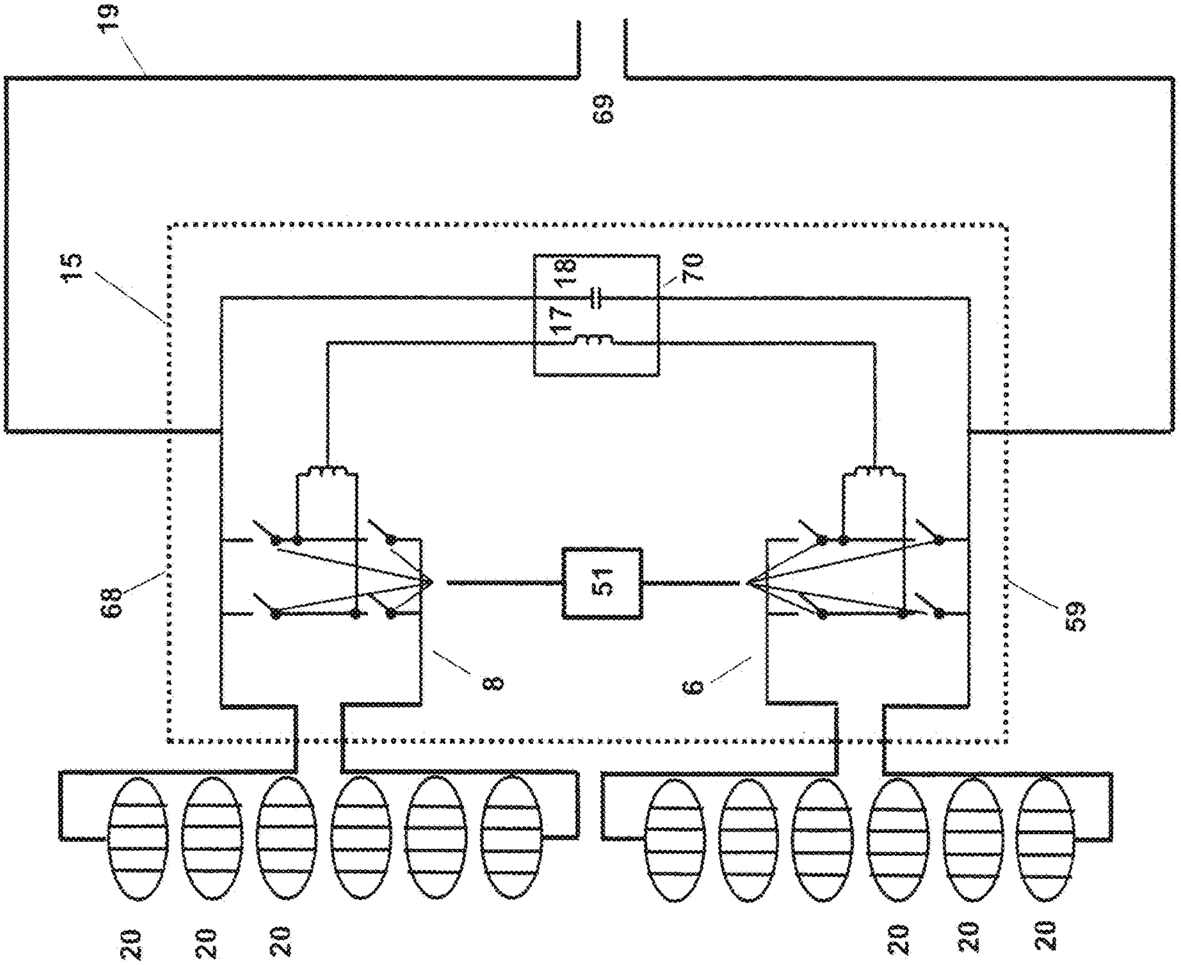
FIG. 6 is a schematic of circuitry as configured for one interpanel configuration embodiment of the present invention.

As shown in FIG. 1, solar power generation can involve accepting one more sources of power (1) such as may be generated by one or more individual photovoltaic sources (2). As is well known, the photovoltaic source can be a solar panel (19) (as shown in FIG. 6) or even individual solar cells (20) (also as shown in FIG. 6). In FIG. 1, the sources (2) can be aggregated to create one conceptual photovoltaic source of power (1). The individual output (3) from one of the photovoltaic sources (2) may be a DC power output. This DC power output (3) can be converted into a modified version of DC power. This may, but need not occur at the module level, such as by a module or other type of converter which is not shown but which could, but need not exist for each panel (19) or each photovoltaic source (2). Such a converter may be configured to operate on or with individual panels or modules and can control power harvesting to achieve individual maximum power point operation as is known.

As mentioned, in an embodiment of the present invention such as shown in FIG. 1, the output of a collection of solar panels or more generally sources (2) can be aggregated to create one conceptual photovoltaic source of power (1). This, perhaps aggregated, source of power, also a DC power output, and here considered a first photovoltaic source of power (5), may be further handled or converted by a DC-DC photovoltaic converter, perhaps here shown as a base phase DC-DC photovoltaic converter (6) to provide a base phase switched output (71).

Similarly, another aggregated source of power, here considered a second photovoltaic source of power (7), may also be converted by a DC-DC photovoltaic converter, here shown as an altered phase DC-DC photovoltaic converter (8) to provide an altered phase switched output (72). Both the base phase DC-DC photovoltaic converter (6) and the altered phase DC-DC photovoltaic converter (8) can have their outputs combined through combiner circuitry (9), to provide a conversion combined photovoltaic DC output (10). In addition, both the base phase DC-DC photovoltaic converter (6) and the altered phase DC-DC photovoltaic converter (8) can be similarly controlled, such as through a synchronous phase control (11) that synchronously operates switches or the like in the two converters so their operations are switch timing responsive in sync with each other, whether opposing or otherwise. Both the base phase DC-DC photovoltaic converter (6) and the altered phase DC-DC photovoltaic converter (8) can be considered combined as together presenting a low photovoltaic energy storage DC-DC photovoltaic converter (15) which can act on two sources or power (1) and can provide a low photovoltaic energy storage DC output (65). These outputs may be combined to present an array or other enhanced low photovoltaic energy storage DC output (66).

In typical applications, it is common for the conversion combined photovoltaic DC output (10) to be provided as an input to a load, shown as a photovoltaic DC-AC inverter (12) as but one possibility. The photovoltaic DC-AC inverter (12) can provide a photovoltaic AC power output (13). This may be connected to a grid or the like As also shown in FIG. 1, strings of power sources can be connected in parallel (14) to provide greater power to the photovoltaic DC-AC inverter (12). It is also possible to provide an integrated system such as by having both the low photovoltaic energy storage DC-DC photovoltaic converter (15) and the photovoltaic DC-AC inverter (12) integrated to present a combined high efficiency DC-DC-AC photovoltaic converter (16).

In operation, the system can accept first power from the first photovoltaic source of power (5), accomplish base phase DC-DC conversion to create a base phase DC power delivery through the base phase DC-DC photovoltaic converter (6). In similar fashion accepted power from a second source of power such as the second photovoltaic source of power (7) can be converted through an altered phase DC-DC converting process to provide and create an altered phase DC power delivery. Both the base phase DC-DC photovoltaic converter (6) and the altered phase DC-DC photovoltaic converter (8) can have switches to achieve their operations. These switches can be controlled by some type of controller perhaps a synchronous phase control (11). The output of the altered phase DC power delivery and the base phase DC power delivery can be combined to achieve the mentioned conversion combined photovoltaic DC output (10).

To allow for greater power generation, it is possible that the process of combining the different power deliveries can involve the process of series combining the power deliveries. The combiner circuitry (9) can be configured as series power configured circuitry so that voltage or the like of the two power generators are added. As discussed later in reference to FIGS. 4, 6, and 7, it can be understood that the combiner circuitry (9) can involve one or more of either or both an inductance and/or a capacitance. These elements can be configured to have unusually low energy storage requirements for a photovoltaic system, and so the present invention can achieve unusually low input and output converter energy storage as discussed later. In such a configuration, the circuitry can be considered as involving a low photovoltaic energy storage inductor (17) and/or a low photovoltaic storage capacitor (18) of which the low photovoltaic energy storage DC-DC converter (15) is comprised. When configured as a series power combining circuit, the combiner circuitry (9) can present additive voltage circuitry that adds the output voltage of one power supply such as the base phase switched output to the output voltage of another power supply such as the altered phase switched output. The step of adding voltage can allow greater power generation or delivery efficiency while not exceeding the regulatory limits as mentioned earlier. It can also be achieved by low inductance adding of the voltages through the teachings of the present invention.

As mentioned, the converters can be based on a switch-mode type of operation. Such converters can have a number of different switches through which operations can achieve the desired goals. Varying types of converters are shown in different embodiments of the present invention. As shown in FIGS. 4, 5, 6, and 7, the converters can have switches (e.g., 21-46) that can be controlled to achieve the desired goals. This control can be specific to embodiments of the present invention and can be an important aspect in achieving the goals as desired as well as an important difference in operation as compared to previous similar circuitries. Further, some of the switches such as those labeled (44 & 45 and the like) can be active switches, diodes, or even a combination of diodes with an active switch. The affirmative control of the switches can be by the synchronous phase control (11) as mentioned earlier. As shown in FIG. 1, one literal or conceptual synchronous control can activate multiple converters so that their switches are synchronous in operation. Naturally, two or more separate controls with a common timing can be used as long as their clock cycles are common so that the two converters are operated under one timing mode.

Figure 2A:
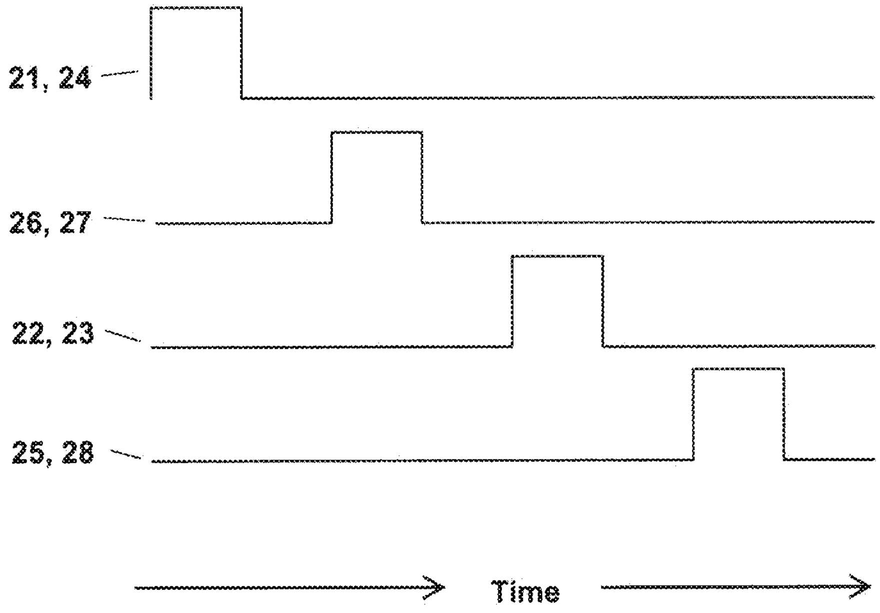
FIGS. 2*a* and 2*b* are timing diagrams to achieve control according to various embodiments of the present invention.
Figure 2B:
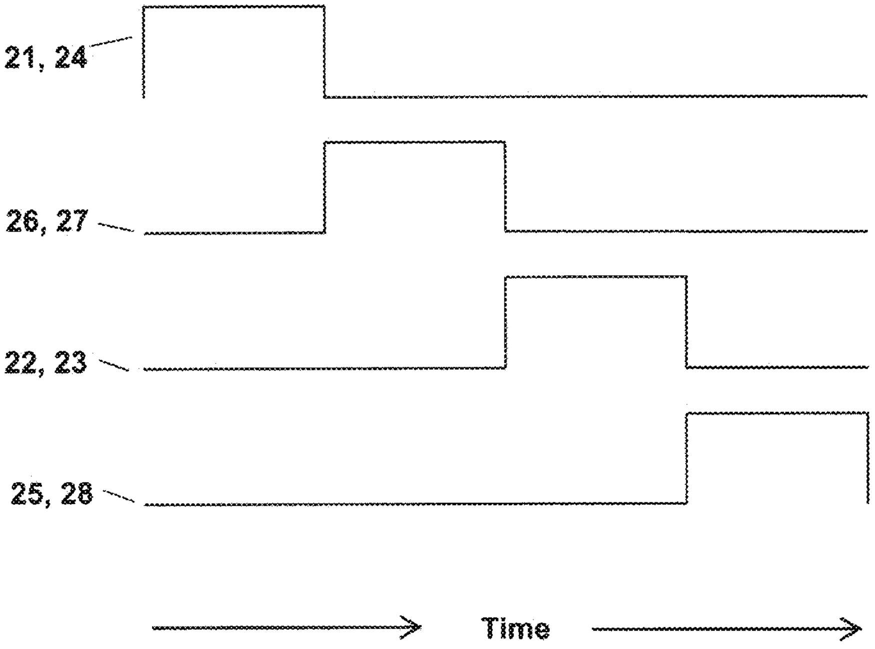
Figure 4:
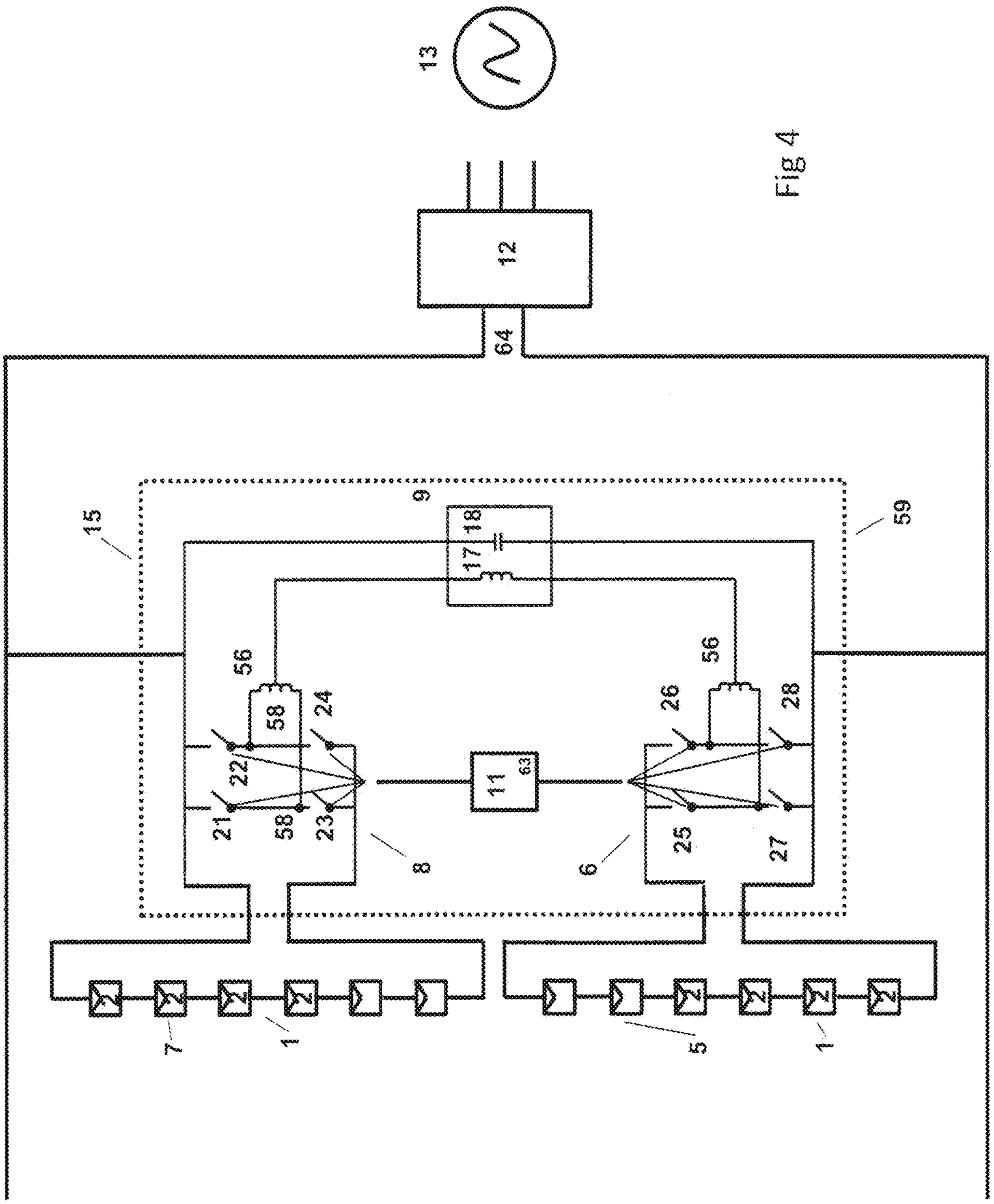
FIG. 4 is a schematic of circuitry as configured for a tapped coupled inductor embodiment of a phased interleave design for the present invention.

Control can be by duty cycle controlling the switches in the converters. A duty cycle controller (51) can be provided common to both converters as shown, and as such it can be considered a common duty cycle controller to achieve the step of common duty cycle control so that switches in the two converters can be operated synchronously according to desired schedules. By providing a common controller or at least synchronously controlling the converters, embodiments of the invention can be considered as providing a common timing signal for switch operation. This common timing signal can specifically cause modes of operation in accordance with the invention. For example, FIGS. 2*a* and 2*b* show some examples of this common timing signal for the tapped magnetically coupled inductor embodiments of the invention such as shown in FIG. 4. In these figures, a roughly 25% (FIG. 2*b*) and 12½% (FIG. 2*a*) duty cycle operation is conceptually presented showing the operation of switches (21-28) as indicated. Although not shown, operation from 0% to 100% is possible, of course. As may be understood in the context of comparing the operations of switches (21 & 24), switches (26 & 27), switches (22 & 23), and switches (25 & 28) the synchronous and opposing modes of control can be seen. These switches can be sequentially operated so that the outputs of each converter oppose each other and switched at different times. As may be appreciated from FIG. 2*b*, this can offer advantages such that the opposing modes of operation can compensate for and offset an effect of each other in the combiner circuitry (9) and thus allow lower energy storage and more efficient operation. By presenting an opposing phase controller (52), embodiments of the invention can be configured such that one converter is on, generating power, active or the like when another is off or the like and vice versa. Through such affirmative control of switches, opposing phase controlling of the step of converting the power can achieve the reductions in energy storage as well as reduced ripple and other advantages. This opposing phase controller (52) can be diametrically opposing such as by providing a 180° photovoltaic converter switch controller and 1800 photovoltaic converter switch controlling the DC output or the converters as shown. In this fashion the converter components can deliver power according to an interleaved schedule or process to effect advantages mentioned.

Figure 3A:
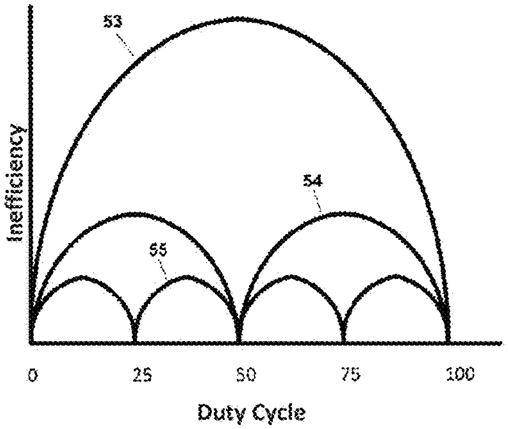
FIGS. 3*a*-3*d* are efficiency related type of value diagrams conceptually comparing several operational modes of the present invention with some traditional systems.

Similarly, by the interleave design, advantages can also be achieved. This can the understood conceptually with reference to FIGS. 3*a*-3*d* with the bottom axis representing the percentage of duty cycle operation. Perhaps non-quantitatively, FIG. 3*a* can be understood as representing an efficiency type of value (actually inefficiency) across the duty cycles ranges. It also compares one traditional operation with some of the improved modes of operation. In the previous systems, converters may have presented efficiency (or more appropriately inefficiency) across a 0% to 100% duty cycle range as shown conceptually in FIG. 3*a* by the curve labeled (53). By understanding that for some values and in some instances the FIG. 3*a* conceptual plot can be considered as presenting inefficiency or even a conversion energy along a vertical axis, it can be seen that significant inefficiency exists for many traditional systems at anything other than the 0% and 100% duty cycle areas. From this, it can be conceptually understood that in many traditional operating modes (designs with a full duty cycle energy configuration), converters were often least efficient at a midpoint of operation. They were most efficient at the 0% duty cycle of operation (no power) and also at the 100% duty cycle mode of operations (no conversion) but these can be less significant from a conversion perspective. Thus as those skilled in the art well understood, during the most significant situations of power generation or at least delivery, such as in the 50% to 100% duty cycle range of operation—often the most common locations—the converter was on average not that efficient. For example, for a maximum 60 volt panel output, a more traditional, full cycle ripple energy converter could provide an output ranging from 0 to 60 volts. At 0% duty cycle (0 volts), there was no power delivered; at 50% duty cycle there was power but at worst efficiency; at 100% there was no conversion achieved. Embodiments of the present invention show that this mode of operation can be improved upon. As explained later, entire efficiency is enhanced by the phased modes of operation now available through the present invention.

With respect to the curve labeled as (54), one can understand that this particular mode shows operation of embodiments designed to achieve a half duty cycle energy configuration. As may be conceptually understood from this plot, the efficiency can be improved (inefficiency reduced) through embodiments of the present invention. Similarly in the curve labeled (55), an operation mode using a half duty cycle energy configuration with or without the phased operational mode can be understood. As shown, even further advantages can be achieved (this may not be available for some of the embodiments of the present invention). Even the aspect of varying the voltage across all operational regimes is changed for embodiments of the present invention. Output voltage does not vary in this manner for the present invention, it remains relatively constant and so a high delivery voltage (itself a more efficient way to deliver power) can be achieved.

Figure 3B:
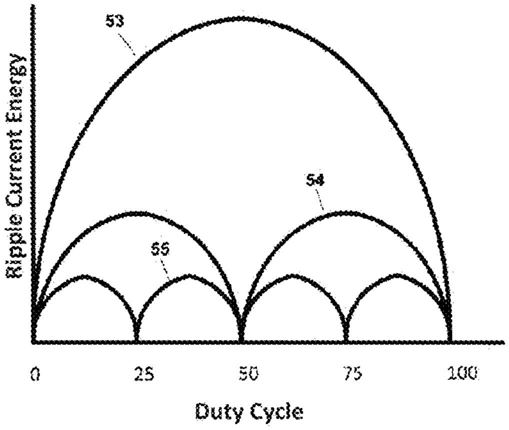
Figure 3C:
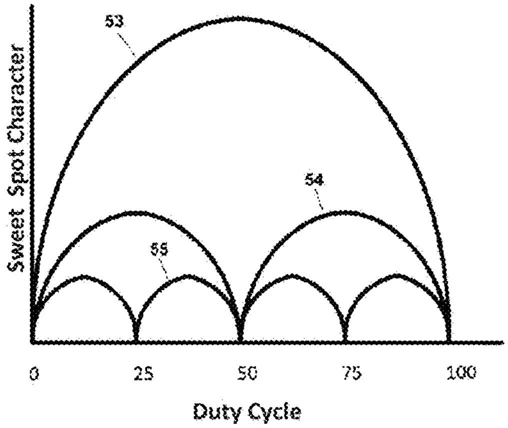
Figure 3D:
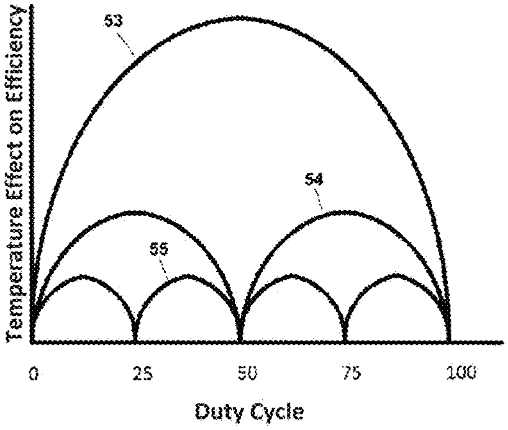

FIG. 3*b* can be considered as indicating amount of ripple such as through the low photovoltaic storage energy inductor (17) or the like. FIG. 3*b* can also be considered as indicating ripple current energy. FIG. 3*c* can be considered as indicating the sweet spot character across the various duty cycles. The number of sweet spots available in operation, with substantial power delivery, for the high efficiency conversion operations according to the present invention is improved. Sweet spots (highest practical efficiency and/or relatively little or no inefficiency) can be understood to exist at locations on the plot where it touches the bottom axis. A sweet spot can exist for some traditional circuitry at 0% and 100% of operation. Unfortunately, these are often locations of least interest as they may be less common or at least may not involve substantial power delivery. In embodiments of the present invention, sweet spots can exist at 50% and 100% or even at 25% and 50%. Through such designs and mode of operation, embodiments can thus provide an augmented sweet spot photovoltaic output. These augmented sweet spots can now exist even at substantial power conversion locations of operation and can be an effect caused by the new opposing phase mode of operational control by the synchronous control (11). As shown in FIG. 3*c*, for embodiments of the present invention, a sweet spot can now exist even at locations where significant power conversion occurs, not just at extremes of operational modes as in many traditional designs. Thus, the invention can provide a converted power generation or delivery sweet spot photovoltaic output as well as an augmented sweet spot photovoltaic output. As is well known, solar panels can have temperature effects; they generate power differently in different temperature conditions, and to a significant extent the variation in duty cycle can be due to this (as well as partial shading, etc.). In fact, the depiction in FIG. 3*d* can be considered as indicating a temperature effect on efficiency with a hot temperature power generation condition more likely at the 100% duty cycle and a cold temperature power generation condition more likely at the 50% duty cycle for maximum power harvesting. For many traditional systems operation at a colder temperature had a mode of relatively lower conversion efficiency. Through embodiments of the invention, high efficiency can exist at such reduced temperature power generation conditions and the invention can thus present a photovoltaically reduced temperature condition sweet spot photovoltaic output. For certain designs, it can even present a cold operational regime sweet spot photovoltaic output. As shown in FIG. 3*c*, for embodiments of the present invention, a sweet spot can exist at the 50% duty cycle range rather than a poorly efficient level of power delivery, not just a top as in many traditional designs and so the invention can provide a cold operational regime sweet spot photovoltaic power output.

Figure 5:
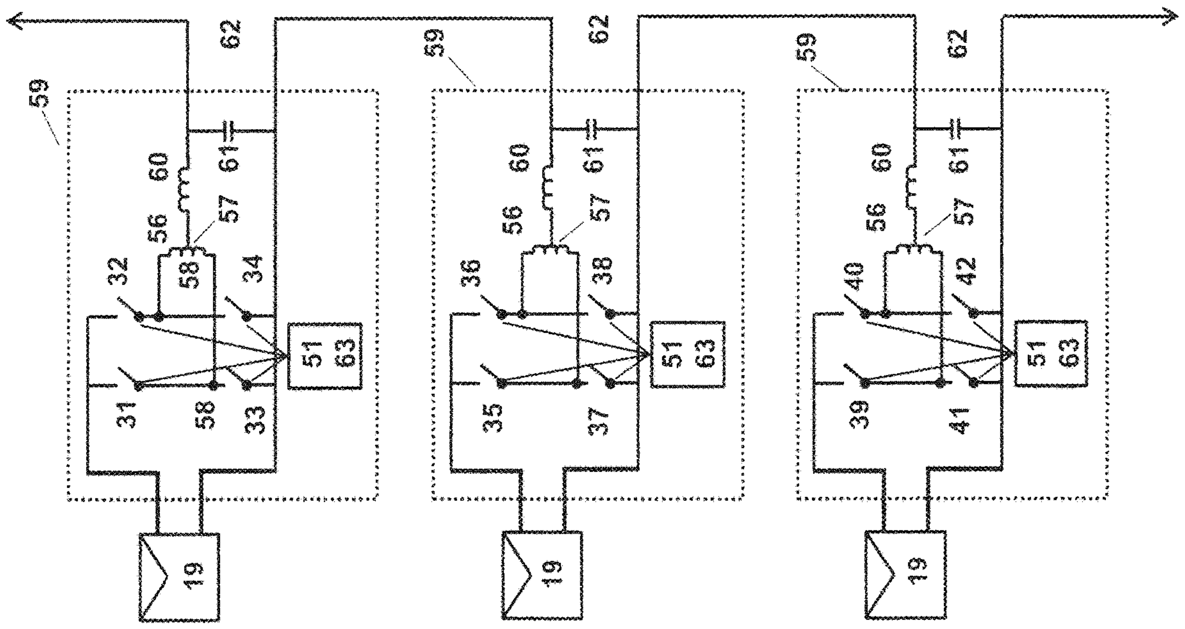
FIG. 5 is a schematic of tapped coupled inductor circuitry as configured for a portion of an additive string voltage embodiment of the present invention.

As mentioned above, converters may be affirmatively switched to achieve best modes of operation. A variety of converter topologies are possible and several are shown in the figures. FIG. 5 shows a particular type of converter as applied to an individual panel that has a tapped magnetically coupled inductor element (56). This is one example of a tapped magnetically coupled inductor arrangement. As shown the tapped magnetically coupled inductor element (56) has an inductor tap (57). This embodiment is affirmatively switched through switches (31 through 42) for the various converters as shown in FIG. 5. These switches are activated by a duty cycle controller (51) to which the converter is switch timing responsive. As shown, this converter can include two pairs of series switches (e.g., 31 & 33) (32 & 34) connected at midpoints (58) at which the tapped magnetically coupled inductor element (56) is connected.

Each low photovoltaic energy storage DC-DC photovoltaic converter (15) can include its own low photovoltaic energy storage inductor (60) and low energy storage output capacitor (61) so as to provide a low photovoltaic inductance DC output (62). FIG. 5 shows multiple applications of the tapped magnetically coupled inductor arrangements whereby each converts its own power output, perhaps such as from a solar panel (19). These converted, high efficiency photovoltaic outputs (62) may be series combined as shown to present an output string. Only a portion of a typical string is depicted. Often numerous panels are combined to approach the maximum allowed operating voltage. In this embodiment, however, an excess voltage arrangement can be configured. By using a half duty cycle energy configuration and individual power source conversion as shown, the string can be configured to provide a double maximum voltage arrangement such that a maximum regulatory or other allowed output can be one-half of the theoretically available panel voltage output. To stay under the maximum amount, the output can be boundary limited by including a photovoltaic boundary output controller (63) which may be part of each individual duty cycle controller, as depicted, or which may be conceptually a collective control for all converters in the string. For configurations applying a quarter duty cycle energy configuration and the individual power source conversion as shown, the string can even be configured to provide a quadruple maximum voltage arrangement such that a maximum regulatory or other allowed output can be one-quarter of the theoretically available panel voltage output. Additional duty cycle energy options (one-eighth, one-tenth, etc.) are also possible, of course. Again, a photovoltaic boundary output controller (63) can be included. Importantly, even with this boundary limitation, power is still harvested efficiently. Embodiments of the invention can be extremely efficient as compared to traditional designs. In fact, the invention can present a photovoltaic output that is at least about 98%, 99%, and 99.5% efficient from the perspective of its conversion process across a duty cycle range (averaged across the range of operation, an occurrence-based range of delivery, or a range of typical expected operation). It can even approach only wire losses in delivering power. Traditional designs rarely can achieve this level of efficiency.

For embodiments utilizing phased operational modes, interconnection and operation such as shown in FIG. 4 can be achieved. In this embodiment, the two pairs of series switches (e.g., 21 & 23)(22 & 24) connected at midpoints (58), can have the output from the tapped magnetically coupled inductor element (56) combined such as through the low photovoltaic energy storage inductor (17) so as to provide a low photovoltaic inductance DC output (64), and also a low energy storage output capacitor (18) to present another type of low photovoltaic energy storage DC-DC photovoltaic converter (15). In similar fashion to that of the individual panel conversion design of FIG. 5, the arrangement of FIG. 4 can also have an excess voltage arrangement. Such configurations can be of a half duty cycle energy configuration and so a half duty cycle controller can be used with the converted string configured to provide a double maximum voltage arrangement. In this configuration, again, to stay under the maximum amount, the output can be boundary limited by including a photovoltaic boundary output controller (63).

Figure 7:
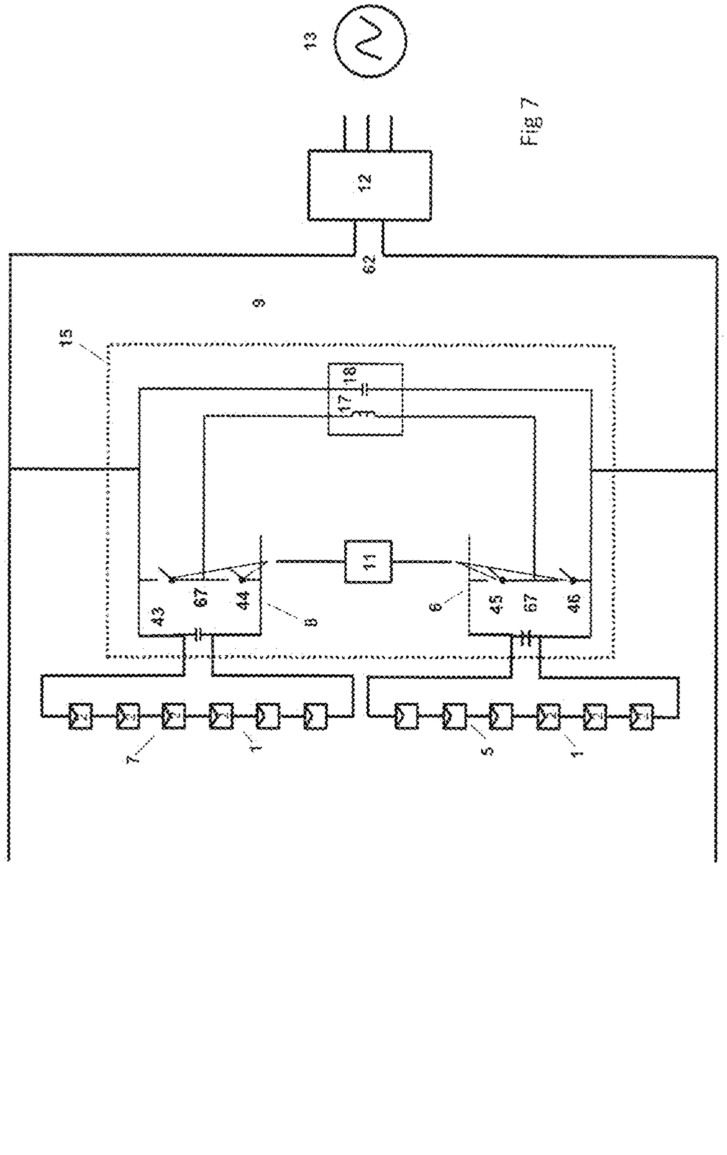
FIG. 7 is a schematic of circuitry as configured for one more phased string embodiment of the present invention.
Figure 9A:
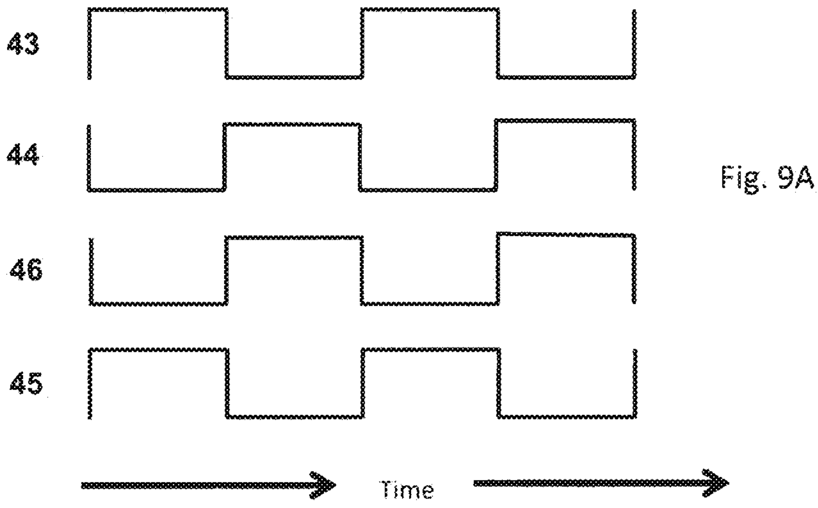
FIG. 9*a* shows an example of one timing signal for an embodiment.
Figure 9B:
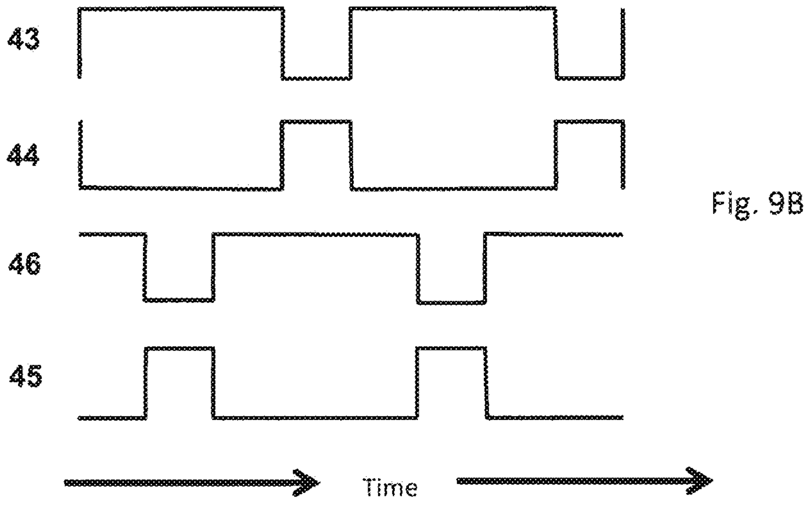
FIG. 9*b* shows another example of one timing signal for an embodiment.

Embodiments such as the phased converter shown in FIG. 4 can also be achieved through a buck power converter appearing arrangement such as shown in FIG. 7. In this embodiment circuitry resembling two buck DC-DC power converters can be used to create one high efficiency converter such as the low photovoltaic energy storage DC-DC photovoltaic converter (15) shown. In this embodiment, two pairs of series switches (43 & 44—altered phase switch pair elements (45 & 46—base phase switch pair elements) connected at midpoints (67) can have the output from the switched element combined such as through the low photovoltaic energy storage inductor (17) so as to provide a low photovoltaic inductance DC output (62), and also a low energy storage output capacitor (18) to present the low photovoltaic energy storage DC-DC photovoltaic converter (15). FIGS. 9*a* and 9*b* show some examples of this common timing signal for this embodiment. In these figures, a roughly 50% (FIG. 9*a*) and 75% (FIG. 9*b*) duty cycle operation is conceptually presented showing the operation of switches (43-46) as indicated. Again, although not shown, operation from 0% to 100% is possible, of course. As may be understood in the context of comparing the operations of switches (43 & 44) and switches (46 & 45), the synchronous and opposing modes of control can be seen. These switches can be sequentially operated so that the outputs of each converter oppose each other and are switched at different times. As with FIGS. 2*a* and 2*b*, this also offer advantages such that the opposing modes of operation can compensate for and offset an effect of each other in the combiner circuitry (9) and thus allow lower energy storage and more efficient operation.

As mentioned earlier, embodiments of the invention can operate at high operational voltages. Whereas in most, more traditional systems, output efficiency varied across the operational regime as shown in the curve (53) in FIG. 3, in embodiments of the present invention, the output can be relatively stable. As also indicated conceptually in FIG. 3 when considering the vertical axis as a type of ripple indication, mainly just the ripple varies—and even this is at a lower level of ripple than previous. The output voltage can be controlled to be relatively constant across all operational regimes without any compromise in power delivery. In fact, not only is there no loss in power delivery, the present invention can achieve higher power delivery. By utilizing a phased operational mode, this power output voltage such as present at the enhanced low photovoltaic energy storage DC output (66)(for the embodiment in FIG. 1), low photovoltaic inductance DC output (64)(for the embodiment in FIG. 4), and high efficiency photovoltaic outputs (62)(for the embodiment in FIGS. 5 & 7) can be a high multi operational regime output such that it is, at least in a photovoltaic sense, at a relatively high voltage or the like in any or even across all operational conversion regimes where substantial power is delivered. The high multi operational regime output can even be a high average photovoltaic voltage output (averaged across the range of operation, an occurrence-based range of delivery, or a range of typical expected operation). This high average photovoltaic voltage output or high multi operational regime output can be controlled to be near or even at the maximum desired or allowable for enhanced efficiency, perhaps less some guard band tolerance. Thus, embodiments can be configured or controlled to achieve an at least about 80%, 90%, or even 95% or more of a maximum voltage photovoltaic output across a typical operational range.

Beyond merely the level of voltage, embodiments can also present particular levels of high efficiency such as at sweet spots or the like. Considering the diagram of FIG. 3 as conceptually depicting temperature effect with a hot temperature generation at or near the 100% duty cycle and cold temperature operation at or near the 50% duty cycle, it can be understood that most significant, nominal operation will often occur in the 50% to 100% range. As discussed above with respect to the sweet spots shown conceptually in FIG. 3, designs can present dual nominal operational range high efficiency photovoltaic power outputs where sweet spot operation exists at two substantial power delivery locations. This is shown conceptually in FIG. 3 at 50% & 100% for the embodiments characterized as the half duty cycle energy configuration embodiments, and at 50%, 75%, and 100% for the embodiments characterized as the quarter duty cycle energy embodiments. Similarly, embodiments can be considered as presenting at least one high efficiency converted power generation or delivery mode photovoltaic output such as those referenced above and may even provide a two or dual high efficiency spots at which power conversion or delivery occurs.

In providing a low inductance output or low energy storage conversion, both the energy storage experienced at an input and at an output can be unusually low, at least from a photovoltaic perspective. Input inductance can be particularly low for the module level converter designs. This can be significant and can benefit the applied load perhaps such as the photovoltaic DC-AC inverter (12). Through proper coordination, this can offer advantages and can even encourage the use of the integrated design such as the combined high efficiency DC-DC-AC photovoltaic converter (16) design shown in FIG. 1.

As previously mentioned, a low energy storage converter, perhaps comprising a low energy storage, a low energy inductance, and/or a low energy capacitance, are advantages of the present invention. Recalling that FIG. 3 can be viewed as conceptually indicating the amount of ripple current storage energy across the duty cycle range, it can be understood that the amount of storage energy is significantly reduced through embodiments of the present invention. Whereas traditional systems indicate significant energy storage needs equivalent to a full cycle of ripple energy (as suggested by the peak height of curve (53) at 50%), in embodiments of the present invention, this energy can be considerably reduced by half or even a quarter as shown. Specifically, for a 50% to 100% design shown by curve (54), the peak height at 25% and 75% is about one-half the amount of energy storage indicated for a traditional system with equivalent switching frequency, equivalent types of switches, and the like. Similarly, for a 25% to 50% design shown by curve (55), the peak height at about 12½%, 37½%, etc. is about one-quarter the amount of energy storage indicated for a traditional system. The reduced values of conversion energy storage, inductance, and capacitance can be achieved at these reduced levels. Thus, for the embodiments characterized as the half duty cycle energy configuration embodiments, such designs can have a not more than about one-half duty cycle range ripple current photovoltaic energy storage converter, a not more than about one-half of traditional photovoltaic energy storage converter, a not more than about one-half duty cycle range ripple current photovoltaic energy storage inductor, a not more than about one-half of traditional photovoltaic energy storage inductor, a not more than about one-half duty cycle range ripple current photovoltaic energy storage capacitor, and a not more than about one-half of traditional photovoltaic energy storage capacitor. Similarly, for the embodiments characterized as the quarter duty cycle energy configuration embodiments, such designs can have a not more than about one-quarter duty cycle range ripple current photovoltaic energy storage converter, a not more than about one-quarter of traditional photovoltaic energy storage converter, a not more than about one-quarter duty cycle range ripple current photovoltaic energy storage inductor, a not more than about one-quarter of traditional photovoltaic energy storage inductor, a not more than about one-quarter duty cycle range ripple current photovoltaic energy storage capacitor, and a not more than about one-quarter of traditional photovoltaic energy storage capacitor. Similar aspects can exist for other embodiments (one-eighth, one-tenth, etc.) This can allow greater power delivery to the load such as the photovoltaic DC-AC inverter (12) or the like.

A further embodiment of the invention is illustrated in FIG. 6. In this design, an individual panel (19) can be enhanced by providing an interpanel or other conversion design that may be integral to, attached to, or provided with the panel (19). In this embodiment, multiple photovoltaic power cells (20) can be aggregated perhaps conceptually to present a solar panel (19) perhaps in its own assembly. The solar panel (19) power delivery can be conceptually split at some point and so there can be at least one split panel DC-DC photovoltaic converter (68). As discussed above, this can actually be comprised of two converters, perhaps such as a base phase DC-DC photovoltaic converter (6) and the altered phase DC-DC photovoltaic converter (8). These converters can have their outputs combined through combiner circuitry to provide a conversion combined photovoltaic DC output and this type of combiner circuitry can be configured as an interpanel photovoltaic cell addition circuitry (70).

The split panel DC-DC photovoltaic converter (68) can have affirmative switches as shown, that may be controlled by an internal or external duty cycle controller (51) to provide a high efficiency (or low energy storage or low inductance) photovoltaic DC output (69). Again this can be configured as to have a tapped magnetically coupled inductor arrangement or a buck converter appearing arrangement. Each can include a low photovoltaic energy storage inductor (17), a low photovoltaic inductance DC output, and a low energy storage output capacitor (18) as discussed above. This type of low photovoltaic energy storage DC-DC photovoltaic converter (15) can achieve the advantages discussed above. It may or may not require a photovoltaic boundary output controller.

Figure 8:
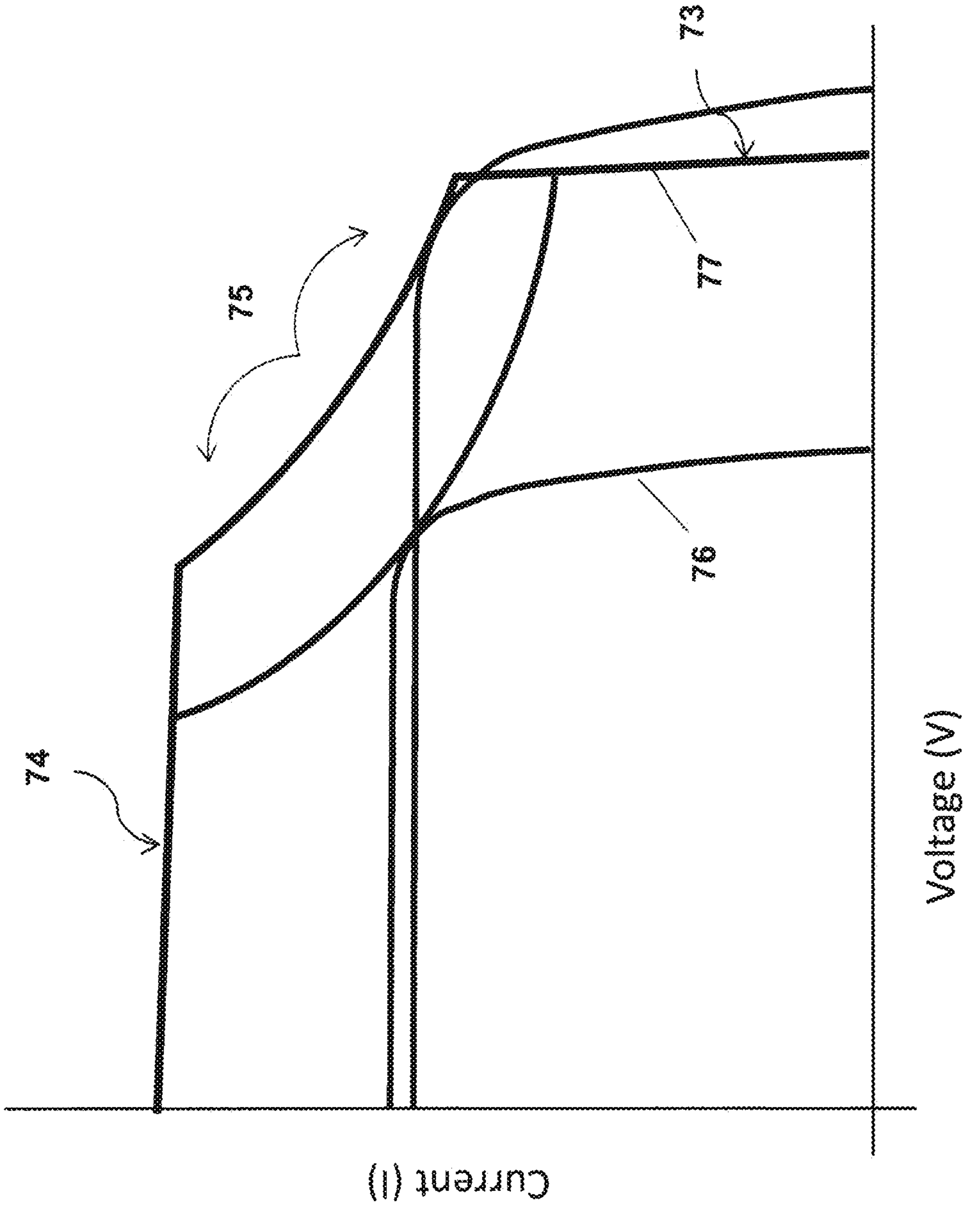
FIG. 8 is a conceptual diagram of boundary controlled modes of the present invention.

As shown in FIG. 8, for those embodiments of any of the above that include a photovoltaic boundary output controller (63), it may be understood that this controller can control voltage (73), current (74), maximum power point (75), power delivery (perhaps even by over voltage boundary control to regulate the output power), or other aspects that may need to be limited such as to meet regulatory concerns or the like. This may, of course, exist for high temperature operation (76) or low temperature operation (77). Voltage control can be the most important for regulatory and other reasons, and so embodiments can present some controller as a photovoltaic output voltage limit controller. The photovoltaic boundary output controller (63) can limit output at a boundary hierarchically, that is with an ordered decisional process as to which limit applies and overrides other limits as well. This control can also be optimized for the inverter, inverter input sweet spot control, or otherwise. Some such levels are shown in FIG. 8. Inverter optimization control can be provided as one way of achieving converter operation that is optimized for a load, perhaps such as a photovoltaic DC-AC inverter (12). As such, embodiments may include (again, separately or as part of an existing controller or control software) a photovoltaic inverter optimized converter controller.

As mentioned above, the above converter and other inventive designs can be applied to a wide range of power situations. Almost any varying source of power can be enhanced by such power conversion and control. These powers can be consumer power, industrial power, individual consumer or such device or battery power, and even large scale grid power sources, and all such applications should be understood as encompassed within the present application and disclosure.

While the invention has been described in connection with some preferred embodiments, it is not intended to limit the scope of the invention to the particular form set forth, but on the contrary, it is intended to cover such alternatives, modifications, and equivalents as may be included within the spirit and scope of the invention as defined by the statements of invention.

Examples of embodiment definitions may include:

1. A method of highly efficiency delivering solar energy power comprising the steps of:
   - accepting a first power from a first photovoltaic source of power;
   - base phase DC-DC converting said first power to create a base phase DC power delivery;
   - accepting a second power from a second photovoltaic source of power;
   - altered phase DC-DC converting said second power to create an altered phase DC power delivery;
   - synchronous phase controlling said step of base phase DC-DC converting with said step of altered phase DC-DC converting; and
   - combining said base phase DC power delivery with said altered phase DC power delivery to provide a conversion combined photovoltaic DC output.

2. A method of highly efficiency delivering solar energy power as described in clause 1 or any other clause wherein said step of combining said base phase DC power delivery with said altered phase DC power delivery comprises the step of series power combining said base phase DC power delivery with said altered phase DC power delivery.

3. A method of highly efficiency delivering solar energy power as described in clause 2 or any other clause wherein said step of series power combining said base phase DC power delivery with said altered phase DC power delivery comprises the step of adding voltages from said base phase DC power delivery and said altered phase DC power delivery.

4. A method of highly efficiency delivering solar energy power as described in clause 3 or any other clause wherein said step of adding voltages from said base phase DC power delivery and said altered phase DC power delivery comprises the step of low inductance adding voltages from said base phase DC power delivery and said altered phase DC power delivery.

5. A method of highly efficiency delivering solar energy power as described in clause 1 or any other clause wherein said step of synchronous phase controlling comprises the step of synchronously duty cycle controlling said step of base phase DC-DC converting with said step of altered phase DC-DC converting.

6. A method of highly efficiency delivering solar energy power as described in clause 5 or any other clause wherein said step of synchronously duty cycle controlling comprises the step of common duty cycle controlling said step of base phase DC-DC converting with said step of altered phase DC-DC converting.

7. A method of highly efficiency delivering solar energy power as described in clause 5 or any other clause and further comprising the steps of:
   - establishing said conversion combined photovoltaic DC output as a converted DC photovoltaic input to a photovoltaic DC-AC inverter; and
   - inverting said converted DC photovoltaic input into a photovoltaic AC power output.

8. A method of highly efficiency delivering solar energy power as described in clause 7 or any other clause wherein said step of controlling further comprises the step of photovoltaic inverter input coordinated controlling said step of base phase DC-DC converting with said step of altered phase DC-DC converting.

9. A method of highly efficiency delivering solar energy power as described in clause 8 or any other clause wherein said step of photovoltaic inverter input controlling comprises the step of photovoltaic inverter input optimization controlling said step of base phase DC-DC converting with said step of altered phase DC-DC converting.

10. A method of highly efficiency delivering solar energy power as described in clause 1 or any other clause wherein said step of synchronous phase controlling comprises the step of common timing signal controlling said step of base phase DC-DC converting with said step of altered phase DC-DC converting.

11. A method of highly efficiency delivering solar energy power as described in clause 1 or any other clause wherein said step of synchronous phase controlling comprises the step of opposing phase controlling said step of base phase DC-DC converting with said step of altered phase DC-DC converting.

12. A method of highly efficiency delivering solar energy power as described in clause 11 or any other clause wherein said step of opposing phase controlling comprises the step of augmented photovoltaic output sweet spot controlling said step of base phase DC-DC converting with said step of altered phase DC-DC converting.

13. A method of highly efficiency delivering solar energy power as described in clause 12 or any other clause wherein said step of augmented photovoltaic output sweet spot controlling comprises the step of cold operational regime sweet spot controlling said step of base phase DC-DC converting with said step of altered phase DC-DC converting.

14. A method of highly efficiency delivering solar energy power as described in clause 12 or any other clause wherein said step of augmented photovoltaic output sweet spot controlling comprises the step of converted power generation output sweet spot controlling said step of base phase DC-DC converting with said step of altered phase DC-DC converting.

15. A method of highly efficiency delivering solar energy power as described in clause 12 or any other clause wherein said step of augmented photovoltaic output sweet spot controlling comprises the step of photovoltaically reduced temperature condition sweet spot controlling said step of base phase DC-DC converting with said step of altered phase DC-DC converting.

16. A method of highly efficiency delivering solar energy power as described in clause 13 or any other clause wherein said steps of base phase DC-DC converting and altered phase DC-DC converting each comprise the step of buck DC-DC power converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

17. A method of highly efficiency delivering solar energy power as described in clause 16 or any other clause wherein said step of series inductor combining comprises the step of low photovoltaic energy inductance combining said base phase DC power delivery with said altered phase DC power delivery to provide a conversion combined photovoltaic DC output.

18. A method of highly efficiency delivering solar energy power as described in clause 17 or any other clause wherein said step of low photovoltaic energy inductance combining comprises a step selected from a group consisting of:

- not more than about one-half duty cycle ripple current photovoltaic energy storage combining said base phase DC power delivery with said altered phase DC power delivery;
- not more than about one-half of traditional photovoltaic energy storage combining said base phase DC power delivery with said altered phase DC power delivery;
- a not more than about one-quarter duty cycle ripple current photovoltaic energy storage combining said base phase DC power delivery with said altered phase DC power delivery; and
- a not more than about one-quarter of traditional photovoltaic energy storage combining said base phase DC power delivery with said altered phase DC power delivery.

19. A method of highly efficiency delivering solar energy power as described in clause 16 or any other clause wherein said step of base phase DC-DC converting and said step of altered phase DC-DC converting each comprise the step of utilizing two series connected switches connected at a midpoint, and wherein said step of series inductor combining said base phase DC power delivery with said altered phase DC power delivery comprises the step of utilizing an inductor connected between said midpoints.

20. A method of highly efficiency delivering solar energy power as described in clause 12 or any other clause wherein said steps of base phase DC-DC converting and altered phase DC-DC converting each comprise the step of utilizing a tapped magnetically coupled inductor arrangement having an inductor tap, and wherein said step of combining said base phase DC power delivery with said altered phase DC power delivery comprises the step of utilizing an inductor connected between said inductor taps.

21. A method of highly efficiency delivering solar energy power as described in clause 20 or any other clause wherein said step of utilizing an inductor connected between said inductor taps comprises the step of utilizing a low photovoltaic energy storage inductor connected between said inductor taps.

22. A method of highly efficiency delivering solar energy power as described in clause 21 or any other clause wherein said step of utilizing a low photovoltaic energy storage inductor connected between said inductor taps comprises a step selected from a group consisting of:

- not more than about one-half duty cycle range ripple current photovoltaic energy storage combining said base phase DC power delivery with said altered phase DC power delivery; and
- a not more than about one-quarter duty cycle range ripple current photovoltaic energy storage combining said base phase DC power delivery with said altered phase DC power delivery.

23. A method of highly efficiency delivering solar energy power as described in clause 20 or any other clause wherein said step of utilizing a tapped magnetically coupled inductor arrangement further comprises the step of utilizing two pairs of series switches connected at a midpoint to which said tapped magnetically coupled inductor arrangement is connected.

24. A method of highly efficiency delivering solar energy power as described in clause 12, 16, 20, or any other clause and further comprising the step of photovoltaic boundary output controlling said step of base phase DC-DC converting and said step of altered phase DC-DC converting.

25. A method of highly efficiency delivering solar energy power as described in clause 11 or any other clause wherein said step of combining said base phase DC power delivery with said altered phase DC power delivery comprises the step of series combining said base phase DC power delivery with said altered phase DC power delivery to provide said conversion combined photovoltaic DC output.

26. A method of highly efficiency delivering solar energy power as described in clause 25 or any other clause wherein said step of series combining said base phase DC power delivery with said altered phase DC power delivery to provide said conversion combined photovoltaic DC output comprises the step of adding voltages from said base phase DC power delivery and said altered phase DC power delivery.

27. A method of highly efficiency delivering solar energy power as described in clause 26 or any other clause wherein said step of adding voltages from said base phase DC power delivery and said altered phase DC power delivery comprises the step of establishing an excess voltage arrangement.

28. A method of highly efficiency delivering solar energy power as described in clause 27 or any other clause wherein said step of establishing an excess voltage arrangement comprises the step of establishing a double maximum voltage arrangement.

29. A method of highly efficiency delivering solar energy power as described in clause 11 or any other clause wherein said step of combining said base phase DC power delivery with said altered phase DC power delivery comprises the step of establishing a double maximum voltage arrangement.

30. A method of highly efficiency delivering solar energy power as described in clause 1 or any other clause wherein said steps of converting said DC power comprise the steps of low photovoltaic energy storage converting said DC power.

31. A method of highly efficiency delivering solar energy power as described in clause 30 or any other clause wherein said steps of low photovoltaic energy storage converting said DC power comprise steps selected from a group consisting of:

- not more than about one-half duty cycle range ripple current photovoltaic energy storage converting said power;
- not more than about one-half of traditional photovoltaic energy storage converting said power;
- a not more than about one-quarter duty cycle range ripple current photovoltaic energy storage converting said power; and
- a not more than about one-quarter of traditional photovoltaic energy storage converting said power.

32. A method of highly efficiency delivering solar energy power as described in clause 30 or any other clause wherein said steps of base phase DC-DC converting and altered phase DC-DC converting each comprise the step of buck DC-DC power converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

33. A method of highly efficiency delivering solar energy power as described in clause 30 or any other clause wherein said steps of base phase DC-DC converting and altered phase DC-DC converting each comprise the step of utilizing a tapped magnetically coupled inductor arrangement having an inductor tap, and wherein said step of combining said base phase DC power delivery with said altered phase DC power delivery comprises the step of utilizing an inductor connected between said inductor taps.

34. A method of highly efficiency delivering solar energy power as described in clause 30 or any other clause wherein said step of synchronous phase controlling comprises the step of opposing phase controlling said step of base phase DC-DC converting with said step of altered phase DC-DC converting.

35. A method of highly efficiency delivering solar energy power as described in clause 11 or any other clause wherein said step of combining said base phase DC power delivery with said altered phase DC power delivery comprises the step of interpanel photovoltaic cell additive combining said base phase DC power delivery with said altered phase DC power delivery.

36. A method of highly efficiency delivering solar energy power as described in clause 35 or any other clause wherein said step of base phase DC-DC converting and altered phase DC-DC converting comprise the step of split panel DC-DC power converting said input powers.

37. A method of highly efficiency delivering solar energy power as described in clause 36 or any other clause wherein said step of split panel DC-DC power converting said input powers comprises the step of buck DC-DC power converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

38. A method of highly efficiency delivering solar energy power as described in clause 27 or any other clause wherein said step of series inductor combining said base phase DC power delivery with said altered phase DC power delivery comprises the step of low photovoltaic energy storage combining said base phase DC power delivery with said altered phase DC power delivery.

39. A method of highly efficiency delivering solar energy power as described in clause 36 or any other clause wherein said step of split panel DC-DC power converting said input powers comprises the step of tapped magnetically coupled inductor converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

40. A method of highly efficiency delivering solar energy power as described in clause 39 or any other clause wherein said step of series inductor combining said base phase DC power delivery with said altered phase DC power delivery comprises the step of low photovoltaic energy storage combining said base phase DC power delivery with said altered phase DC power delivery.

41. A method of highly efficiency delivering solar energy power as described in clause 1 or any other clause and further comprising the step of establishing said conversion combined photovoltaic DC output as a high multi operational regime output.

42. A method of highly efficiency delivering solar energy power as described in clause 41 or any other clause wherein said step of synchronous phase controlling comprises the step of opposing phase controlling said step of base phase DC-DC converting with said step of altered phase DC-DC converting.

43. A method of highly efficiency delivering solar energy power as described in clause 42 or any other clause wherein said step of establishing said conversion combined photovoltaic DC output as a high multi operational regime output comprises the step of establishing a high photovoltaic conversion efficiency output.

44. A method of highly efficiency delivering solar energy power as described in clause 43 or any other clause wherein said step of establishing a high photovoltaic conversion efficiency output comprises a step selected from a group consisting of:

establishing an at least about 98% efficient photovoltaic output;

establishing an at least about 99% efficient photovoltaic output; and establishing an at least about 99.5% efficient photovoltaic output.

45. A method of highly efficiency delivering solar energy power as described in clause 42 or any other clause wherein said step of establishing said conversion combined photovoltaic DC output as a high multi operational regime output comprises the step of establishing a high average photovoltaic voltage output.

46. A method of highly efficiency delivering solar energy power as described in clause 45 or any other clause wherein said step of establishing a high average photovoltaic voltage output comprises a step selected from a group consisting of:

establishing an at least about 80% of maximum voltage photovoltaic output across a typical operational range;

establishing an at least about 90% of maximum voltage photovoltaic output across a typical operational range; and establishing an at least about 95% of maximum voltage photovoltaic output across a typical operational range.

47. A method of highly efficiency delivering solar energy power as described in clause 41 or any other clause wherein said step of establishing said conversion combined photovoltaic DC output as a high multi operational regime output comprises the step of establishing a dual nominal operational range high efficiency photovoltaic output.

48. A method of highly efficiency delivering solar energy power as described in clause 47 or any other clause wherein said step of establishing a dual high efficiency photovoltaic output comprises the step of establishing an at least one high efficiency power delivery mode photovoltaic output.

49. A method of highly efficiency delivering solar energy power as described in clause 41 or any other clause wherein said step of combining said base phase DC power delivery with said altered phase DC power delivery comprises the step of low photovoltaic energy storage combining said base phase DC power delivery with said altered phase DC power delivery.

50. A method of highly efficiency delivering solar energy power as described in clause 42 or any other clause wherein said steps of converting DC-DC power converting said input powers comprise the step of buck DC-DC power converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

51. A method of highly efficiency delivering solar energy power as described in clause 42 or any other clause wherein said steps of converting DC-DC power converting said input powers comprise the step of tapped magnetically coupled inductor converting said input powers, and wherein said step of combining said base phase DC power delivery with said altered phase DC power delivery comprises the step of series inductor combining said base phase DC power delivery with said altered phase DC power delivery to provide a conversion combined photovoltaic DC output.

52. A method of highly efficiency delivering solar energy power comprising the steps of:

accepting power from at least one photovoltaic source of power;

low photovoltaic energy storage DC-DC photovoltaic converting said power;

duty cycle controlling said step of low photovoltaic energy storage DC-DC photovoltaic converting said power; and low photovoltaic energy storage delivering a converted photovoltaic DC output.

53. A method of highly efficiency delivering solar energy power as described in clause 52 or any other clause wherein said step of low photovoltaic energy storage DC-DC photovoltaic converting comprises a step selected from a group consisting of:

not more than about one-half duty cycle range ripple current photovoltaic energy storage converting said power;

not more than about one-half of traditional photovoltaic energy storage converting said power;

a not more than about one-quarter duty cycle range ripple current photovoltaic energy storage converting said power; and a not more than about one-quarter of traditional photovoltaic energy storage converting said power.

54. A method of highly efficiency delivering solar energy power as described in clause 52 or any other clause wherein said step of low photovoltaic energy storage DC-DC photovoltaic converting said power comprises the steps of:

first DC-DC photovoltaic converting; and second DC-DC photovoltaic converting.

55. A method of highly efficiency delivering solar energy power as described in clause 54 or any other clause wherein said step of first DC-DC photovoltaic converting comprises the step of base phase DC-DC converting to create a base phase DC power delivery, and wherein said step of second DC-DC photovoltaic converting comprises the step of altered phase DC-DC converting to create an altered phase DC power delivery, and wherein said step of low photovoltaic energy storage delivering a converted photovoltaic DC output comprises the step of combining said base phase DC power delivery with said altered phase DC power delivery.

56. A method of highly efficiency delivering solar energy power as described in clause 55 or any other clause wherein said steps of base phase DC-DC converting and altered phase DC-DC converting each comprise the step of buck DC-DC power converting, and wherein said step of combining said base phase DC power delivery with said altered phase DC power delivery comprises the step of series inductor combining said base phase DC power delivery with said altered phase DC power delivery to provide a conversion combined photovoltaic DC output.

57. A method of highly efficiency delivering solar energy power as described in clause 55 or any other clause wherein said steps of base phase DC-DC converting and altered phase DC-DC converting each comprise the step of utilizing a tapped magnetically coupled inductor arrangement having an inductor tap, and wherein said step of combining said base phase DC power delivery with said altered phase DC power delivery comprises the step of utilizing an inductor connected between said inductor taps.

58. A method of highly efficiency delivering solar energy power as described in clause 55 or any other clause wherein said step of duty cycle controlling said step of low photovoltaic energy storage DC-DC photovoltaic converting said power comprises the step of synchronous phase controlling said step of base phase DC-DC converting with said step of altered phase DC-DC converting.

59. A method of highly efficiency delivering solar energy power as described in clause 58 or any other clause wherein said step of synchronous phase controlling comprises the step of opposing phase controlling said step of base phase DC-DC converting with said step of altered phase DC-DC converting.

60. A method of highly efficiency delivering solar energy power comprising the steps of:

establishing multiple photovoltaic power cells as a photovoltaic source of power;

aggregating said multiple photovoltaic power cells in a solar panel assembly;

split panel DC-DC power converting said power;

duty cycle controlling said step of split panel DC-DC power converting said power; and high photovoltaic efficiency delivering a high efficiency photovoltaic DC output.

61. A method of highly efficiency delivering solar energy power as described in clause 60 or any other clause wherein said step of high photovoltaic efficiency delivering a high efficiency photovoltaic DC output comprises the step of interpanel photovoltaic cell additive combining said power.

62. A method of highly efficiency delivering solar energy power as described in clause 61 or any other clause wherein said step of split panel DC-DC power converting said power comprises the steps of:

first split panel DC-DC photovoltaic converting power from a first collection of photovoltaic power cells on said solar panel assembly; and second split panel DC-DC photovoltaic converting power from a second collection of photovoltaic power cells on said solar panel assembly.

63. A method of highly efficiency delivering solar energy power as described in clause 62 or any other clause wherein said step of first split panel DC-DC photovoltaic converting power from a first collection of photovoltaic power cells on said solar panel assembly comprises the step of base phase DC-DC converting to create a base phase DC power delivery, and wherein said step of second split panel DC-DC photovoltaic converting power from a second collection of photovoltaic power cells on said solar panel assembly comprises the step of altered phase DC-DC converting to create an altered phase DC power delivery.

64. A method of highly efficiency delivering solar energy power as described in clause 63 or any other clause wherein said step of split panel DC-DC power converting said input powers comprises the step of buck DC-DC power converting said input powers, and wherein said step of interpanel photovoltaic cell additive combining said power comprises the step of series inductor combining to provide a conversion combined photovoltaic DC output.

65. A method of highly efficiency delivering solar energy power as described in clause 64 or any other clause wherein said step of interpanel photovoltaic cell additive combining said power comprises the step of series inductor combining.

66. A method of highly efficiency delivering solar energy power as described in clause 63 or any other clause wherein said step of split panel DC-DC power converting said input powers comprises the step of tapped magnetically coupled inductor converting said input powers, and wherein said step of interpanel photovoltaic cell additive combining said power comprises the step of series inductor combining.

67. A method of highly efficiency delivering solar energy power as described in clause 66 or any other clause wherein said step of interpanel photovoltaic cell additive combining said power comprises the step of series inductor combining.

68. A method of highly efficiency delivering solar energy power as described in clause 63 or any other clause wherein said step of duty cycle controlling said step of split panel DC-DC power converting said power comprises the step of synchronous phase controlling said step of split panel DC-DC power converting said power.

69. A method of highly efficiency delivering solar energy power as described in clause 68 or any other clause wherein said step of synchronous phase controlling comprises the step of opposing phase controlling said step of split panel DC-DC power converting said power.

70. A method of highly efficiency delivering solar energy power comprising the steps of:

accepting power from at least one photovoltaic source of power;

tapped magnetically coupled inductor converting said power;

duty cycle controlling said step of tapped magnetically coupled inductor converting said power; and high photovoltaic efficiency delivering a high efficiency photovoltaic DC output.

71. A method of highly efficiency delivering solar energy power as described in clause 70 or any other clause wherein said step of tapped magnetically coupled inductor converting said DC power comprises the step of low photovoltaic energy storage DC-DC photovoltaic converting said power.

72. A method of highly efficiency delivering solar energy power as described in clause 71 or any other clause wherein said step of low photovoltaic energy storage converting said DC output comprises a step selected from a group consisting of:

not more than about one-half duty cycle range ripple current photovoltaic energy storage converting said power;

not more than about one-half of traditional photovoltaic energy storage converting said power;

a not more than about one-quarter duty cycle range ripple current photovoltaic energy storage converting said power; and a not more than about one-quarter of traditional photovoltaic energy storage converting said power.

73. A method of highly efficiency delivering solar energy power as described in clause 70 or any other clause wherein said step of synchronous phase controlling comprises the step of opposing phase controlling said step of tapped magnetically coupled inductor converting said power.

74. A method of highly efficiency delivering solar energy power as described in clause 70 or any other clause wherein said step of tapped magnetically coupled inductor converting said power comprises the step of utilizing two pairs of series switches connected at a midpoint to which a tapped magnetically coupled inductor arrangement is connected.

75. A method of highly efficiency delivering solar energy power as described in clause 70 or any other clause wherein said step of duty cycle controlling said step of tapped magnetically coupled inductor converting said power comprises the step of augmented photovoltaic output sweet spot controlling said step of tapped magnetically coupled inductor converting.

76. A method of highly efficiency delivering solar energy power as described in clause 75 or any other clause wherein said step of augmented photovoltaic output sweet spot controlling comprises the step of cold operational regime sweet spot controlling said step of tapped magnetically coupled inductor converting.

77. A method of highly efficiency delivering solar energy power as described in clause 75 or any other clause wherein said step of augmented photovoltaic output sweet spot controlling comprises the step of converted power generation sweet spot photovoltaic output controlling said step of tapped magnetically coupled inductor converting.

78. A method of highly efficiency delivering solar energy power as described in clause 76 or any other clause wherein said step of augmented photovoltaic output sweet spot controlling comprises the step of photovoltaically reduced temperature condition sweet spot controlling said step of tapped magnetically coupled inductor converting.

79. A method of highly efficiency delivering solar energy power as described in clause 70 or any other clause wherein said step of high photovoltaic efficiency delivering a high efficiency photovoltaic DC output comprises the step of establishing an excess voltage arrangement.

80. A method of highly efficiency delivering solar energy power as described in clause 79 or any other clause wherein said step of establishing an excess voltage arrangement comprises the step of establishing a double maximum voltage arrangement.

81. A method of highly efficiency delivering solar energy power as described in clause 79 or any other clause wherein said step of establishing an excess voltage arrangement comprises the step of establishing a quadruple maximum voltage arrangement.

82. A method of highly efficiency delivering solar energy power as described in clause 70 or any other clause wherein said step of high photovoltaic efficiency delivering a high efficiency photovoltaic DC output comprises the step of establishing a dual nominal operational range high efficiency photovoltaic power output.

83. A method of highly efficiency delivering solar energy power as described in clause 1, 11, 12, 25, 30, 34, 41, 52, 59, 70 or any other clause and further comprising the steps of:

establishing said photovoltaic DC output as a converted DC photovoltaic input to a photovoltaic DC-AC inverter; and inverting said converted DC photovoltaic input into a photovoltaic AC power output, and further comprising the step of photovoltaic inverter input coordinated controlling said converting.

84. A method of highly efficiency delivering solar energy power as described in clause 83 or any other clause and further comprising the step of low photovoltaic energy storage delivering a converted photovoltaic DC output.

85. A method of highly efficiency delivering solar energy power as described in clause 83 or any other clause wherein said step of photovoltaic inverter input coordinated controlling comprises the step of photovoltaic inverter input optimization controlling said converting.

86. A method of highly efficiency delivering solar energy power as described in clause 83 or any other clause wherein said step of converting comprises the step of buck DC-DC power converting, and further comprising the step of series inductor combining to provide a conversion combined photovoltaic DC output.

87. A method of highly efficiency delivering solar energy power as described in clause 83 or any other clause wherein said step of converting comprises the step of utilizing a tapped magnetically coupled inductor arrangement having an inductor tap, and further comprising the step of utilizing an inductor connected to said inductor tap.

88. A method of highly efficiency delivering solar energy power as described in clause 1, 10, 12, 25, 30, 34, 41, 52, 59, 70 or any other clause wherein said step of controlling comprises the step of photovoltaic boundary condition controlling said DC output.

89. A method of highly efficiency delivering solar energy power as described in clause 88 or any other clause wherein said step of photovoltaic boundary condition controlling comprises the step of photovoltaic output voltage limit controlling said DC output.

90. A method of highly efficiency delivering solar energy power as described in clause 89 or any other clause wherein said step of converting comprises the step of buck DC-DC power converting.

91. A method of highly efficiency delivering solar energy power as described in clause 89 or any other clause wherein said step of converting comprises the step of tapped magnetically coupled inductor converting.

92. A method of highly efficiency delivering solar energy power as described in clause 83 or any other clause wherein said step of controlling comprises the step of photovoltaic boundary condition controlling said DC output.

93. A method of highly efficiency delivering solar energy power as described in clause 92 or any other clause wherein said step of photovoltaic boundary condition controlling comprises the step of photovoltaic output voltage limit controlling said DC output.

94. A method of highly efficiency delivering solar energy power as described in clause 93 or any other clause wherein said step of converting comprises the step of buck DC-DC power converting.

95. A method of highly efficiency delivering solar energy power as described in clause 93 or any other clause wherein said step of converting comprises the step of tapped magnetically coupled inductor converting.

96. A method of highly efficiency delivering solar energy power as described in clause 11, 25, 34, 41 59, 69 or any other clause wherein said step of controlling comprises the step of 180° photovoltaic converter switch controlling said DC output.

97. A method of highly efficiency delivering solar energy power as described in clause 1, 12, 30, 41, 58, 58, or any other clause wherein said step of controlling comprises the step of common duty cycle controlling said step of converting.

98. A method of highly efficiency delivering solar energy power as described in clause 70 or any other clause wherein said step of controlling comprises the step of 180° photovoltaic converter switch controlling said DC output.

99. A method of highly efficiency delivering solar energy power as described in clause 70 or any other clause wherein said step of controlling comprises the step of common duty cycle controlling said step of converting.

100. A method of highly efficiency delivering solar energy power as described in clause 84 or any other clause and further comprising the step of combining converted DC power to create a conversion combined photovoltaic DC output.

101. A method of highly efficiency delivering solar energy power as described in clause 100 or any other clause wherein said step of combining converted DC power to create a conversion combined photovoltaic DC output comprises the step of low photovoltaic energy storage combining said converted DC power.

102. A method of highly efficiency delivering solar energy power as described in clause 97 or any other clause and further comprising the step of establishing a double maximum voltage arrangement.

103. A method of highly efficiency delivering solar energy power as described in clause 102 or any other clause wherein said step of converting comprises a step selected from a group consisting of:

not more than about one-half duty cycle range ripple current photovoltaic energy storage converting said power; and not more than about one-half of traditional photovoltaic energy storage converting said power.

104. A method of highly efficiency delivering solar energy power as described in clause 98 or any other clause and further comprising the step of establishing a quadruple maximum voltage arrangement.

105. A method of highly efficiency delivering solar energy power as described in clause 104 or any other clause wherein said step of converting comprises a step selected from a group consisting of:

a not more than about one-quarter duty cycle range ripple current photovoltaic energy storage converting said power; and a not more than about one-quarter of traditional photovoltaic energy storage converting said power.

106. A method of highly efficiency delivering power comprising the steps of:

accepting a first power from a first source of power;

base phase DC-DC converting said first power to create a base phase DC power delivery;

accepting a second power from a second source of power;

altered phase DC-DC converting said second power to create an altered phase DC power delivery;

synchronous phase controlling said step of base phase DC-DC converting with said step of altered phase DC-DC converting; and combining said base phase DC power delivery with said altered phase DC power delivery to provide a conversion combined DC output.

107. A method of highly efficiency delivering power comprising the steps of:

accepting power from at least one source of power;

low conversion energy storage DC-DC converting said power;

duty cycle controlling said step of low conversion energy storage DC-DC converting said power; and low energy storage delivering a converted DC output.

108. A method of highly efficiency delivering power comprising the steps of:

accepting power from at least one source of power;

tapped magnetically coupled inductor converting said power;

duty cycle controlling said step of tapped magnetically coupled inductor converting said power; and high efficiency delivering a high efficiency DC output.

109. A method of highly efficiency delivering solar energy power as described in clause 106, 107, 108 or any other clause wherein said step of controlling comprises the step of boundary condition controlling said DC output.

110. A high efficiency solar energy power system comprising:

a first photovoltaic source of power;

a base phase DC-DC photovoltaic converter having a base phase switched output;

a second photovoltaic source of power;

an altered phase DC-DC photovoltaic converter having an altered phase switched output relative to said base phase switched output;

a synchronous phase control to which said base phase DC-DC photovoltaic converter and said altered phase DC-DC photovoltaic converter are switch timing responsive; and combiner circuitry responsive to said base phase switched output and said altered phase switched output providing a conversion combined photovoltaic DC output.

111. A high efficiency solar energy power system as described in clause 110 or any other clause wherein said combiner circuitry comprises series power configured circuitry.

112. A high efficiency solar energy power system as described in clause 111 or any other clause wherein said combiner circuitry responsive to said base phase switched output and said altered phase switched output providing a conversion combined photovoltaic DC output comprises additive voltage circuitry that adds an output voltage of said base phase switched output with an output voltage of said altered phase switched output.

113. A high efficiency solar energy power system as described in clause 112 or any other clause wherein said combiner circuitry comprises a low photovoltaic energy storage inductor.

114. A high efficiency solar energy power system as described in clause 110 or any other clause wherein said synchronous phase control comprises a duty cycle controller.

115. A high efficiency solar energy power system as described in clause 114 or any other clause wherein said duty cycle controller comprises a common duty cycle controller to which said base phase DC-DC photovoltaic converter and said altered phase DC-DC photovoltaic converter are each responsive. 116. A high efficiency solar energy power system as described in clause 114 or any other clause and further comprising:

a photovoltaic DC-AC inverter responsive to said conversion combined photovoltaic DC output; and a photovoltaic AC power output responsive to said photovoltaic DC-AC inverter.

117. A high efficiency solar energy power system as described in clause 116 or any other clause wherein said duty cycle controller comprises a photovoltaic inverter input controller.

118. A high efficiency solar energy power system as described in clause 117 or any other clause wherein said photovoltaic inverter input controller comprises a photovoltaic inverter input optimization controller.

119. A high efficiency solar energy power system as described in clause 110 or any other clause wherein said synchronous phase control comprises a common timing signal.

120. A high efficiency solar energy power system as described in clause 110 or any other clause wherein said synchronous phase control comprises an opposing phase controller.

121. A high efficiency solar energy power system as described in clause 120 or any other clause wherein said conversion combined photovoltaic DC output comprises an augmented sweet spot photovoltaic output.

122. A high efficiency solar energy power system as described in clause 121 or any other clause wherein said augmented sweet spot photovoltaic output comprises a cold operational regime sweet spot photovoltaic output.

123. A high efficiency solar energy power system as described in clause 121 or any other clause wherein said augmented sweet spot photovoltaic output comprises a converted power generation sweet spot photovoltaic output.

124. A high efficiency solar energy power system as described in clause 121 or any other clause wherein said augmented sweet spot photovoltaic output comprises a photovoltaically reduced temperature condition sweet spot photovoltaic output.

125. A high efficiency solar energy power system as described in clause 122 or any other clause wherein said base phase DC-DC photovoltaic converter and said altered phase DC-DC photovoltaic converter each comprise a buck DC-DC power converter, and wherein said combiner circuitry comprises a series combination inductor.

126. A high efficiency solar energy power system as described in clause 125 or any other clause wherein said series combination inductor comprises a low photovoltaic energy storage inductor.

127. A high efficiency solar energy power system as described in clause 126 or any other clause wherein said low photovoltaic energy storage inductor comprises a low photovoltaic energy storage inductor selected from a group consisting of:

- a not more than about one-half duty cycle range ripple current photovoltaic energy storage inductor;
- a not more than about one-half of traditional photovoltaic energy storage inductor;
- a not more than about one-quarter duty cycle range ripple current photovoltaic energy storage inductor; and
- a not more than about one-quarter of traditional photovoltaic energy storage inductor.

128. A high efficiency solar energy power system as described in clause 125 or any other clause wherein said converters have a pair of series connected switches connected at a midpoint, and wherein said combiner circuitry comprises an inductor connected between said midpoints.

129. A high efficiency solar energy power system as described in clause 121 or any other clause wherein said base phase DC-DC photovoltaic converter and said altered phase DC-DC photovoltaic converter each comprise a tapped magnetically coupled inductor arrangement having an inductor tap, and wherein said combiner circuitry comprises a series combination inductor connected between said inductor taps.

130. A high efficiency solar energy power system as described in clause 129 or any other clause wherein said series combination inductor connected between said inductor taps comprises a low photovoltaic energy storage inductor.

131. A high efficiency solar energy power system as described in clause 130 or any other clause wherein said low photovoltaic energy storage inductor comprises a low photovoltaic energy storage inductor selected from a group consisting of:

- a not more than about one-half duty cycle range ripple current photovoltaic energy storage inductor, and a
- a not more than about one-quarter duty cycle range ripple current photovoltaic energy storage inductor.

132. A high efficiency solar energy power system as described in clause 129 or any other clause wherein said base phase DC-DC photovoltaic converter and said altered phase DC-DC photovoltaic converter comprise converters having two pairs of series switches connected at a midpoint to which said tapped magnetically coupled inductor arrangement is connected.

133. A high efficiency solar energy power system as described in clause 121, 125, 129, or any other clause and further comprising a photovoltaic boundary output controller to which said converters are responsive at at least some times of operation.

134. A high efficiency solar energy power system as described in clause 120 or any other clause wherein said combiner circuitry comprises series power configured circuitry.

135. A high efficiency solar energy power system as described in clause 134 or any other clause wherein said combiner circuitry responsive to said base phase switched output and said altered phase switched output providing a conversion combined photovoltaic DC output comprises additive voltage circuitry that adds an output voltage of said base phase switched output with an output voltage of said altered phase switched output.

136. A high efficiency solar energy power system as described in clause 135 or any other clause wherein said additive voltage circuitry comprises an excess voltage arrangement.

137. A high efficiency solar energy power system as described in clause 136 or any other clause wherein said excess voltage arrangement comprises a double maximum voltage arrangement.

138. A high efficiency solar energy power system as described in clause 120 or any other clause wherein said combiner circuitry comprises a double maximum voltage arrangement.

139. A high efficiency solar energy power system as described in clause 110 or any other clause wherein said converters comprise low photovoltaic energy storage converters.

140. A high efficiency solar energy power system as described in clause 139 or any other clause wherein said low photovoltaic energy storage converters comprise low photovoltaic energy storage converters selected from a group consisting of:

- a not more than about one-half duty cycle range ripple current photovoltaic energy storage converter;
- a not more than about one-half of traditional photovoltaic energy storage converter;
- a not more than about one-quarter duty cycle range ripple current photovoltaic energy storage converter; and
- a not more than about one-quarter of traditional photovoltaic energy storage converter.

141. A high efficiency solar energy power system as described in clause 139 or any other clause wherein said base phase DC-DC photovoltaic converter and said altered phase DC-DC photovoltaic converter each comprise a buck power converter, and wherein said combiner circuitry comprises a series combination inductor.

142. A high efficiency solar energy power system as described in clause 139 or any other clause wherein said base phase DC-DC photovoltaic converter and said altered phase DC-DC photovoltaic converter each comprise a tapped magnetically coupled inductor arrangement having an inductor tap, and wherein said combiner circuitry comprises a series combination inductor connected between said inductor taps.

143. A high efficiency solar energy power system as described in clause 139 or any other clause wherein said synchronous phase control comprises an opposing phase controller.

144. A high efficiency solar energy power system as described in clause 120 or any other clause wherein said combiner circuitry comprises interpanel photovoltaic cell addition circuitry.

145. A high efficiency solar energy power system as described in clause 144 or any other clause wherein said base phase DC-DC photovoltaic converter and said altered phase DC-DC photovoltaic converter each comprise a split panel DC-DC photovoltaic converter.

146. A high efficiency solar energy power system as described in clause 145 or any other clause wherein said split panel DC-DC photovoltaic converters comprise buck power converters, and wherein said combiner circuitry comprises a series combination inductor.

147. A high efficiency solar energy power system as described in clause 146 or any other clause wherein said combiner circuitry comprises a low photovoltaic energy storage inductor.

148. A high efficiency solar energy power system as described in clause 145 or any other clause wherein said split panel converters comprise tapped magnetically coupled inductor arrangements having an inductor tap, and wherein said combiner circuitry comprises a series combination inductor connected between said inductor taps.

149. A high efficiency solar energy power system as described in clause 148 or any other clause wherein said combiner circuitry comprises a low photovoltaic energy storage inductor.

150. A high efficiency solar energy power system as described in clause 110 or any other clause wherein said conversion combined photovoltaic DC output comprises a high multi Operational regime output.

151. A high efficiency solar energy power system as described in clause 150 or any other clause wherein said synchronous phase control comprises an opposing phase controller.

152. A high efficiency solar energy power system as described in clause 150 or any other clause wherein said high multi operational regime output comprises a high photovoltaic conversion efficiency output.

153. A high efficiency solar energy power system as described in clause 152 or any other clause wherein said high photovoltaic conversion efficiency output comprises a high photovoltaic conversion efficiency output selected from a group consisting of:

- an at least about 98% efficient photovoltaic output;
- an at least about 99% efficient photovoltaic output; and
- an at least about 99.5% efficient photovoltaic output.

154. A high efficiency solar energy power system as described in clause 150 or any other clause wherein said high multi operational regime output comprises a high average photovoltaic voltage output.

155. A high efficiency solar energy power system as described in clause 154 or any other clause wherein said high average photovoltaic voltage output comprises a high average photovoltaic voltage output selected from a group consisting of:

- an at least about 80% of maximum voltage photovoltaic output across a typical operational range;
- an at least about 90% of maximum voltage photovoltaic output across a typical operational range; and
- an at least about 95% of maximum voltage photovoltaic output across a typical operational range.

156. A high efficiency solar energy power system as described in clause 150 or any other clause wherein said high multi operational regime output comprises a dual nominal operational range high efficiency photovoltaic power output.

157. A high efficiency solar energy power system as described in clause 156 or any other clause wherein said dual high efficiency power output comprises a at least one high efficiency power delivery mode photovoltaic output.

158. A high efficiency solar energy power system as described in clause 150 or any other clause wherein said combiner circuitry comprises a low photovoltaic energy storage inductor.

159. A high efficiency solar energy power system as described in clause 151 or any other clause wherein said base phase DC-DC photovoltaic converter and said altered phase DC-DC photovoltaic converter each comprise a buck power converter, and wherein said combiner circuitry comprises a series combination inductor.

160. A high efficiency solar energy power system as described in clause 151 or any other clause wherein said base phase DC-DC photovoltaic converter and said altered phase DC-DC photovoltaic converter each comprise a tapped magnetically coupled inductor arrangement having an inductor tap, and wherein said combiner circuitry comprises a series combination inductor connected between said inductor taps.

161. A high efficiency solar energy power system comprising:

- at least one photovoltaic source of power;
- a low photovoltaic energy storage DC-DC photovoltaic converter;
- a duty cycle controller to which said low photovoltaic energy storage DC-DC photovoltaic converter is switch timing responsive; and
- a low photovoltaic energy storage DC output.

162. A high efficiency solar energy power system as described in clause 161 or any other clause wherein said low photovoltaic energy storage DC-DC photovoltaic converter comprises a low photovoltaic energy storage DC-DC photovoltaic converter selected from a group consisting of:

- a not more than about one-half duty cycle range ripple current photovoltaic energy storage converter;
- a not more than about one-half of traditional photovoltaic energy storage converter;
- a not more than about one-quarter duty cycle range ripple current photovoltaic energy storage converter; and
- a not more than about one-quarter of traditional photovoltaic energy storage converter.

163. A high efficiency solar energy power system as described in clause 161 or any other clause wherein said low photovoltaic energy storage DC-DC photovoltaic converter comprises a first photovoltaic DC-DC converter and a second photovoltaic DC-DC converter.

164. A high efficiency solar energy power system as described in clause 162 or any other clause wherein said first photovoltaic DC-DC converter comprises a base phase DC-DC photovoltaic converter having a base phase switched output, and wherein said second photovoltaic DC-DC converter comprises an altered phase DC-DC photovoltaic converter having an altered phase switched output relative to said base phase switched output.

165. A high efficiency solar energy power system as described in clause 164 or any other clause wherein said base phase DC-DC photovoltaic converter and said altered phase DC-DC photovoltaic converter each comprise a buck power converter, and further comprising a series combination inductor and an output capacitor.

166. A high efficiency solar energy power system as described in clause 164 or any other clause wherein said base phase DC-DC photovoltaic converter and said altered phase DC-DC photovoltaic converter each comprise a tapped magnetically coupled inductor arrangement having an inductor tap, and further comprising a series combination inductor connected between said inductor taps and an output capacitor.

167. A high efficiency solar energy power system as described in clause 164 or any other clause wherein said duty cycle controller comprises a synchronous phase control.

168. A high efficiency solar energy power system as described in clause 167 or any other clause wherein said synchronous phase control comprises an opposing phase controller.

169. A high efficiency solar energy power system comprising:

- multiple photovoltaic power cells;
- a solar panel assembly aggregating said multiple photovoltaic power cells;
- at least one split panel DC-DC photovoltaic converter;
- a duty cycle controller to which said at least one split panel DC-DC photovoltaic converter is switch timing responsive; and
- a high efficiency photovoltaic DC output.

170. A high efficiency solar energy power system as described in clause 169 or any other clause and further comprising interpanel photovoltaic cell addition circuitry responsive to said at least one split panel DC-DC photovoltaic converter.

171. A high efficiency solar energy power system as described in clause 170 or any other clause wherein said at least one split panel DC-DC photovoltaic converter comprises a first split panel DC-DC photovoltaic converter and a second split panel DC-DC photovoltaic converter, and wherein said interpanel photovoltaic cell addition circuitry provides a conversion combined photovoltaic DC output.

172. A high efficiency solar energy power system as described in clause 171 or any other clause wherein said first split panel DC-DC photovoltaic converter comprises a base phase DC-DC photovoltaic converter and wherein said second split panel DC-DC photovoltaic converter comprises an altered phase DC-DC photovoltaic converter.

173. A high efficiency solar energy power system as described in clause 172 or any other clause wherein said split panel converters comprise buck power converters, and wherein said combiner circuitry comprises a series combination inductor.

174. A high efficiency solar energy power system as described in clause 173 or any other clause wherein said interpanel photovoltaic cell addition circuitry comprises a low photovoltaic energy storage inductor.

175. A high efficiency solar energy power system as described in clause 172 or any other clause wherein said split panel converters comprise tapped magnetically coupled inductor arrangements having an inductor tap, and wherein said interpanel photovoltaic cell addition circuitry comprises a series combination inductor connected between said inductor taps.

176. A high efficiency solar energy power system as described in clause 175 or any other clause wherein said interpanel photovoltaic cell addition circuitry comprises a low photovoltaic energy storage inductor.

177. A high efficiency solar energy power system as described in clause 172 or any other clause wherein said duty cycle controller comprises a synchronous phase control.

178. A high efficiency solar energy power system as described in clause 177 or any other clause wherein said synchronous phase control comprises an opposing phase controller.

179. A high efficiency solar energy power system comprising:

- at least one photovoltaic source of power;
- a tapped magnetically coupled inductor converter;
- a duty cycle controller to which said tapped magnetically coupled inductor converter is switch timing responsive; and
- a high efficiency photovoltaic DC output.

180. A high efficiency solar energy power system as described in clause 179 or any other clause wherein said tapped magnetically coupled inductor converter comprises a low photovoltaic energy storage DC-DC photovoltaic converter.

181. A high efficiency solar energy power system as described in clause 180 or any other clause wherein said low photovoltaic inductance DC converter comprises a low photovoltaic inductance DC converter selected from a group consisting of:

- a not more than about one-half duty cycle range ripple current photovoltaic energy storage converter;
- a not more than about one-half of traditional photovoltaic energy storage converter;
- a not more than about one-quarter duty cycle range ripple current photovoltaic energy storage converter; and
- a not more than about one-quarter of traditional photovoltaic energy storage converter.

182. A high efficiency solar energy power system as described in clause 179 or any other clause wherein said duty cycle controller comprises an opposing phase controller.

183. A high efficiency solar energy power system as described in clause 179 or any other clause wherein said tapped magnetically coupled inductor converter comprises a converter having two pairs of series switches connected at a midpoint to which said tapped magnetically coupled inductor arrangement is connected.

184. A high efficiency solar energy power system as described in clause 179 or any other clause wherein said high efficiency photovoltaic DC output comprises an augmented sweet spot photovoltaic output.

185. A high efficiency solar energy power system as described in clause 184 or any other clause wherein said augmented sweet spot photovoltaic output comprises a cold operational regime sweet spot photovoltaic output.

186. A high efficiency solar energy power system as described in clause 184 or any other clause wherein said augmented sweet spot photovoltaic output comprises a converted power generation sweet spot photovoltaic output.

187. A high efficiency solar energy power system as described in clause 184 or any other clause wherein said augmented sweet spot photovoltaic output comprises a photovoltaically reduced temperature condition sweet spot photovoltaic output.

188. A high efficiency solar energy power system as described in clause 179 or any other clause and further comprising additive voltage circuitry having an excess voltage arrangement.

189. A high efficiency solar energy power system as described in clause 188 or any other clause wherein said excess voltage arrangement comprises a double maximum voltage arrangement.

190. A high efficiency solar energy power system as described in clause 188 or any other clause wherein said excess voltage arrangement comprises a quadruple maximum voltage arrangement.

191. A high efficiency solar energy power system as described in clause 179 or any other clause wherein said high efficiency photovoltaic DC output comprises a dual nominal operational range high efficiency photovoltaic power output.

192. A high efficiency solar energy power system as described in clause 110, 120, 121, 134, 139, 143, 150, 161, 168, 179 or any other clause and further comprising:

a photovoltaic DC-AC inverter responsive to said DC output; and a photovoltaic AC power output responsive to said photovoltaic DC-AC inverter, and further comprising a photovoltaic inverter input coordinated converter controller.

193. A high efficiency solar energy power system as described in clause 192 or any other clause wherein said DC output comprises a low photovoltaic inductance DC output.

194. A high efficiency solar energy power system as described in clause 192 or any other clause wherein said photovoltaic inverter input coordinated converter controller comprises a photovoltaic inverter optimized converter controller.

195. A high efficiency solar energy power system as described in clause 192 or any other clause wherein at least one of said converters comprises a buck power converter, and further comprising a series combination inductor.

196. A high efficiency solar energy power system as described in clause 192 or any other clause wherein at least one of said converters comprises a tapped magnetically coupled inductor converter, and further comprising a series combination inductor.

197. A high efficiency solar energy power system as described in clause 110, 119, 121, 134, 139, 143, 150, 161, 170, 179 or any other clause wherein said controller comprises a photovoltaic boundary condition controller.

198. A high efficiency solar energy power system as described in clause 197 or any other clause wherein said photovoltaic boundary condition controller comprises a photovoltaic output voltage limit controller.

199. A high efficiency solar energy power system as described in clause 198 or any other clause wherein at least one of said converters comprises a buck power converter, and further comprising a series combination inductor.

200. A high efficiency solar energy power system as described in clause 198 or any other clause wherein at least one of said converters comprises a tapped magnetically coupled inductor converter, and further comprising a series combination inductor.

201. A high efficiency solar energy power system as described in clause 192 or any other clause wherein said controller comprises a photovoltaic boundary condition controller.

202. A high efficiency solar energy power system as described in clause 201 or any other clause wherein said photovoltaic boundary condition controller comprises a photovoltaic output voltage limit controller.

203. A high efficiency solar energy power system as described in clause 202 or any other clause wherein at least one of said converters comprises a buck power converter, and further comprising a series combination inductor.

204. A high efficiency solar energy power system as described in clause 202 or any other clause wherein at least one of said converters comprises a tapped magnetically coupled inductor converter, and further comprising a series combination inductor.

205. A high efficiency solar energy power system as described in clause 120, 134, 143, 150 170, 178, or any other clause wherein said controller comprises a 180° photovoltaic converter switch controller.

206. A high efficiency solar energy power system as described in clause 110, 121, 139, 150, 167, 177 or any other clause wherein said controller comprises a common duty cycle controller.

207. A high efficiency solar energy power system as described in clause 179 or any other clause wherein said controller comprises a 180° photovoltaic converter switch controller.

208. A high efficiency solar energy power system as described in clause 179 or any other clause wherein said controller comprises a common duty cycle controller.

209. A high efficiency solar energy power system as described in clause 193 or any other clause and further comprising combining circuitry providing a conversion combined photovoltaic DC output.

210. A high efficiency solar energy power system as described in clause 209 or any other clause wherein said combiner circuitry comprises a low photovoltaic energy storage inductor.

211. A high efficiency solar energy power system as described in clause 205 or any other clause and further comprising a double maximum voltage arrangement.

212. A high efficiency solar energy power system as described in clause 211 or any other clause wherein said converter comprises a converter selected from a group consisting of:

a not more than about one-half duty cycle range ripple current photovoltaic energy storage converter; and a not more than about one-half of traditional photovoltaic energy storage converter.

213. A high efficiency solar energy power system as described in clause 206 or any other clause and further comprising a quadruple maximum voltage arrangement.

214. A high efficiency solar energy power system as described in clause 213 or any other clause wherein said converter comprises a converter selected from a group consisting of:

a not more than about one-quarter duty cycle range ripple current photovoltaic energy storage converter; and a not more than about one-quarter of traditional photovoltaic energy storage converter.

215. A high efficiency power system comprising:

a first source of power;

a base phase DC-DC converter having a base phase switched output;

a second source of power;

an altered phase DC-DC converter having an altered phase switched output relative to said base phase switched output;

a synchronous phase control to which said base phase DC-DC converter and said altered phase DC-DC converter are switch timing responsive; and combiner circuitry responsive to said base phase switched output and said altered phase switched output providing a conversion combined DC output.

216. A high efficiency power system comprising:

at least one source of power;

a low energy storage DC-DC converter;

a duty cycle controller to which said low energy storage DC-DC photovoltaic converter is switch timing responsive; and a low energy storage DC output.

217. A high efficiency power system comprising:

at least one source of power;

a tapped magnetically coupled inductor converter;

a duty cycle controller to which said tapped magnetically coupled inductor converter is switch timing responsive; and a high efficiency DC output.

218. A high efficiency power system as described in clause 215, 216, 217 or any other clause and further comprising:

a DC-AC inverter responsive to said DC output; and a AC power output responsive to said photovoltaic DC-AC inverter, and further comprising a photovoltaic inverter input coordinated converter controller.

219. A high efficiency power system as described in clause 215, 216, 217 or any other clause wherein said controller comprises a boundary condition controller.

As can be easily understood from the foregoing, the basic concepts of the present invention may be embodied in a variety of ways. It involves both conversion techniques as well as devices to accomplish the appropriate conversion. In this application, the conversion techniques are disclosed as part of the results shown to be achieved by the various devices described and as steps which are inherent to utilization. They are simply the natural result of utilizing the devices as intended and described. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "converter" should be understood to encompass disclosure of the act of "converting"—whether explicitly discussed or not—and, conversely, were there effectively disclosure of the act of "converting", such a disclosure should be understood to encompass disclosure of a "converting" and even a "means for converting." Such changes and alternative terms are to be understood to be explicitly included in the description. Further, each such means (whether explicitly so described or not) should be understood as encompassing all elements that can perform the given function, and all descriptions of elements that perform a described function should be understood as a non-limiting example of means for performing that function.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed in the list of references or other information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s).

Thus, the applicant(s) should be understood to have support to claim and make a statement of invention to at least: i) each of the power devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) an apparatus for performing the methods described herein comprising means for performing the steps, xii) the various combinations and permutations of each of the elements disclosed, xiii) each potentially dependent claim or concept as a dependency on each and every one of the independent claims or concepts presented, and xiv) all inventions described herein.

In addition and as to computer aspects and each aspect amenable to programming or other electronic automation, the applicant(s) should be understood to have support to claim and make a statement of invention to at least: xv) processes performed with the aid of or on a computer, machine, or computing machine as described throughout the above discussion, xvi) a programmable apparatus as described throughout the above discussion, xvii) a computer readable memory encoded with data to direct a computer comprising means or elements which function as described throughout the above discussion, xviii) a computer, machine, or computing machine configured as herein disclosed and described, xix) individual or combined subroutines and programs as herein disclosed and described, xx) a carrier medium carrying computer readable code for control of a computer to carry out separately each and every individual and combined method described herein or in any claim, xxi) a computer program to perform separately each and every individual and combined method disclosed, xxii) a computer program containing all and each combination of means for performing each and every individual and combined step disclosed, xxiii) a storage medium storing each computer program disclosed, xxiv) a signal carrying a computer program disclosed, xxv) the related methods disclosed and described, xxvi) similar, equivalent, and even implicit variations of each of these systems and methods, xxvii) those alternative designs which accomplish each of the functions shown as are disclosed and described, xxviii) those alternative designs and methods which accomplish each of the functions shown as are implicit to accomplish that which is disclosed and described, xxix) each feature, component, and step shown as separate and independent inventions, and xxx) the various combinations and permutations of each of the above.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in *Hakim* v. *Cannon Avent Group*, PLC, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments. Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 25 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

What is claimed is:

1. A multiphase low ripple solar energy power system comprising:

a source of power having a source output;

a conversion combined low ripple, solar energy, operational power DC output; and a DC-DC combining converter configured to provide said conversion combined low ripple, solar energy, operational power DC output, said DC-DC combining converter comprising:

a base phase converter configured to accept power from said source of power, comprising:

a base phase converter input that accepts power from said first photovoltaic source output;

a base phase converter output that provides operational base phase DC power delivery;

at least one pair of base phase switch elements with a base phase switch-pair midpoint situated on an electrical circuit path between said at least one pair of base phase switch elements, and wherein said base phase switch-pair midpoint is configured with said base phase converter input;

a base phase converter switch-pair timing phase controller configured to phase timed operation of said pair of base phase switch elements of said base phase converter at a first timing phase;

an altered phase converter configured to accept power from said source of power, comprising:

an altered phase converter input that accepts power from said source output;

an altered phase converter output that provides operational altered phase DC power delivery;

at least one pair of altered phase switch elements with an altered phase switch-pair midpoint situated on an electrical circuit path between said at least one pair of altered phase switch elements, and wherein said altered phase switch-pair midpoint is configured with said altered phase converter input;

an altered phase converter switch-pair timing phase controller configured to phase timed operation of said pair of switch elements of said altered phase converter at a second timing phase that is controlled to differ from said first timing phase;

a synchronous phase controller to which said base phase converter switch-pair timing phase controller and said altered phase converter switch-pair timing phase controller are switch timing responsive, that is configured to maintain synchronous operation under one phased timing between said base phase converter switch-pair timing phase controller and said altered phase converter switch-pair timing phase controller;

power combining circuitry exhibiting low stored energy that connects said base phase switch-pair midpoint and said altered phase switch-pair midpoint to achieve said conversion combined low ripple, solar energy, operational power DC output; and a photovoltaic boundary output controller to which said conversion combined low ripple, solar energy, operational power DC output is responsive at at least some times, configured to provide boundary limited conversion combined low ripple, solar energy, operational power DC output at such times of boundary controlled operation.

2. A multiphase low ripple solar energy power system comprising:

a source of power having a source output;

a conversion combined low ripple, solar energy, operational power DC output; and a DC-DC combining converter configured to provide said conversion combined low ripple, solar energy, operational power DC output, said DC-DC combining converter comprising:

a base phase converter configured to accept power from said source of power, comprising:

a base phase converter input that accepts power from said source output;

a base phase converter output that provides operational base phase DC power delivery;

at least one pair of base phase switch elements with a base phase switch-pair midpoint situated between said at least one pair of base phase switch elements;

a base phase converter switch-pair timing phase controller configured to phase timed operation of said pair of switch elements of said base phase converter at a first timing phase;

an altered phase converter configured to accept power from said source of power, comprising:

an altered phase converter input that accepts power from said source output;

an altered phase converter output that provides operational altered phase DC power delivery;

at least one pair of altered phase switch elements with an altered phase switch-pair midpoint between said at least one pair of altered phase switch elements with an altered phase switch-pair midpoint to said at least one pair of switch elements with a base phase switch-pair midpoint, and wherein said altered phase switch-pair midpoint is configured with said altered phase converter input;

an altered phase converter switch-pair timing phase controller configured to phase timed operation of said pair of switch elements of said altered phase converter at a second timing phase that is controlled to differ from said first timing phase;

a synchronous phase controller to which said base phase converter switch-pair timing phase controller and said altered phase converter switch-pair timing phase controller are switch timing responsive, that is configured to maintain synchronous operation under one phased timing between said base phase converter switch-pair timing phase controller and said altered phase converter switch-pair timing phase controller;

power combining circuitry exhibiting low stored energy that connects said base phase switch-pair midpoint and said altered phase switch-pair midpoint to achieve said conversion combined low ripple, solar energy, operational power DC output; and a photovoltaic boundary output controller to which said conversion combined low ripple, solar energy, operational power DC output is responsive at at least some times, configured to provide boundary limited conversion combined low ripple, solar energy, operational power DC output at such times of boundary controlled operation.

3. A multiphase low ripple solar energy power system as described in claim 2 wherein said base phase switch-pair midpoint is configured with said base phase converter input and said altered phase switch-pair midpoint is configured with said altered phase converter input.

4. A multiphase low ripple solar energy power system as described in claim 2 wherein said base phase switch-pair midpoint is configured with said base phase converter output and said altered phase switch-pair midpoint is configured with said altered phase converter output.

5. A multiphase low ripple solar energy power system as described in claim 3 or 4 wherein said power combining circuitry exhibiting low stored energy that connects said base phase converter output that provides operational base phase DC power delivery and said altered phase converter output that provides operational altered phase DC power delivery to provide said conversion combined low ripple, solar energy, operational power DC output comprises an inductance that has less than traditional full cycle ripple energy storage generated by photovoltaic circuitry utilizing a 0%-to-100%-duty-cycle range to achieve output across its operational regime.

6. A multiphase low ripple solar energy power system as described in claim 3 or 4 wherein said power combining circuitry exhibiting low stored energy that connects said base phase converter output that provides operational base phase DC power delivery and said altered phase converter output that provides operational altered phase DC power delivery to provide said conversion combined low ripple, solar energy, operational power DC output comprises an inductance that has less than or equal to one-quarter traditional full cycle ripple energy storage generated by photovoltaic circuitry utilizing a 0%-to-100%-duty-cycle range to achieve output across its operational regime.

7. A multiphase low ripple solar energy power system as described in claim 3 or 4 wherein said synchronous phase controller comprises opposing phase control circuitry.

8. A multiphase low ripple solar energy power system as described in claim 3 or 4 wherein said power combining circuitry exhibiting low stored energy that connects said base phase converter output that provides operational base phase DC power delivery and said altered phase converter output that provides operational altered phase DC power delivery to provide said conversion combined low ripple, solar energy, operational power DC output comprises a double maximum voltage arrangement.

9. A multiphase low ripple solar energy power system as described in claim 3 or 4 wherein said photovoltaic boundary output controller to which said conversion combined low ripple, solar energy, operational power DC output is responsive at least some times, configured to provide boundary limited conversion combined low ripple, solar energy, operational power DC output at such times of boundary controlled operation comprises a photovoltaic current limit controller configured to provide current limited conversion combined low ripple, solar energy, operational power DC output at such times of boundary controlled operation.

10. A multiphase low ripple solar energy power system as described in claim 3 or 4 wherein said photovoltaic boundary output controller to which said conversion combined low ripple, solar energy, operational power DC output is responsive at least some times, configured to provide boundary limited conversion combined low ripple, solar energy, operational power DC output at such times of boundary controlled operation comprises a photovoltaic voltage limit controller configured to provide voltage limited conversion combined low ripple, solar energy, operational power DC output at such times of boundary controlled operation.

11. A multiphase low ripple solar energy power system as described in claim 3 or 4 wherein said photovoltaic boundary output controller to which said conversion combined low ripple, solar energy, operational power DC output is responsive at least some times, configured to provide boundary limited conversion combined low ripple, solar energy, operational power DC output at such times of boundary controlled operation comprises a photovoltaic power limit controller configured to provide power limited conversion combined low ripple, solar energy, operational power DC output at such times of boundary controlled operation.

12. A multiphase low ripple solar energy power system as described in claim 3 or 4 wherein said photovoltaic boundary output controller to which said conversion combined low ripple, solar energy, operational power DC output is responsive at least some times, configured to provide boundary limited conversion combined low ripple, solar energy, operational power DC output at such times of boundary controlled operation comprises a photovoltaic temperature limit controller configured to provide temperature limited conversion combined low ripple, solar energy, operational power DC output at such times of boundary controlled operation.

13. A multiphase low ripple solar energy power system as described in claim 3 or 4 wherein phased timing of said synchronous phase controller adds voltages to series combine said base phase converter and said altered phase converter.

14. A multiphase low ripple solar energy power system as described in claim 3 or 4 wherein phased timing of said synchronous phase controller provides voltages to parallel combine said base phase converter and said altered phase converter.

15. A multiphase low ripple solar energy power system as described in claim 4 wherein said at least one pair of switch elements with a base phase switch-pair midpoint has a lower polarity end and an upper polarity end, wherein said at least one pair of switch elements with an altered phase switch-pair midpoint has a lower polarity end and an upper polarity end, and wherein said conversion combined low ripple, solar energy, operational power DC output from said DC-DC combining converter is from opposite polarity ends of said base phase converter and said altered phase converter.

16. A multiphase low ripple solar energy power system as described in claim 4 wherein said power combining circuitry exhibiting low stored energy that connects said base phase switch-pair midpoint and said altered phase switch-pair midpoint to achieve said conversion combined low ripple, solar energy, operational power DC output comprises a tapped magnetically coupled inductor arrangement having an inductor tap, and wherein said power combining circuitry comprises a series combination inductor connected between said inductor taps.

* * * * *